(12) United States Patent
Shibayama et al.

(10) Patent No.: US 10,854,479 B2
(45) Date of Patent: Dec. 1, 2020

(54) SUBSTRATE PROCESSING METHOD AND SUBSTRATE PROCESSING DEVICE

(71) Applicant: SCREEN Holdings Co., Ltd., Kyoto (JP)

(72) Inventors: Nobuyuki Shibayama, Kyoto (JP); Masayuki Hayashi, Kyoto (JP); Seiji Ano, Kyoto (JP); Toru Edo, Kyoto (JP)

(73) Assignee: SCREEN Holdings Co., Ltd.

( * ) Notice: Subject to any disclaimer, the term of this patent is extended or adjusted under 35 U.S.C. 154(b) by 0 days.

(21) Appl. No.: 16/081,219

(22) PCT Filed: Mar. 21, 2017

(86) PCT No.: PCT/JP2017/011265
§ 371 (c)(1),
(2) Date: Aug. 30, 2018

(87) PCT Pub. No.: WO2017/164186
PCT Pub. Date: Sep. 28, 2017

(65) Prior Publication Data
US 2019/0035649 A1    Jan. 31, 2019

(30) Foreign Application Priority Data

Mar. 25, 2016 (JP) .................................. 2016-061910
Feb. 28, 2017 (JP) .................................. 2017-037543

(51) Int. Cl.
*H01L 21/67* (2006.01)
*C11D 11/00* (2006.01)
(Continued)

(52) U.S. Cl.
CPC .......... *H01L 21/67046* (2013.01); *B08B 3/08* (2013.01); *C11D 7/08* (2013.01);
(Continued)

(58) Field of Classification Search
CPC ......... H01L 21/67046; H01L 21/02041; H01L 21/02052; H01L 21/67028;
(Continued)

(56) References Cited

U.S. PATENT DOCUMENTS

2003/0022494 A1* 1/2003 Ying .......................... C23F 4/00
438/689
2003/0209255 A1* 11/2003 Brown .............. H01L 21/67075
134/1.1
(Continued)

FOREIGN PATENT DOCUMENTS

CN       102810459 A     12/2012
JP       2000-315670 A   11/2000
(Continued)

OTHER PUBLICATIONS

International Preliminary Report on Patentability (Chapter I) dated Oct. 4, 2018 with a Notification from the International Bureau (Form PCT/IB/326) in corresponding PCT International Application No. PCT/JP2017/011265 in Japanese.
(Continued)

*Primary Examiner* — Sharidan Carrillo
(74) *Attorney, Agent, or Firm* — Ostrolenk Faber LLP

(57) ABSTRACT

A substrate processing method is provided, which includes: an ozone-containing hydrofluoric acid solution spouting step of spouting an ozone-containing hydrofluoric acid solution containing ozone dissolved therein from a nozzle toward one major surface of a substrate held by a substrate holding unit; and a brush-cleaning step of cleaning the one major surface of the substrate by bringing a cleaning brush into abutment against the one major surface of the substrate, the brush-cleaning step being performed after the ozone-containing
(Continued)

hydrofluoric acid solution spouting step or in parallel with the ozone-containing hydrofluoric acid solution spouting step.

13 Claims, 32 Drawing Sheets

(51) Int. Cl.
  H01L 21/687 (2006.01)
  H01L 21/02 (2006.01)
  C11D 7/08 (2006.01)
  B08B 3/08 (2006.01)
(52) U.S. Cl.
  CPC .... *C11D 11/0047* (2013.01); *H01L 21/02041* (2013.01); *H01L 21/02052* (2013.01); *H01L 21/67028* (2013.01); *H01L 21/67051* (2013.01); *H01L 21/68707* (2013.01); *H01L 21/68728* (2013.01); *H01L 21/68764* (2013.01)
(58) Field of Classification Search
  CPC ......... H01L 21/67051; H01L 21/68707; H01L 21/68728; H01L 21/68764; B08B 3/08; C11D 7/08; C11D 11/0047
  See application file for complete search history.

(56) References Cited

U.S. PATENT DOCUMENTS

| | | | | |
|---|---|---|---|---|
| 2005/0115671 | A1* | 6/2005 | Araki | B08B 7/04 156/345.12 |
| 2005/0236363 | A1 | 10/2005 | Bergman et al. | 216/57 |
| 2006/0219260 | A1 | 10/2006 | Iwami et al. | 134/6 |
| 2013/0061884 | A1 | 3/2013 | Yang et al. | 134/26 |
| 2015/0258553 | A1* | 9/2015 | Kobayashi | H01L 21/67028 427/372.2 |
| 2017/0092530 | A1* | 3/2017 | Kaba | H01L 21/68785 |
| 2017/0092532 | A1* | 3/2017 | Kaba | H01L 21/67051 |
| 2019/0035622 | A1* | 1/2019 | Shibayama | B08B 3/08 |
| 2019/0035649 | A1* | 1/2019 | Shibayama | C11D 11/0047 |

FOREIGN PATENT DOCUMENTS

| | | |
|---|---|---|
| JP | 2001-053050 A | 2/2001 |
| JP | 2003-218085 A | 7/2003 |
| JP | 2005-174961 A | 6/2005 |
| JP | 2006-278957 A | 10/2006 |
| JP | 2007-067101 A | 3/2007 |
| JP | 2010-87419 A | 4/2010 |
| TW | 200843901 A | 11/2008 |

OTHER PUBLICATIONS

International Preliminary Report on Patentability (Chapter I) dated Oct. 4, 2018 with a Notification from the International Bureau (Form PCT/IB/338) in corresponding PCT International Application No. PCT/JP2017/011265 in English.

International Search Report dated Apr. 25, 2017 in corresponding PCT International Application No. PCT/JP2017/011265.

Written Opinion dated Apr. 25, 2017 in corresponding PCT International Application No. PCT/JP2017/011265.

* cited by examiner

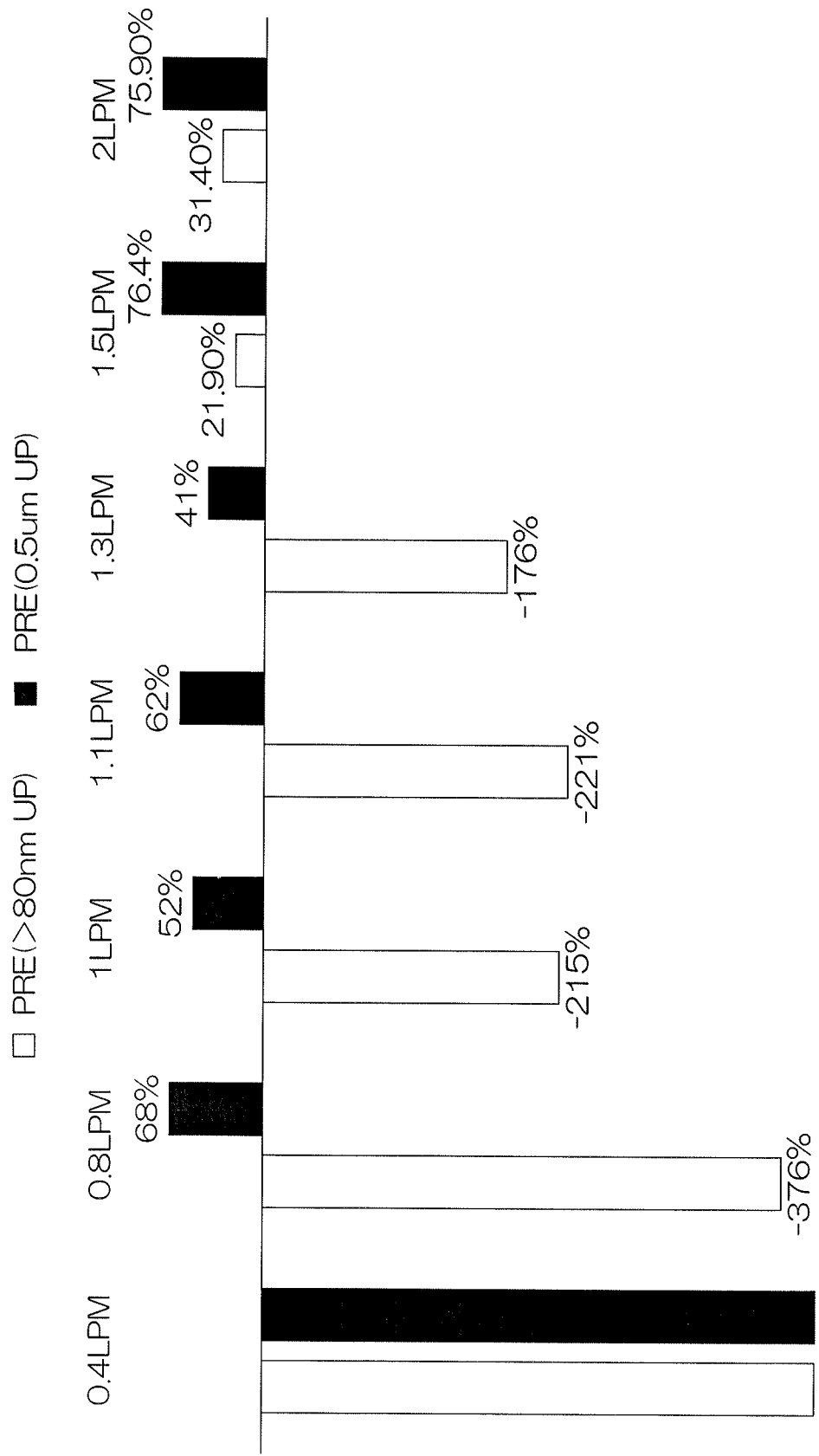

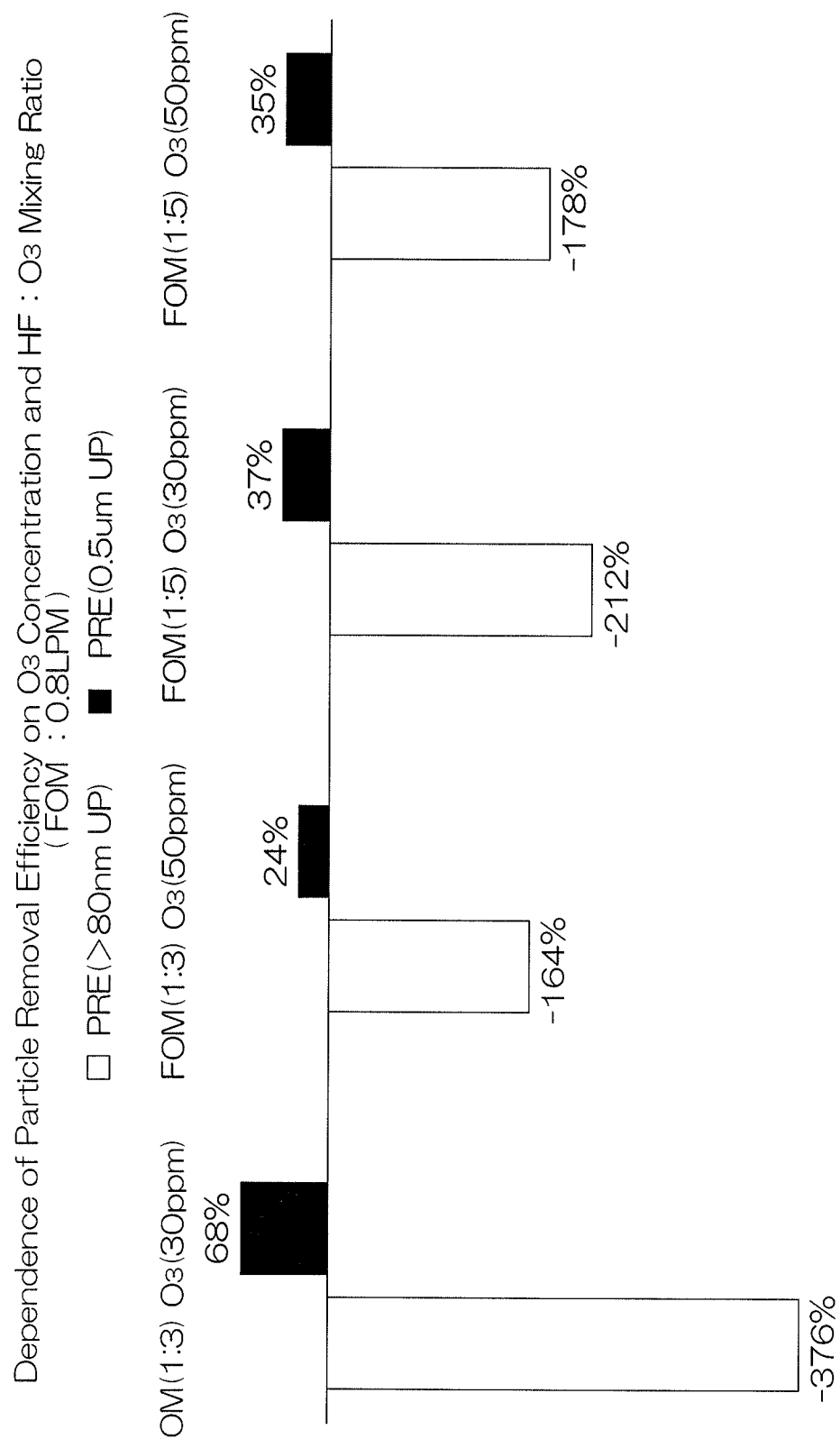

FIG. 27

| | Processing process | Chemical liquid | Results of TXRF analysis after process (1E10 atom/cm²) Maximum numbers detected under respective measurement conditions | | |
|---|---|---|---|---|---|
| | | | 1mm from wafer edge | 2mm from wafer edge | 5mm from wafer edge |
| | | | Ir | Ir | Ir |
| Comparative Example 1 | Only with FOM | FOM (1:1) | 6.96 | 5.98 | ND |
| Example 7 | FOM>brush A | FOM (1:1) | ND | ND | ND |
| Example 8 | FOM>brush A | FOM (1:3) | 4.85 | ND | ND |
| Example 9 | FOM+brush B | FOM (1:1) | ND | ND | ND |
| Comparative Example 2 | HF+brush B | HF (conc) | 18.44 | 17.14 | 13.63 |

SUBSTRATE PROCESSING METHOD AND SUBSTRATE PROCESSING DEVICE

CROSS-REFERENCE TO RELATED APPLICATIONS

The present application is a 35 U.S.C. §§ 371 national phase conversion of PCT/JP2017/011265, filed Mar. 21, 2017, which claims priority to Japanese Patent Application Nos. 2016-061910 and 2017-037543, filed Mar. 25, 2016 and Feb. 28, 2017, respectively, the contents of all of which are incorporated herein by reference. The PCT International Application was published in the Japanese language.

TECHNICAL FIELD

The present invention relates to a substrate processing method and a substrate processing apparatus for processing a major surface of a substrate. Examples of the substrate to be processed to be processed include semiconductor wafers, substrates for liquid crystal display devices, substrates for plasma display devices, substrates for FED (Field Emission Display) devices, substrates for optical disks, substrates for magnetic disks, substrates for magneto-optical disks, substrates for photo masks, ceramic substrates, and substrates for solar cells.

BACKGROUND ART

In semiconductor device production processes, it is indispensable to perform a substrate cleaning process for cleaning a substrate such as a semiconductor wafer between respective process steps. A substrate processing apparatus of a single substrate processing type adapted to clean a single substrate at a time, for example, includes a spin chuck which generally horizontally holds and rotates the substrate, a cleaning sponge brush for scrubbing a major surface (e.g., an upper surface) of the substrate held and rotated by the spin chuck, and a nozzle which supplies a cleaning chemical liquid to the substrate held and rotated by the spin chuck.

The cleaning process includes a process for removing foreign matter from the major surface of the semiconductor wafer by utilizing the etching action of the chemical liquid. Where SC1 (ammonia/hydrogen peroxide mixture liquid) is used as the cleaning chemical liquid, as described in PTL1, the major surface of the substrate is oxidized by the oxidizing action of a hydrogen peroxide component contained in the SC1 to be thereby formed with a silicon oxide film. Then, the silicon oxide film formed in the major surface of the substrate is removed together with the foreign matter adhering to the major surface by the action of an ammonia component contained in the SC1. In addition, the major surface of the substrate is scrubbed with the cleaning brush, whereby the foreign matter is effectively removed from the major surface of the substrate.

CITATION LIST

Patent Literature

PTL1: JP2006-278957A

SUMMARY OF INVENTION

Technical Problem

Where the SC1 is used as the cleaning chemical liquid, however, the major surface of the substrate is oxidized with hydrogen peroxide water having a relatively weak oxidative power and, therefore, the oxide film is formed in a smaller amount in the major surface of the substrate. That is, the etching capability (foreign matter removing capability) of the SC1 is not so high. In this case, the cleaning efficiency is low, even if the major surface is scrubbed with the cleaning brush while the SC1 is supplied to the major surface. If a greater amount of foreign matter adheres to the major surface of the substrate to be cleaned, therefore, the cleaning of the major surface requires a longer period, problematically reducing the throughput.

In view of the foregoing, it is an object of the present invention to provide a substrate processing method and a substrate processing apparatus which are capable of efficiently cleaning the one major surface of the substrate.

Solution to Problem

The present invention provides a substrate processing method, which includes: an ozone-containing hydrofluoric acid solution spouting step of spouting an ozone-containing hydrofluoric acid solution containing ozone dissolved therein from a nozzle toward one major surface (one of opposite major surfaces) of a substrate held by a substrate holding unit; and a brush-cleaning step of cleaning the one major surface of the substrate by bringing a cleaning brush into abutment against the one major surface of the substrate, the brush-cleaning step being performed after the ozone-containing hydrofluoric acid solution spouting step or in parallel with the ozone-containing hydrofluoric acid solution spouting step.

According to this method, the brush-cleaning step is performed after the ozone-containing hydrofluoric acid solution spouting step or in parallel with the ozone-containing hydrofluoric acid solution spouting step.

In the ozone-containing hydrofluoric acid solution spouting step, the ozone-containing hydrofluoric acid solution spouted from the nozzle is supplied to the one major surface of the substrate. An oxide film is formed in the one major surface of the substrate by the oxidizing action of ozone contained in the ozone-containing hydrofluoric acid solution. Further, the oxide film formed in the one major surface of the substrate is peeled off (lifted off) from the one major surface by the oxide film etching action of hydrofluoric acid contained in the ozone-containing hydrofluoric acid solution. Thus, foreign matter (particles, impurities, peelings of the one major surface, and the like) adhering to or formed in the one major surface of the substrate can be removed, and flaws (chippings, dents, and the like) formed in the one major surface of the substrate can be removed. Since ozone having a strong oxidative power is used, the oxide film can be formed in a greater amount in the one major surface of the substrate. Thus, the greater amount of oxide film can be peeled off from the one major surface of the substrate. This makes it possible to efficiently remove the foreign matter and/or the flaws from the one major surface of the substrate.

In the brush-cleaning step to be performed after the ozone-containing hydrofluoric acid solution spouting step or in parallel with the ozone-containing hydrofluoric acid solution spouting step, the cleaning brush is brought into abutment against the one major surface of the substrate, whereby the peeled foreign matter is scrubbed off by the cleaning brush. Thus, the peeled foreign matter can be removed from the one major surface of the substrate. In this manner, the one major surface of the substrate can be efficiently cleaned.

According to one embodiment of the present invention, the brush-cleaning step is performed after the ozone-containing hydrofluoric acid solution spouting step in the substrate processing method of claim 1.

According to this method, the brush-cleaning step follows the ozone-containing hydrofluoric acid solution spouting step.

In the ozone-containing hydrofluoric acid solution spouting step, the ozone-containing hydrofluoric acid solution spouted from the nozzle is supplied to the one major surface of the substrate. An oxide film is formed in the one major surface of the substrate by the oxidizing action of ozone contained in the ozone-containing hydrofluoric acid solution. Further, the oxide film formed in the one major surface of the substrate is peeled off (lifted off) from the one major surface by the oxide film etching action of hydrofluoric acid contained in the ozone-containing hydrofluoric acid solution. Thus, foreign matter (particles, impurities, peelings of the one major surface, and the like) adhering to or formed in the one major surface of the substrate can be removed, and flaws (chippings, dents, and the like) formed in the one major surface of the substrate can be removed. Since ozone having a strong oxidative power is used, the oxide film can be formed in a greater amount in the one major surface of the substrate. Thus, the greater amount of oxide film can be peeled off from the one major surface of the substrate. This makes it possible to efficiently remove the foreign matter and/or the flaws from the one major surface of the substrate.

In the brush-cleaning step to be performed after the ozone-containing hydrofluoric acid solution spouting step, the cleaning brush is brought into abutment against the one major surface of the substrate, whereby the peeled foreign matter is scrubbed off by the cleaning brush. Thus, the peeled foreign matter can be removed from the one major surface of the substrate.

Where the major surface of the substrate is processed with a chemical liquid containing hydrofluoric acid having a hydrophobizing action, the one major surface of the substrate is liable to be hydrophobized by the action of hydrofluoric acid contained in the chemical liquid. If the cleaning brush is brought into abutment against the one major surface of the substrate kept in a hydrophobic state, the foreign matter scrubbed off by the cleaning brush is liable to adhere again to the one major surface of the substrate via the cleaning brush.

In the present invention, in contrast, ozone contained in the ozone-containing hydrofluoric acid solution has a hydrophilizing action, so that the hydrophobization of the one major surface of the substrate by hydrofluoric acid is suppressed in the ozone-containing hydrofluoric acid solution spouting step. As a result, the one major surface of the substrate can be kept hydrophilic at the start of the brush-cleaning step. This substantially prevents the foreign matter from adhering again to the one major surface of the substrate via the cleaning brush. Thus, the one major surface of the substrate can be more efficiently cleaned.

The ozone-containing hydrofluoric acid solution to be spouted from the nozzle in the ozone-containing hydrofluoric acid solution spouting step may have a hydrofluoric acid concentration of not lower than 0.01 wt. % and not higher than 0.5 wt. %.

According to this method, the hydrofluoric acid concentration of the ozone-containing hydrofluoric acid solution to be spouted falls within the aforementioned range. This makes it possible to properly clean the one major surface of the substrate while suppressing the hydrophobization of the one major surface of the substrate in the ozone-containing hydrofluoric acid solution spouting step. Thus, the re-adhesion of the foreign matter to the one major surface of the substrate via the cleaning brush can be suppressed or prevented.

If the hydrofluoric acid concentration of the ozone-containing hydrofluoric acid solution is lower than 0.01 wt. %, it will be impossible to properly peel off the oxide film formed in the one major surface of the substrate and hence to properly clean the one major surface. If the hydrofluoric acid concentration of the ozone-containing hydrofluoric acid solution is higher than 0.5 wt. %, the one major surface of the substrate is liable to be hydrophobized because hydrofluoric acid is contained in an excessively great amount in the ozone-containing hydrofluoric acid solution.

The ozone-containing hydrofluoric acid solution to be spouted from the nozzle in the ozone-containing hydrofluoric acid solution spouting step may have an ozone concentration of not lower than 22.5 ppm and not higher than 67.2 ppm.

According to this method, the ozone concentration of the ozone-containing hydrofluoric acid solution to be spouted falls within the aforementioned range. Thus, the one major surface of the substrate can be properly and safely cleaned in the ozone-containing hydrofluoric acid solution spouting step.

If the ozone concentration of the ozone-containing hydrofluoric acid solution is lower than 22.5 ppm, it will be impossible to sufficiently oxidize the one major surface of the substrate and hence to properly form the oxide film in the one major surface of the substrate. Therefore, the one major surface cannot be properly cleaned. As the ozone concentration increases, the toxicity of ozone is increased. Therefore, an ozone-containing hydrofluoric acid solution having an ozone concentration of higher than 67.2 ppm is not preferred in terms of safety. Further, the ozone-containing hydrofluoric acid solution having an ozone concentration of higher than 67.2 ppm contains a greater number of bubbles and, therefore, is not suitable for the substrate processing.

The ozone-containing hydrofluoric acid solution to be spouted from the nozzle in the ozone-containing hydrofluoric acid solution spouting step has a hydrofluoric acid concentration of not lower than 0.093 wt. % and not higher than 0.221 wt. % in the substrate processing method of claim 4.

According to this method, the hydrofluoric acid concentration of the ozone-containing hydrofluoric acid solution to be spouted falls within the aforementioned range. This makes it possible to properly clean the one major surface of the substrate while preventing the foreign matter from adhering again to a peripheral portion of the one major surface of the substrate in the ozone-containing hydrofluoric acid solution spouting step.

If the hydrofluoric acid concentration of the ozone-containing hydrofluoric acid solution is lower than 0.093 wt. %, it will be impossible to properly lift off the oxide film formed in the one major surface of the substrate and hence to properly clean the one major surface. If the hydrofluoric acid concentration of the ozone-containing hydrofluoric acid solution is higher than 0.221 wt. %, the peripheral portion of the one major surface of the substrate is liable to be hydrophobized because a greater amount of hydrofluoric acid is supplied to the peripheral portion of the one major surface of the substrate. If the brush-cleaning step is performed with the peripheral portion of the one major surface of the substrate in a hydrophobic state, the foreign matter is liable to adhere again to the peripheral portion of the one major surface via the cleaning brush.

The ozone-containing hydrofluoric acid solution to be spouted from the nozzle in the ozone-containing hydrofluoric acid solution spouting step may have an ozone concentration of 22.5 ppm to 42.0 ppm.

According to this method, the ozone concentration of the ozone-containing hydrofluoric acid solution falls within the aforementioned range. This makes it possible to properly clean the one major surface of the substrate while preventing the foreign matter from adhering again to the peripheral portion of the one major surface of the substrate in the ozone-containing hydrofluoric acid solution spouting step.

If the ozone concentration of the ozone-containing hydrofluoric acid solution is lower than 22.5 ppm, ozone will not reach the peripheral portion of the one major surface of the substrate because a smaller amount of ozone is contained in the ozone-containing hydrofluoric acid solution. Therefore, the peripheral portion of the one major surface is liable to be hydrophobized due to the hydrophobizing action of hydrofluoric acid. If the brush-cleaning step is performed with the peripheral portion of the one major surface of the substrate in a hydrophobic state, the foreign matter is liable to adhere again to the peripheral portion of the one major surface. An ozone-containing hydrofluoric acid solution having an ozone concentration of higher than 42.0 ppm contains a greater number of bubbles and, therefore, is not suitable for the substrate processing.

The ozone-containing hydrofluoric acid solution spouting step may include the step of spouting the ozone-containing hydrofluoric acid solution toward a center portion of the one major surface of the substrate held by the substrate holding unit, and the substrate processing method may further include a substrate rotating step of rotating the substrate about a predetermined rotation axis in the ozone-containing hydrofluoric acid solution spouting step.

According to this method, the ozone-containing hydrofluoric acid solution supplied to the center portion of the one major surface of the substrate receives a centrifugal force generated by the rotation of the substrate to radially spread toward the peripheral portion of the one major surface of the substrate. Thus, the ozone-containing hydrofluoric acid solution can be distributed over the entire one major surface of the substrate. In other words, hydrofluoric acid and ozone can be distributed over the entire one major surface of the substrate.

The substrate processing method may further include a water rinsing step of replacing the ozone-containing hydrofluoric acid solution on the one major surface of the substrate with water after the ozone-containing hydrofluoric acid solution spouting step, and the brush-cleaning step may be performed in parallel with the water rinsing step.

According to this method, the water is supplied to the one major surface of the substrate. Thus, the foreign matter scrubbed off by the cleaning brush can be washed away by the water. This prevents the foreign matter scrubbed off by the cleaning brush from remaining on the one major surface of the substrate.

Further, the water rinsing step follows the ozone-containing hydrofluoric acid solution spouting step, and the brush-cleaning step is performed in parallel with the water rinsing step. This makes it possible to reduce the period required for the cleaning process sequence to thereby improve the throughput as compared with a case in which an additional step is performed between the ozone-containing hydrofluoric acid solution spouting step and the water rinsing step.

The spouting flow rate of the ozone-containing hydrofluoric acid solution in the ozone-containing hydrofluoric acid solution spouting step, the hydrofluoric acid concentration of the ozone-containing hydrofluoric acid solution, the ozone concentration of the ozone-containing hydrofluoric acid solution, the component ratio of hydrofluoric acid and ozone contained in the ozone-containing hydrofluoric acid solution and/or the rotation speed of the substrate in the ozone-containing hydrofluoric acid solution spouting step are set so that ozone can be distributed over the entire one major surface of the substrate at the end of the ozone-containing hydrofluoric acid solution spouting step.

According to this method, the entire surface of the substrate can be kept hydrophilic at least at the end of the ozone-containing hydrofluoric acid solution spouting step. This prevents the foreign matter from adhering again to the peripheral portion of the one major surface of the substrate in the brush-cleaning step to be performed after the ozone-containing hydrofluoric acid solution spouting step.

The substrate processing method may further include a protection fluid supplying step of supplying a protection fluid to the other major surface of the substrate so as to substantially prevent the ozone-containing hydrofluoric acid solution from flowing around to the other major surface of the substrate in the ozone-containing hydrofluoric acid solution spouting step.

According to this method, the ozone-containing hydrofluoric acid solution supplied to the one major surface of the substrate is substantially prevented from flowing around to the other major surface of the substrate by the protection fluid supplied to the other major surface. This makes it possible to perform the cleaning process on the one major surface of the substrate by using the ozone-containing hydrofluoric acid solution and the cleaning brush, while protecting the other major surface of the substrate.

The substrate be processed to be processed by the substrate processing method may include a semiconductor substrate. The other major surface of the substrate may be a device formation surface in which a device is formed. Further, the one major surface of the substrate may be a non-device-formation surface in which no device is formed.

According to this method, the cleaning process can be performed on the non-device-formation surface of the substrate by using the ozone-containing hydrofluoric acid solution and the cleaning brush. Thus, the foreign matter adhering to or formed in the non-device-formation surface and flaws formed in the non-device-formation surface can be removed.

Further, the device formation surface of the substrate can be protected by the protection fluid supplied to the device formation surface of the substrate.

This makes it possible to perform the cleaning process on the non-device-formation surface of the substrate by using the ozone-containing hydrofluoric acid solution and the cleaning brush, while protecting the device formation surface of the substrate.

The protection fluid supplying step may include a protection liquid supplying step of supplying a protection liquid to the other major surface.

According to this method, the protection liquid is supplied to the other major surface. Therefore, the ozone-containing hydrofluoric acid solution can be reliably prevented from flowing around to the lower surface of the substrate irrespective of the spouting flow rate of the ozone-containing hydrofluoric acid solution to be spouted in the ozone-containing hydrofluoric acid solution spouting step. Therefore, the spouting flow rate of the ozone-containing hydrofluoric acid solution can be increased in the ozone-containing hydrofluoric acid solution spouting step. By thus increasing the spouting flow rate of the ozone-containing hydrofluoric acid solution, the ozone-containing hydrofluoric acid solution can be kept ozone-rich to thereby distribute ozone to the peripheral portion of the one major surface of the substrate. This prevents the foreign matter from adhering again to the peripheral portion of the one major surface of the substrate in the brush-cleaning step to be performed after the ozone-containing hydrofluoric acid solution spouting step.

The spouting flow rate of the ozone-containing hydrofluoric acid solution to be spouted in the ozone-containing hydrofluoric acid solution spouting step is preferably not lower than 0.8 L/min. In this case, ozone can be distributed to the peripheral portion of the one major surface of the substrate. This prevents the foreign matter from adhering again to the peripheral portion of the one major surface of the substrate in the brush-cleaning step. The spouting flow rate is further preferably not lower than 1.0 L/min. In this case, a greater amount of ozone can be distributed to the peripheral portion of the one major surface of the substrate. This further reliably prevents the foreign matter from adhering again to the peripheral portion of the one major surface of the substrate in the brush-cleaning step.

The substrate processing method may further include an ozone water supplying step of supplying ozone water to the one major surface of the substrate before the brush-cleaning step after the ozone-containing hydrofluoric acid solution spouting step.

According to this method, the ozone water is supplied to the one major surface of the substrate before the brush-cleaning step after the ozone-containing hydrofluoric acid solution spouting step, whereby the entire one major surface of the substrate is hydrophilized. Even if the substrate has a hydrophobic part after the ozone-containing hydrofluoric acid solution spouting step, therefore, the hydrophobic part can be hydrophilized by supplying the ozone water. This prevents the foreign matter from adhering again to the one major surface of the substrate in the brush-cleaning step.

The substrate holding step may include the step of holding the substrate in a horizontal attitude, and the ozone-containing hydrofluoric acid solution spouting step may include the step of spouting the ozone-containing hydrofluoric acid solution to an upper surface of the substrate. The brush-cleaning step may include the step of cleaning the upper surface of the substrate.

According to this method, the upper surface of the substrate can be processed by using the ozone-containing hydrofluoric acid solution and the cleaning brush in the ozone-containing hydrofluoric acid solution spouting step.

The one major surface of the substrate be processed to be processed by the substrate processing method may include a silicon-containing surface which contains a silicon component.

According to this method, a silicon oxide film is formed in the one major surface of the substrate by the oxidizing action of ozone contained in the ozone-containing hydrofluoric acid solution. Further, the silicon oxide film formed in the one major surface of the substrate is peeled off from the one major surface by the oxide film etching action of hydrofluoric acid contained in the ozone-containing hydrofluoric acid solution. Thus, foreign matter (particles, impurities, peelings of the one major surface, and the like) adhering to or formed in the one major surface of the substrate can be removed, and flaws (chippings, dents, and the like) formed in the one major surface of the substrate can be removed. Since ozone having a strong oxidative power is used, the silicon oxide film can be formed in a greater amount in the one major surface of the substrate. Thus, the greater amount of silicon oxide film can be lifted off from the one major surface of the substrate. This makes it possible to efficiently remove the foreign matter and/or the flaws from the one major surface of the substrate.

The one major surface of the substrate be processed to be processed by the substrate processing method may include a titanium nitride-containing surface which contains titanium nitride.

The one major surface of the substrate be processed to be processed by the substrate processing method may include an iridium metal residue-containing surface which contains an iridium metal residue.

The present invention further provides a substrate processing apparatus, which includes: a substrate holding unit which holds a substrate; a nozzle for spouting an ozone-containing hydrofluoric acid solution toward one major surface of the substrate held by the substrate holding unit; an ozone-containing hydrofluoric acid solution supplying device which supplies the ozone-containing hydrofluoric acid solution to the nozzle; a cleaning brush to be brought into abutment against the one major surface for cleaning the one major surface; a cleaning brush driving unit for driving the cleaning brush; and a controller which controls the ozone-containing hydrofluoric acid solution supplying device and the cleaning brush driving unit to perform an ozone-containing hydrofluoric acid solution spouting step of spouting the ozone-containing hydrofluoric acid solution containing ozone dissolved therein from the nozzle toward the one major surface of the substrate held by the substrate holding unit, and to perform a brush-cleaning step of cleaning the one major surface of the substrate by bringing the cleaning brush into abutment against the one major surface of the substrate after the ozone-containing hydrofluoric acid solution spouting step or in parallel with the ozone-containing hydrofluoric acid solution spouting step.

With this arrangement, the ozone-containing hydrofluoric acid solution spouted from the nozzle is supplied to the one major surface of the substrate. An oxide film is formed in the one major surface of the substrate by the oxidizing action of ozone contained in the ozone-containing hydrofluoric acid solution. Further, the oxide film formed in the one major surface of the substrate is peeled off (lifted off) from the one major surface by the oxide film etching action of hydrofluoric acid contained in the ozone-containing hydrofluoric acid solution. Thus, foreign matter (particles, impurities, peelings of the one major surface, and the like) adhering to or formed in the one major surface of the substrate can be removed, and flaws (chippings, dents, and the like) formed in the one major surface of the substrate can be removed. Since ozone having a strong oxidative power is used, the oxide film can be formed in a greater amount in the one major surface of the substrate. Thus, the greater amount of oxide film can be peeled off from the one major surface of the substrate. This makes it possible to efficiently remove the foreign matter and/or the flaws from the one major surface of the substrate.

Thereafter, the cleaning brush is brought into abutment against the one major surface of the substrate, whereby the peeled foreign matter is scrubbed off by the cleaning brush. Thus, the peeled foreign matter can be removed from the one major surface of the substrate.

On the other hand, the one major surface of the substrate is liable to be hydrophobized by hydrofluoric acid contained in the ozone-containing hydrofluoric acid solution. If the cleaning brush is brought into abutment against the one major surface of the substrate kept in a hydrophobic state, the foreign matter scrubbed off by the cleaning brush is liable to adhere again to the one major surface of the substrate.

However, the hydrophobization of the one major surface of the substrate due to hydrofluoric acid contained in the ozone-containing hydrofluoric acid solution can be prevented by the hydrophilizing action of ozone contained in the ozone-containing hydrofluoric acid solution. As a result, the entire one major surface of the substrate can be kept hydrophilic after the end of the ozone-containing hydrofluoric acid solution spouting step. That is, the entire one major surface of the substrate is kept hydrophilic at the start of the brush-cleaning step. This suppresses or prevents the re-adhesion of the foreign matter to the one major surface of the substrate via the cleaning brush.

Thus, the one major surface of the substrate can be efficiently cleaned.

The nozzle may have a mixing chamber in which a hydrofluoric acid solution and ozone water are mixed together to prepare the ozone-containing hydrofluoric acid solution, and an outlet port for spouting the ozone-containing hydrofluoric acid solution prepared in the mixing chamber, and the ozone-containing hydrofluoric acid solution supplying device may include a hydrofluoric acid pipe through which the hydrofluoric acid solution is supplied from a hydrofluoric acid supply source to the mixing chamber, and an ozone water pipe through which the ozone water is supplied from an ozone water supply source to the mixing chamber.

With this arrangement, the hydrofluoric acid solution and the ozone water are supplied to the mixing chamber when the ozone-containing hydrofluoric acid solution is supplied to the substrate. In the mixing chamber, the hydrofluoric acid solution and the ozone water are mixed together, whereby the ozone-containing hydrofluoric acid solution is prepared. With this simple structure, the ozone-containing hydrofluoric acid solution can be spouted from the nozzle.

Since the hydrofluoric acid solution and the ozone water are mixed together in the nozzle, the ozone-containing hydrofluoric acid solution can be spouted from the nozzle immediately after the mixing (immediately after the preparation). Ozone dissolved in the hydrofluoric acid solution starts decomposition immediately after the dissolution. Since the ozone-containing hydrofluoric acid solution can be spouted from the nozzle immediately after the mixing (immediately after the preparation), the ozone-containing hydrofluoric acid solution can be supplied to the substrate in a state substantially free from the decomposition of ozone.

The foregoing and other objects, features and effects of the present invention will become more apparent from the following description of embodiments with reference to the attached drawings.

BRIEF DESCRIPTION OF DRAWINGS

FIG. 21A is a graph showing test results of a second cleaning test.

FIG. 23A is a graph showing test results of a fourth cleaning test.

FIG. 27 is a diagram showing test results of a fifth cleaning test.

DESCRIPTION OF EMBODIMENTS

Figure 1:
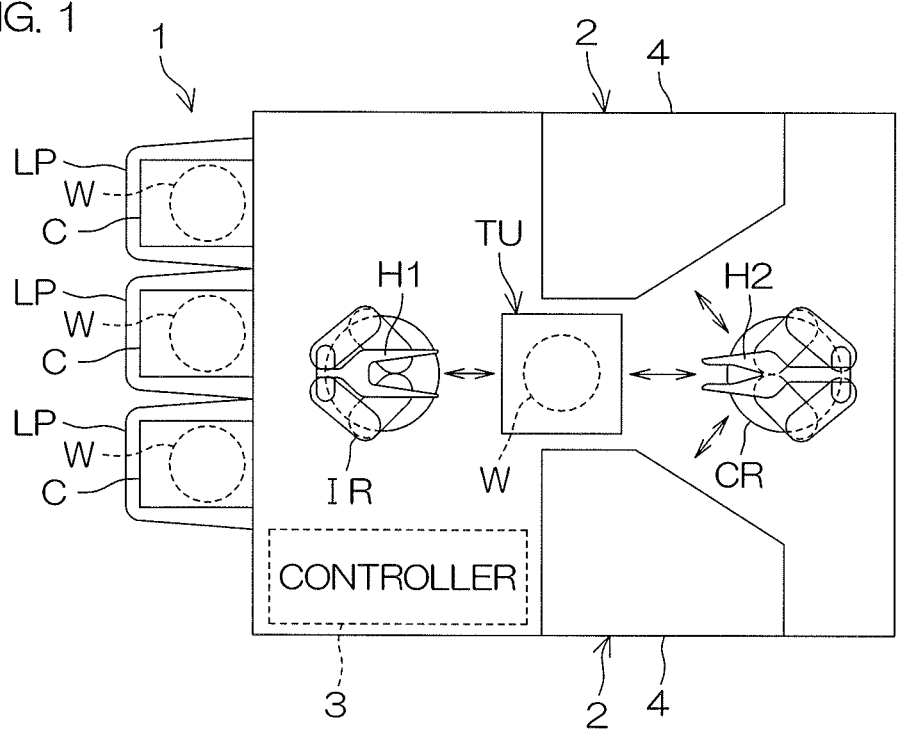
FIG. 1 is a schematic plan view for explaining the inside layout of a substrate processing apparatus according to a first embodiment of the present invention.

FIG. 1 is a schematic plan view for explaining the inside layout of a substrate processing apparatus 1 according to a first embodiment of the present invention.

The substrate processing apparatus 1 is an apparatus of a single substrate processing type adapted to processing a single disk-shaped substrate W of a semiconductor wafer (semiconductor substrate) with a processing liquid or a processing gas at a time. The substrate processing apparatus 1 includes load ports LP respectively retaining carriers C, an inversion unit TU which inverts a substrate W upside down, and a plurality of processing units 2 which each process a substrate W. The load ports LP are horizontally spaced from the processing units 2. The inversion unit TU is disposed on a transport path along which the substrate W is transported between the load ports LP and the processing units 2.

As shown in FIG. 1, the substrate processing apparatus 1 further includes an indexer robot IR provided between the load ports LP and the inversion unit TU, a center robot CR provided between the inversion unit TU and the processing units 2, and a controller 3 which controls the operations of devices provided in the substrate processing apparatus 1 and the opening/closing of valves provided in the substrate processing apparatus 1. The indexer robot IR transports substrates W one by one from the carriers C respectively retained on the load ports LP to the inversion unit TU, and transports substrates W one by one from the inversion unit TU to the carriers C respectively retained on the loadports LP. Similarly, the center robot CR transports substrates W one by one from the inversion unit TU to the processing units 2, and transports substrates W one by one from the processing units 2 to the inversion unit TU. Further, the center robot CR transports the substrate W between the processing units 2.

The indexer robot IR includes a hand H1 which horizontally supports the substrate W. The indexer robot IR horizontally moves the hand H1. Further, the indexer robot IR moves the hand H1 up and down, and rotates the hand H1 about a vertical axis. Similarly, the center robot CR includes a hand H2 which horizontally supports the substrate W. The center robot CR horizontally moves the hand H2. Further, the center robot CR moves the hand H2 up and down, and rotates the hand H2 about a vertical axis.

The substrates W are contained in the carriers C with their front surfaces Wa (device formation surfaces) facing up (in a face-up attitude). The controller 3 causes the indexer robot IR to transport a substrate W from one of the carriers C to the inversion unit TU with the front surface Wa facing up. Then, the controller 3 causes the inversion unit TU to invert the substrate W. Thus, a back surface Wb of the substrate W faces up. Thereafter, the controller 3 causes the center robot CR to transport the substrate W from the inversion unit TU to one of the processing units 2 with the back surface Wb facing up. The controller 3 causes the processing unit 2 to processing the back surface Wb of the substrate W.

After the back surface Wb of the substrate W is processed, the controller 3 causes the center robot CR to transport the substrate W from the processing unit 2 to the inversion unit TU with the back surface Wb facing up. Then, the controller 3 causes the inversion unit TU to invert the substrate W. Thus, the front surface Wa of the substrate W faces up. Thereafter, the controller 3 causes the indexer robot IR to transport the substrate W from the inversion unit TU to the carrier C with the front surface Wa facing up. Thus, the treated substrate W is contained in the carrier C. The controller 3 causes the indexer robot IR and the like to repeatedly perform this process sequence to processing the substrates W one by one.

Figure 2:
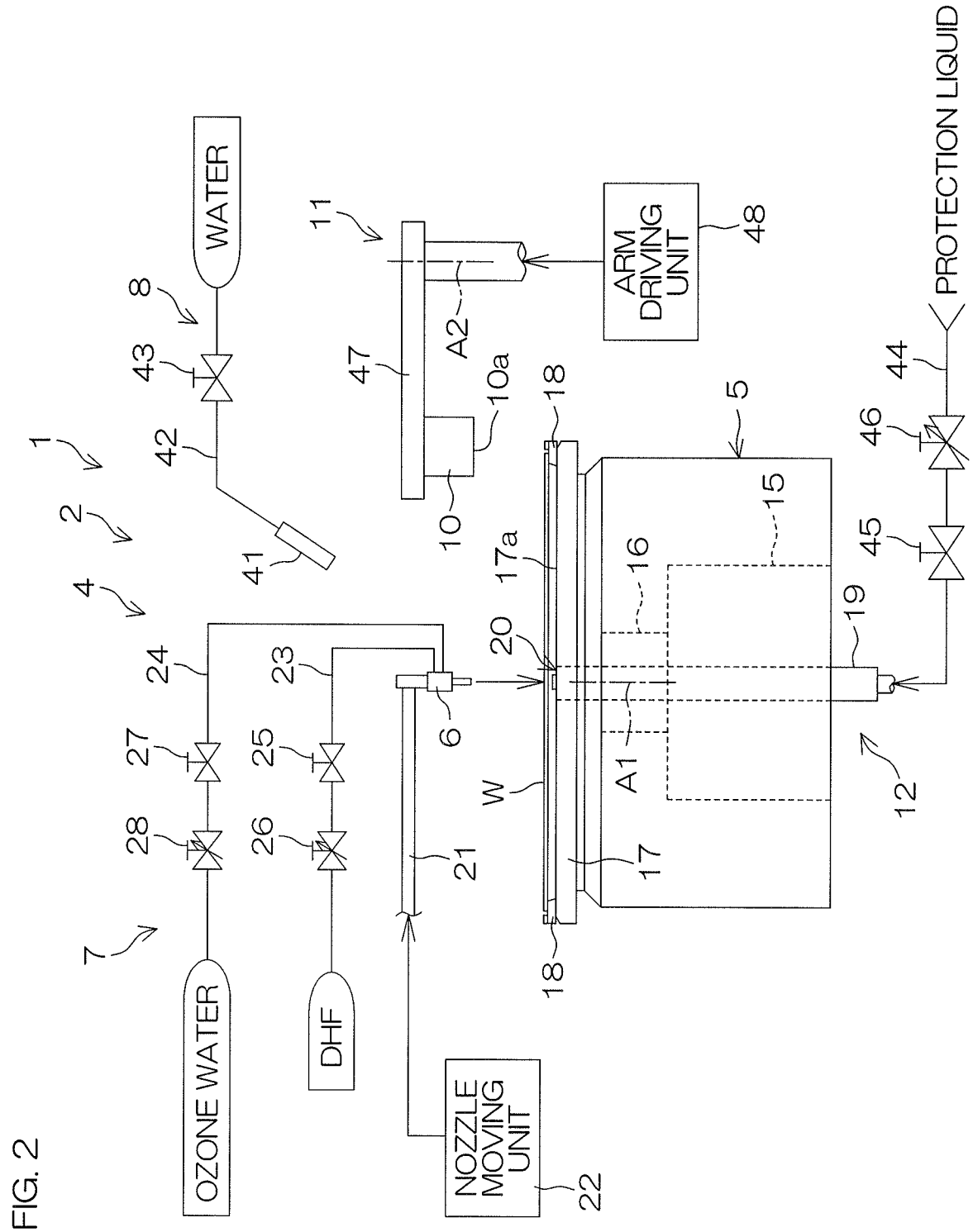
FIG. 2 is a schematic sectional view for explaining the construction of a processing unit provided in the substrate processing apparatus by way of example.
Figure 3:
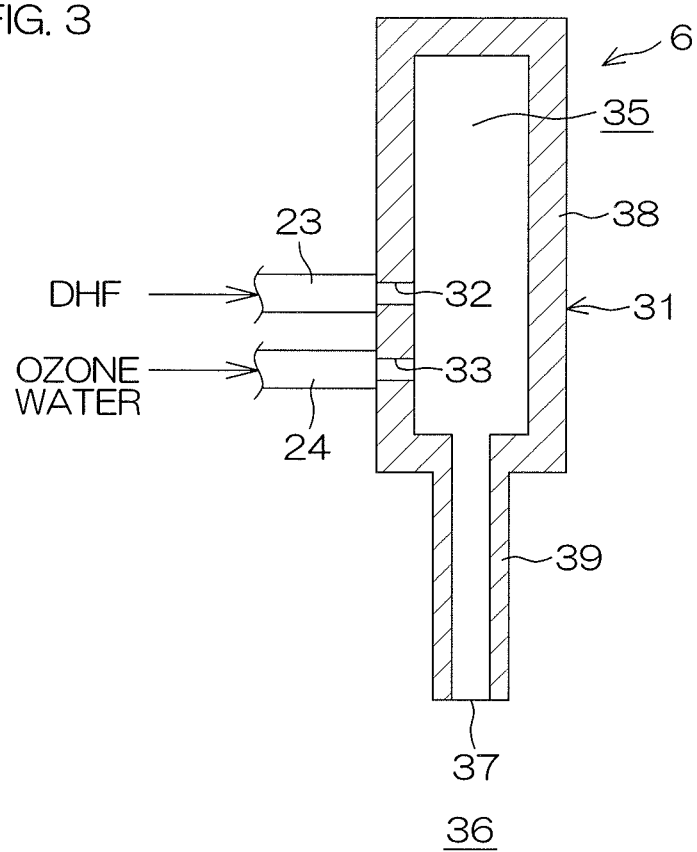
FIG. 3 is a schematic sectional view showing the structure of an FOM nozzle.
Figure 4:
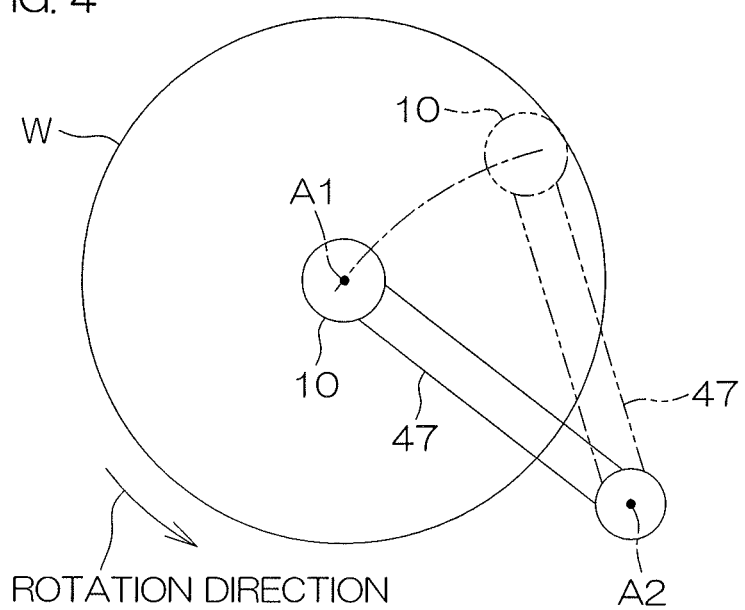
FIG. 4 is a schematic plan view for explaining the movement of a cleaning brush.

FIG. 2 is a schematic sectional view for explaining the construction of each of the processing units 2 provided in the substrate processing apparatus 1 by way of example. FIG. 3 is a schematic sectional view showing the structure of an FOM nozzle (nozzle) 6. FIG. 4 is a schematic plan view for explaining the movement of a cleaning brush 10.

The processing unit 2 includes a box-shaped processing chamber 4 having an inside space, a spin chuck (substrate holding unit) 5 which holds a single substrate W in a horizontal attitude in the processing chamber 4 and rotates the substrate W about a rotation axis A1 vertically extending through the center of the substrate W, an FOM nozzle 6 which spouts an ozone-containing hydrofluoric acid solution (hereinafter referred to as FOM) toward an upper surface (back surface (one major surface) Wb) of the substrate W held by the spin chuck 5, an FOM supplying device 7 which supplies the FOM to the FOM nozzle 6, a water supplying unit 8 which supplies water to the upper surface of the substrate W held by the spin chuck 5, a cleaning brush 10 to be brought into contact with the upper surface (back surface Wb) of the substrate W for scrub-cleaning the upper surface, a cleaning brush driving unit 11 for driving the cleaning brush 10, a protection liquid supplying unit 12 which supplies a protection liquid to a lower surface (front surface (the other major surface) Wa) of the substrate W held by the spin chuck 5, and a tubular processing cup (not shown) surrounding the spin chuck 5.

The processing chamber 4 includes a box-shaped partition wall (not shown), an FFU (fan/filter unit not shown) as an air supplying unit which supplies clean air from an upper portion of the partition wall to the inside of the partition wall (the inside of the processing chamber 4), and an evacuator (not shown) which expels gas from the processing chamber 4 from a lower portion of the partition wall. The FFU and the evacuator cooperatively form a downflow (downward stream) in the processing chamber 4.

A chuck of a clamping type adapted to horizontally clamp the substrate W to horizontally hold the substrate W is employed as the spin chuck 5. More specifically, the spin chuck 5 includes a spin motor 15, a spin shaft 16 unified with a driving shaft of the spin motor 15, and a disk-shaped spin base 17 attached to an upper end of the spin shaft 16 in a generally horizontal attitude.

The spin base 17 has a round horizontal upper surface 17a having a greater outer diameter than the substrate W. A plurality of clamping members 18 (three or more clamping members 18, for example, six clamping members 18) are provided on a peripheral edge portion of the upper surface 17a. On the peripheral edge portion of the upper surface 17a of the spin base 17, the plural clamping members 18 are arranged in properly spaced relation (e.g., in equidistantly spaced relation) along a circumference of the spin base 17 corresponding to the outer periphery of the substrate W.

The spin shaft 16 is a vertically disposed hollow shaft through which a vertically extending lower surface supply pipe 19 is inserted. The protection liquid is supplied to the lower surface supply pipe 19. A lower surface nozzle 20 is provided at an upper end of the lower surface supply pipe 19 for spouting the protection liquid supplied to the lower surface supply pipe 19.

For example, water is used as the protection liquid. The water is, for example, deionized water (DIW). The water is not limited to the DIW, but may be carbonated water, electrolytic ion water, hydrogen water, ozone water or a hydrochloric acid aqueous solution having a dilute concentration (e.g., about 10 ppm to about 100 ppm).

As shown in FIG. 2, the FOM nozzle 6 is, for example, a straight nozzle which selectively spouts the FOM and the ozone water in a continuous flow state, and is attached to a distal end of a horizontally extending nozzle arm 21 in a vertical attitude such that the processing liquid is spouted vertically to the upper surface of the substrate W. The FOM nozzle 6 may be retained by the nozzle arm 21 in an inward attitude such that the FOM or the ozone water is spouted in a spouting direction tilted with respect to the upper surface of the substrate W to be applied to a position inward of an outlet port 37 (see FIG. 3) of the FOM nozzle 6 (toward the rotation axis A1). Alternatively, the FOM nozzle 6 may be retained by the nozzle arm 21 in an outward attitude such that the FOM or the ozone water is spouted in a spouting direction tilted with respect to the upper surface of the substrate W to be applied to a position outward of the outlet port 37 of the FOM nozzle 6 (away from the rotation axis A1). A nozzle moving unit 22 is connected to the nozzle arm 21.

The nozzle moving unit 22 pivots the nozzle arm 21 about a pivot axis (not shown) to horizontally move the FOM nozzle 6 along a path extending through a center portion of the upper surface of the substrate W as seen in plan. The nozzle moving unit 22 horizontally moves the FOM nozzle 6 between a processing position defined such that the FOM or the ozone water spouted from the FOM nozzle 6 is applied to the upper surface of the substrate W and a home position defined such that the FOM nozzle 6 is located in the vicinity of the spin chuck 5 as seen in plan. Further, the nozzle moving unit 22 horizontally moves the FOM nozzle 6 between a center position defined such that the FOM or the ozone water spouted from the FOM nozzle 6 is applied to the center portion of the upper surface of the substrate W and a peripheral position defined such that the FOM or the ozone water spouted from the FOM nozzle 6 is applied to a peripheral portion of the upper surface of the substrate W. The processing position includes the center position and the peripheral position. Where the substrate W has a diameter of 300 mm, for example, the peripheral portion of the upper surface (back surface Wb) of the substrate W is defined as an annular portion of the upper surface (back surface Wb) having a width of about 10 mm along the peripheral edge of the substrate W.

The FOM supplying device 7 is connected to the FOM nozzle 6, and includes a hydrofluoric acid pipe 23 to which dilute hydrofluoric acid (a hydrofluoric acid aqueous solution having a lower concentration) is supplied from a dilute hydrofluoric acid supply source (not shown), and an ozone water pipe 24 to which the ozone water is supplied from an ozone water supply source (not shown) which includes, for example, an ozone generator.

A hydrofluoric acid valve 25 for opening and closing the hydrofluoric acid pipe 23 and a hydrofluoric acid flow rate control valve 26 are provided in the hydrofluoric acid pipe 23. The hydrofluoric acid valve 25 is controlled to be opened and closed by the controller 3. Though not shown, the hydrofluoric acid flow rate control valve 26 includes a valve body including a valve seat provided therein, a valve member which opens and closes the valve seat, and an actuator which moves the valve member between an open position and a closed position. Other flow rate control valves each have the same construction.

An ozone water valve 27 for opening and closing the ozone water pipe 24 and an ozone water flow rate control valve 28 which controls the opening degree of the ozone water pipe 24 to control the flow rate of the ozone water flowing through the ozone water pipe 24 are provided in the ozone water pipe 24. The ozone water is supplied to the FOM nozzle 6 through the ozone water pipe 24.

As shown in FIG. 3, the FOM nozzle 6 has, for example, a so-called straight nozzle structure. The FOM nozzle 6 includes a generally hollow cylindrical casing 31. The FOM nozzle 6 is attached to the nozzle arm 21 (see FIG. 2) in a vertical attitude with a center axis of the casing 31 extending vertically. The casing 31 includes a first cylindrical portion 38 and a second cylindrical portion 39 having a smaller diameter than the first cylindrical portion 38 and having a hollow cylindrical shape coaxial with the first cylindrical portion 38. Since the second cylindrical portion 39 has a smaller diameter than the first cylindrical portion 38, a flow passage defined inside the second cylindrical portion 39 has a smaller sectional area than the flow passage of the first cylindrical portion 38. The first cylindrical portion 38 and the second cylindrical portion 39 each have an inner wall extending vertically.

A hydrofluoric acid inlet port 32 for introducing the dilute hydrofluoric acid into the casing 31 and an ozone water inlet port 33 for introducing the ozone water into the casing 31 are provided in a lower portion of the first cylindrical portion 38 of the casing 31. The positional relation of the hydrofluoric acid inlet port 32 and the ozone water inlet port 33 may be such that the hydrofluoric acid inlet port 32 is located above the ozone water inlet port 33, as shown in FIG. 3, or vice versa.

When the hydrofluoric acid valve 25 (see FIG. 2) and the ozone water valve 27 (see FIG. 2) are opened, the dilute hydrofluoric acid from the hydrofluoric acid pipe 23 is supplied into a mixing chamber 35 from the hydrofluoric acid inlet port 32, and the ozone water from the ozone water pipe 24 is supplied into the mixing chamber 35 from the ozone water inlet port 33. The dilute hydrofluoric acid and the ozone water supplied into the mixing chamber 35 are sufficiently mixed together in a lower portion of the mixing chamber 35 (with stirring). The dilute hydrofluoric acid and the ozone water are thus homogeneously mixed together to prepare the hydrofluoric acid/ozone mixture liquid (FOM). The outlet port 37 is provided at a distal end (lower end) of the second cylindrical portion 39 of the casing 31 for spouting the prepared FOM toward an external space 36. The FOM prepared in the mixing chamber 35 flows through the inside of the second cylindrical portion 39 to be spouted from the outlet port 37. With this simple construction, the FOM can be spouted from the FOM nozzle.

Since the dilute hydrofluoric acid and the ozone water are mixed together inside the FOM nozzle 6, the FOM can be spouted from the FOM nozzle 6 immediately after the mixing (immediately after the preparation thereof). Ozone dissolved in the dilute hydrofluoric acid starts decomposition immediately after the dissolution. Since the ozone-containing hydrofluoric acid solution can be spouted from the FOM nozzle 6 immediately after the mixing (immediately after the preparation thereof), the FOM can be supplied to the substrate W in a state substantially free from the decomposition of ozone.

The water supplying unit 8 includes a water nozzle 41. The water nozzle 41 is, for example, a straight nozzle which spouts the liquid in a continuous flow state, and is fixedly disposed above the spin chuck 5 with its outlet port directed toward the center portion of the upper surface of the substrate W. The water nozzle 41 is connected to a water pipe 42 to which water is supplied from a water supply source. A water valve 43 for switching on and off the supply of water from the water nozzle 41 is provided in the water pipe 42. When the water valve 43 is opened, the water supplied from the water pipe 42 to the water nozzle 41 in the continuous flow state is spouted from the outlet port 37 provided at a lower end of the water nozzle 41. When the water valve 43 is closed, the supply of the water from the water pipe 42 to the water nozzle 41 is stopped. The water is, for example, deionized water (DIW). The water is not limited to the DIW, but may be carbonated water, electrolytic ion water, hydrogen water, ozone water or a hydrochloric acid aqueous solution having a dilute concentration (e.g., about 10 ppm to about 100 ppm).

The water nozzle 41 is not necessarily required to be disposed in fixed relation with respect to the spin chuck 5, but may be, for example, a so-called scan nozzle which is attached to an arm pivotal in a horizontal plane above the spin chuck 5 so that a water application position can be scanned over the upper surface of the substrate W by pivoting the arm.

The protection liquid supplying unit 12 includes the lower surface supply pipe 19 and the lower surface nozzle 20 described above, a protection liquid pipe 44 connected to the lower surface supply pipe 19, a protection liquid valve 45 for opening and closing the protection liquid pipe 44, and a protection liquid flow rate control valve 46 for controlling the opening degree of the protection liquid pipe 44 to control the flow rate of the protection liquid flowing through the protection liquid pipe 44. The water to be spouted as the protection liquid from the lower surface nozzle 20 is, for example, deionized water (DIW). The water is not limited to the DIW, but may be carbonated water, electrolytic ion water, hydrogen water, ozone water or a hydrochloric acid aqueous solution having a dilute concentration (e.g., about 10 ppm to about 100 ppm). With the protection liquid valve 45 open, the protection liquid is supplied to the lower surface nozzle 20 through the protection liquid pipe 44 and the lower surface supply pipe 19. The lower surface nozzle 20 spouts the supplied protection liquid generally vertically upward, and the treatment protection liquid spouted from the lower surface nozzle 20 is applied generally perpendicularly to a center portion of the lower surface of the substrate W held by the spin chuck 5. The flow rate of the protection liquid to be spouted from the lower surface nozzle 20 is controlled by the protection liquid flow rate control valve 46.

The cleaning brush 10 is a cylindrical scrub member of a sponge made of, for example, PVA (polyvinyl alcohol). The cleaning brush 10 has a flat cleaning surface 10a on its lower surface. The cleaning surface 10a functions as a contact surface to be brought into contact with the upper surface of the substrate W.

The cleaning brush driving unit 11 includes a pivot arm 47 which retains the cleaning brush 10 at its distal end, and an arm driving unit 48 for driving the pivot arm 47. The arm driving unit 48 is configured to pivot the pivot arm 47 about a vertically extending pivot axis A2, and to move the pivot arm 47 vertically up and down. With this arrangement, the cleaning brush 10 can be horizontally moved between a position above the substrate Wanda home position defined on a lateral side of the spin chuck 5 when the substrate W is held and rotated by the spin chuck 5.

Further, as shown in FIG. 4, a cleaning brush press-contact position at which the cleaning surface 10a of the cleaning brush 10 is kept in press contact with the upper surface of the substrate W can be moved (scanned) radially of the substrate W between the center portion of the substrate W (a position indicated by a solid line in FIG. 4) and the peripheral portion of the substrate W (a position indicated by a two-dot-and-dash line in FIG. 4).

In the scrub-cleaning, the water (e.g., purified water (deionized water)) may be supplied to the upper surface of the substrate W from the water nozzle 41. Thus, foreign matter can be easily removed from the upper surface (back surface Wb) of the substrate W, and foreign matter scrubbed off by the cleaning brush 10 can be expelled from the substrate W.

Figure 5:
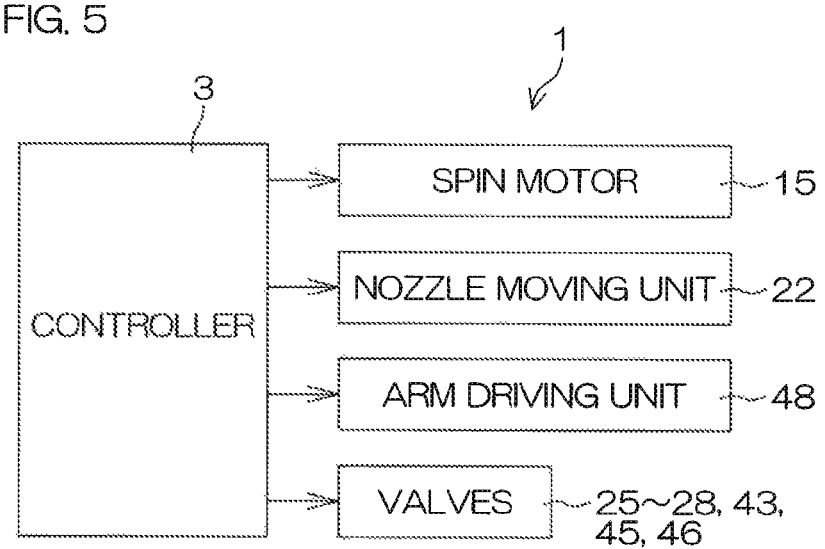
FIG. 5 is a block diagram for explaining the electrical configuration of major portions of the substrate processing apparatus.

FIG. 5 is a block diagram for explaining the electrical configuration of major portions of the substrate processing apparatus 1.

The controller 3 controls the operations of the spin motor 15, the nozzle moving unit 22, the arm driving unit 48 and the like according to a predetermined program. Further, the controller 3 controls the opening/closing operations and the like of the hydrofluoric acid valve 25, the hydrofluoric acid flow rate control valve 26, the ozone water valve 27, the ozone water flow rate control valve 28, the water valve 43, the protection liquid valve 45, the protection liquid flow rate control valve 46 and the like.

Figure 6:
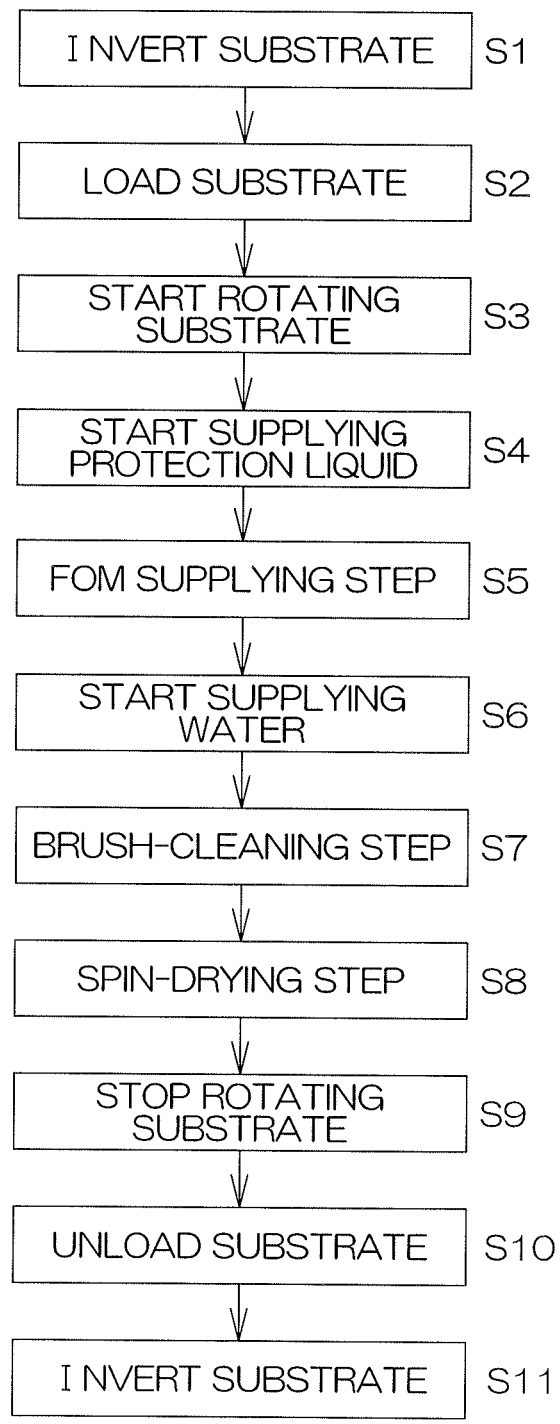
FIG. 6 is a flow diagram for explaining an exemplary cleaning process to be performed by the substrate processing apparatus.

FIG. 6 is a flow diagram for explaining an exemplary cleaning process to be performed by the processing unit 2. FIGS. 7A to 7E are schematic diagrams for explaining the exemplary cleaning process.

In the following description, reference will be made to FIGS. 1, 2, 5 and 6. Reference will also be made to FIGS. 7A to 7E as required. In FIGS. 7B to 7E, the spin base 17 and the clamping members 18 are not shown for simplification of the description.

The substrate W be processed to be processed by the processing unit 2 is a substrate W processed by a pre-processing apparatus such as an annealing apparatus or a film forming apparatus (hereinafter sometimes referred to as "uncleaned substrate"). An example of the substrate W is a round silicon substrate. The substrate W may be a large substrate (e.g., a round substrate having an outer diameter of 300 mm). The processing unit 2 is a cleaning unit of a single substrate processing type for cleaning the back surface Wb (one major surface, non-device-formation surface) opposite from the front surface Wa (the other major surface, device formation surface) of the substrate W.

The back surface Wb of the substrate W to be loaded into the processing unit 2 is a bare silicon surface of the silicon substrate W. The surface be processed to be processed may contain at least one of polysilicon and amorphous silicon. In this embodiment, the back surface Wb of the substrate W has chuck marks formed by the pre-processing apparatus (e.g., chuck marks formed by an electrostatic chuck). The chuck marks include flaws such as chippings and dents formed in the back surface Wb of the substrate W, and partial peelings of the back surface Wb. The chuck marks are formed in the entire back surface Wb of the substrate W. The processing unit 2 removes the chuck marks formed in the back surface Wb of the substrate W by the cleaning process. The cleaning process is not intended to perfectly remove the chuck marks from the back surface Wb of the substrate W, but is intended to remove most of the chuck marks (roughly remove the chuck marks) from the back surface Wb of the substrate W.

Figure 7A:
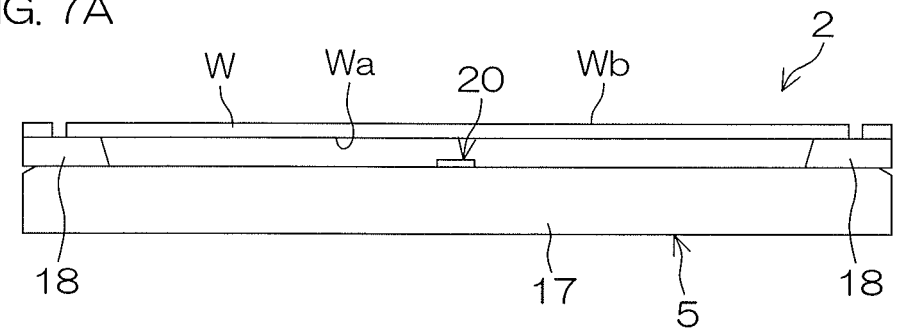
FIGS. 7A to 7C are schematic diagrams for explaining exemplary process steps of the cleaning process.

A carrier C containing an uncleaned substrate W is transported into the substrate processing apparatus 1 from the pre-processing apparatus, and placed on a load port LP. The substrate W is contained in the carrier C with its front surface Wa facing up. The controller 3 causes the indexer robot IR to transport the substrate W from the carrier C to the inversion unit TU with the front surface Wa of the substrate W facing up. Then, the controller 3 causes the inversion unit TU to invert the transported substrate W (S1: substrate inverting step). Thus, the back surface Wb of the substrate W faces up. Thereafter, the controller 3 causes the center robot CR to take out the substrate W from the inversion unit TU by the hand H2, and then load the substrate W into the processing unit 2 with the back surface Wb of the substrate W facing up (Step S2). The uncleaned substrate W loaded into the processing unit 2 is transferred to the spin chuck 5, and held by the spin chuck 5 with the clamping members 18 each switched into a clamping attitude (substrate holding step). Thus, as shown in FIG. 7A, the substrate W is held by the spin chuck 5 with its front surface Wa facing down and with its back surface Wb facing up.

Figure 7B:
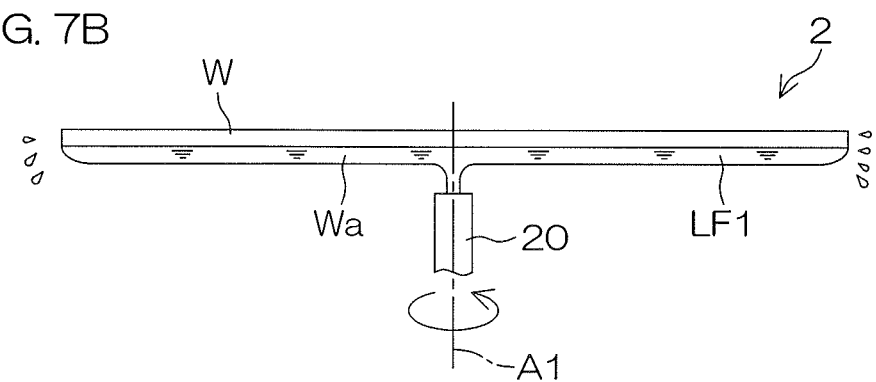

Prior to the loading of the substrate W, the FOM nozzle 6 is retracted to the home position defined on the lateral side of the spin chuck 5. The cleaning brush 10 is also retracted to the home position defined on the lateral side of the spin chuck 5. After the substrate W is held by the spin chuck 5, the controller 3 drives the spin motor 15 to start rotating the spin base 17. Thus, as shown in FIG. 7B, the substrate W is rotated about the rotation axis A1 (Step S3). The rotation speed of the substrate W is increased to a predetermined liquid processing speed (in a range of 300 to 1500 rpm, for example, 500 rpm), and maintained at the liquid processing speed.

When the rotation speed of the substrate W reaches the liquid processing speed, the controller 3 starts supplying the protection liquid (S4: protection liquid supplying step). More specifically, the controller 3 opens the protection liquid valve 45. Thus, the protection liquid is supplied from the protection liquid pipe 44 to the lower surface nozzle 20 and, as shown in FIG. 7B, spouted upward from the lower surface nozzle 20. The protection liquid spouted from the lower surface nozzle 20 is applied to the center portion of the front surface Wa of the substrate W. At this time, the spouting flow rate of the protection liquid is controlled at about 0.5 L/min by the protection liquid flow rate control valve 46. The protection liquid supplied to the front surface Wa of the substrate W receives a centrifugal force generated by the rotation of the substrate W to spread over the entire substrate W, whereby a liquid film LF1 of the protection liquid covering the entire front surface Wa of the substrate W is formed on the front surface Wa of the substrate W. The front surface (device formation surface) Wa of the substrate W is protected with the liquid film of the protection liquid. The protection liquid flowing on the front surface Wa of the substrate W is splashed laterally of the substrate W from the outer periphery of the substrate W.

Figure 7C:
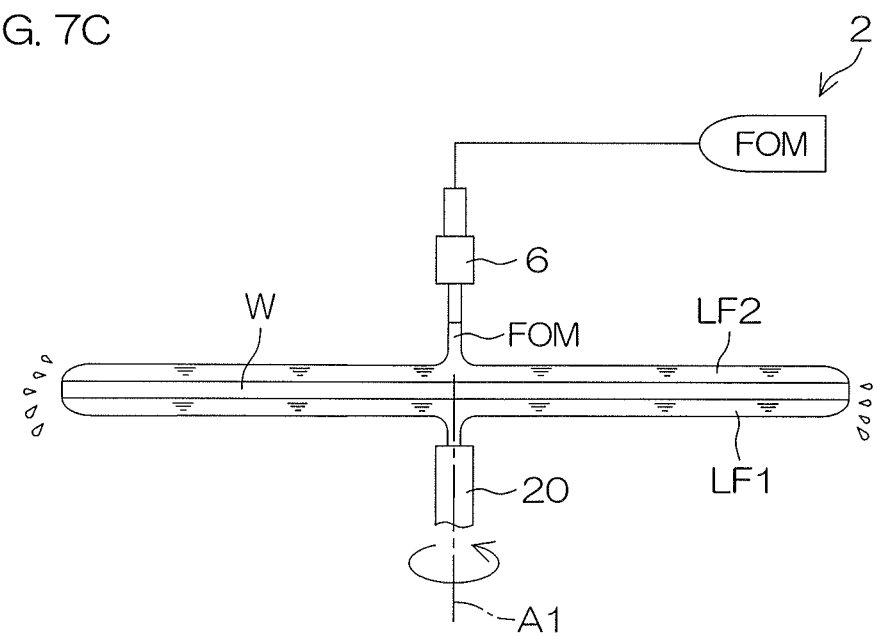

After a lapse of a predetermined period (sufficient to form the liquid film LF1 of the protection liquid on the front surface Wa of the substrate W) from the start of the spouting of the protection liquid, the controller 3 performs an ozone-containing hydrofluoric acid solution supplying step (hereinafter referred to as "FOM supplying step") of supplying the FOM to the back surface Wb of the substrate W (Step S5). In the FOM supplying step (S5), the controller 3 controls the nozzle moving unit 22 to move the FOM nozzle 6 from the home position to the center position. Thus, the FOM nozzle 6 is located above the center portion of the substrate W. After the FOM nozzle 6 is located above the substrate W, the controller 3 simultaneously opens the hydrofluoric acid valve 25 and the ozone water valve 27. Thus, the dilute hydrofluoric acid flowing through the hydrofluoric acid pipe 23 is supplied to the FOM nozzle 6, and the ozone water flowing through the ozone water pipe 24 is supplied to the FOM nozzle 6. Then, the dilute hydrofluoric acid and the ozone water are mixed together in the casing of the FOM nozzle 6, whereby the FOM is prepared. As shown in FIG. 7C, the FOM is spouted from the outlet port 37 of the FOM nozzle 6 to be thereby applied to the center portion of the back surface Wb of the substrate W. The FOM supplied to the center portion of the back surface Wb of the substrate W receives a centrifugal force generated by the rotation of the substrate W to spread radially toward the peripheral portion of the back surface Wb of the substrate W. Thus, the FOM can be distributed over the entire back surface Wb of the substrate W. In other words, hydrofluoric acid and ozone can be distributed over the entire back surface Wb of the substrate W. As a result, as shown in FIG. 7C, a liquid film LF2 of the FOM covering the entire back surface Wb of the substrate W is formed on the substrate W.

When the FOM is supplied to the back surface Wb of the substrate W, a silicon oxide film is formed in the back surface Wb of the substrate (silicon substrate) W by the oxidizing action of ozone contained in the FOM. Further, the silicon oxide film formed in the back surface Wb of the substrate W is peeled off (lifted off) from the back surface Wb by the oxide film etching action of hydrofluoric acid contained in the FOM. Thus, flaws (chippings, dents, and the like) formed in the back surface Wb of the substrate W are removed. In addition, foreign matter (particles, impurities, peelings of the back surface Wb of the substrate W, and the like) is removed from the back surface Wb of the substrate W. That is, the back surface Wb of the substrate W can be cleaned.

Where the FOM is used as the cleaning chemical liquid, the silicon oxide film can be formed in a greater amount in the back surface Wb of the substrate W as compared with a case in which SC1 is used as the cleaning chemical liquid. Therefore, the FOM has a higher etching capability (foreign matter removing capability). In addition, the ozone water contained in the FOM reduces the running costs as compared with hydrogen peroxide contained in the SC1. This reduces the costs for the cleaning process.

The FOM to be spouted from the FOM nozzle 6 has a hydrofluoric acid concentration of not lower than 0.01 wt. % and not higher than 0.5 wt. %, more preferably not lower than 0.093 wt. % and not higher than 0.221 wt. %. If the hydrofluoric acid concentration of the FOM to be spouted is lower than 0.093 wt. %, it will be impossible to properly lift off the silicon oxide film formed in the back surface Wb of the substrate W and hence to properly clean the back surface Wb of the substrate W. If the hydrofluoric acid concentration of the FOM to be spouted is higher than 0.221 wt. %, the peripheral portion of the back surface Wb of the substrate W is liable to be hydrophobized because a greater amount of hydrofluoric acid is supplied to the peripheral portion of the back surface Wb of the substrate W.

Where the back surface Wb of the substrate W is processed with a chemical liquid containing hydrofluoric acid having a hydrophobizing action, the back surface Wb of the substrate W is liable to be hydrophobized by the action of hydrofluoric acid contained in the chemical liquid. More specifically, ozone dissolved in the hydrofluoric acid solution starts decomposition immediately after the dissolution of ozone. Therefore, where the FOM is spouted toward the center portion of the back surface Wb of the substrate W during the rotation of the substrate W, there is a possibility that ozone does not reach the peripheral portion of the back surface Wb of the substrate W in the FOM supplying step (S5) depending on the spouting flow rate of the FOM and/or the ozone concentration of the FOM. In this case, the peripheral portion of the back surface Wb of the substrate W is liable to be hydrophobized by hydrofluoric acid reaching the peripheral portion of the back surface Wb of the substrate W. Particularly, where the FOM to be supplied to the back surface Wb of the substrate W has a higher hydrofluoric acid concentration, only hydrofluoric acid reaches the peripheral portion of the back surface Wb of the substrate W and, therefore, the peripheral portion of the back surface Wb of the substrate W is more liable to exhibit hydrophobicity.

If the back surface Wb of the substrate W is scrubbed with the cleaning brush 10 with the peripheral portion thereof in a hydrophobic state, the foreign matter is liable to adhere again to the peripheral portion of the back surface Wb of the substrate W via the cleaning brush 10. Therefore, a so-called peripheral mode is liable to occur in which particles are annularly present on the peripheral portion of the back surface Wb of the substrate W after the cleaning process.

The FOM to be spouted from the FOM nozzle 6 has an ozone concentration of not lower than 22.5 ppm and not higher than 67.2 ppm, more preferably not lower than 22.5 ppm and not higher than 42.0 ppm. If the ozone concentration of the FOM to be spouted is lower than 22.5 ppm, ozone will not reach the peripheral portion of the back surface Wb of the substrate W because the FOM contains a smaller amount of ozone. Therefore, the peripheral portion of the back surface Wb of the substrate W is liable to be hydrophobized due to the hydrophobizing action of hydrofluoric acid. If the brush-cleaning step is performed with the peripheral portion of the back surface Wb of the substrate W in a hydrophobic state, the foreign matter is liable to adhere again to the peripheral portion of the back surface Wb of the substrate W. An FOM having an ozone concentration of higher than 42.0 ppm contains a greater number of bubbles and, therefore, is not suitable for the substrate processing. If the ozone concentration of the FOM is higher than 42.0 ppm, ozone is liable to penetrate through the wall of the ozone water pipe 24 (made of PFA) to appear on the ozone water pipe 24. As the ozone concentration increases, the toxicity of ozone is increased. Therefore, the FOM having an ozone concentration of higher than 42.0 ppm when being spouted is not preferred in terms of safety.

The spouting flow rate of the FOM to be spouted from the FOM nozzle 6 is preferably not lower than 0.8 L/min. In this case, ozone can reach the peripheral portion of the back surface Wb of the substrate W, thereby preventing the foreign matter from adhering again to the peripheral portion of the back surface Wb of the substrate W in the brush-cleaning step (S7). The spouting flow rate is more preferably not lower than 1.0 L/min. In this case, a greater amount of ozone can reach the peripheral portion of the back surface Wb of the substrate W in the FOM supplying step (S5).

In this embodiment, the protection liquid is used as the protection fluid to be supplied to the front surface Wa of the substrate W. The supply of the protection liquid to the front surface Wa of the substrate W reliably prevents the FOM from flowing around to the front surface Wa of the substrate W irrespective of the supply flow rate of the FOM in the FOM supplying step (S5). This makes it possible to increase the supply flow rate of the FOM in the FOM supplying step (S5). In this embodiment, therefore, the supply flow rate of the FOM to be spouted from the FOM nozzle 6 is set at a higher level (e.g., 2.0 L/min). With the supply flow rate of the FOM thus set at the higher level, the FOM can be kept ozone-rich, so that ozone can reach the peripheral portion of the back surface Wb of the substrate W. Thus, the back surface Wb of the substrate W can be kept hydrophilic at the end of the FOM supplying step (S5).

In the FOM supplying step (S5), the liquid film LF1 of the protection liquid is formed on the front surface Wa of the substrate W, whereby the entire front surface Wa of the substrate W is protected with the liquid film LF1 of the protection liquid. In addition, the supply flow rate of the protection liquid is set at the higher level (e.g., 2 L/min), so that the FOM supplied to the back surface Wb of the substrate W is reliably prevented from flowing around to the front surface Wa of the substrate W. This makes it possible to processing the back surface Wb of the substrate W with the FOM while reliably protecting the front surface Wa (device formation surface) of the substrate W.

After a lapse of a predetermined period from the start of the spouting of the FOM, the FOM supplying step (S5) ends. After the end of the FOM supplying step (S5), the supply of water as a rinse liquid to the back surface Wb of the substrate W is started (Step S6).

Figure 7D:
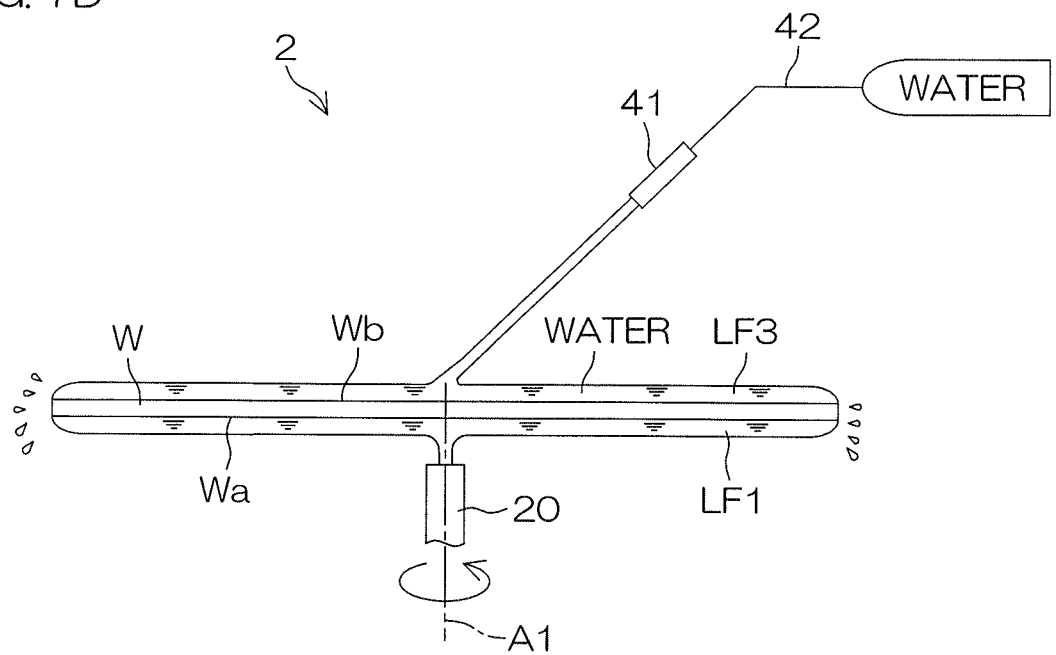
FIGS. 7D and 7E are schematic diagrams for explaining process steps following the step of FIG. 7B.

More specifically, as shown in FIG. 7D, the controller 3 opens the water valve 43 to spout water from the water nozzle 41 toward the center portion of the back surface Wb of the substrate W. The water spouted from the water nozzle 41 is applied to the center portion of the back surface Wb of the substrate W covered with the FOM. The water applied to the center portion of the back surface Wb of the substrate W receives a centrifugal force generated by the rotation of the substrate W to flow toward the peripheral portion of the substrate W on the back surface Wb of the substrate W, thereby spreading over the entire back surface Wb of the substrate W. Therefore, the FOM on the substrate W is forced to flow outward by the applied water to be expelled around the substrate W. Thus, the liquid film LF2 of the FOM on the substrate W is replaced with a liquid film LF3 of the water covering the entire back surface Wb of the substrate W. At this time, the spouting flow rate of the water to be spouted from the water nozzle 41 is, for example, 0.5 L/min to 2 L/min.

Figure 7E:
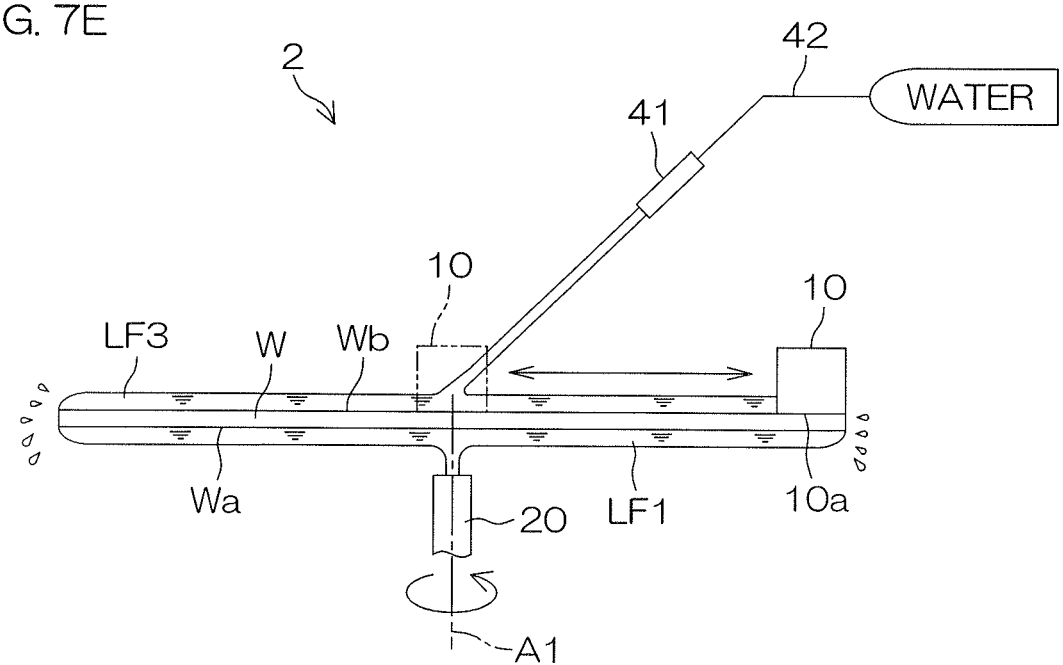

After a lapse of a predetermined period (sufficient to replace the liquid film LF2 of the FOM on the substrate W with the liquid film LF3 of the water) from the start of the spouting of the water from the water nozzle 41, the controller 3 controls the arm driving unit 48 to scrub-clean the back surface Wb of the substrate W with the cleaning brush 10 as shown in FIG. 7E (S7: brush-cleaning step). Thus, the back surface Wb of the substrate W is scrub-cleaned with the cleaning brush 10 while the water is supplied to the back surface Wb of the substrate W. More specifically, the controller 3 controls the arm driving unit 48 to pivot the pivot arm 47 about the pivot axis A2 to move the cleaning brush 10 from the home position to above the substrate W and move the cleaning brush 10 downward to bring the cleaning surface 10a of the cleaning brush 10 into press contact with the back surface Wb of the substrate W. Then, the controller 3 controls the arm driving unit 48 to move (scan) the cleaning brush press-contact position between the center portion of the substrate W (the position indicated by the solid line in FIG. 4) and the peripheral portion of the substrate W (the position indicated by the two-dot-and-dash line in FIG. 4). Thus, the cleaning brush press-contact position is scanned over the entire back surface Wb of the substrate W, whereby the entire back surface Wb of the substrate W is scrubbed with the cleaning brush 10. The reciprocal movement of the cleaning brush 10 between the center portion and the peripheral portion of the substrate W requires, for example, 6.5 seconds. In the brush-cleaning step (S7) to be performed after the FOM supplying step (S5), the foreign matter peeled off in the FOM supplying step (S5) is scrubbed off by the cleaning brush 10. The foreign matter scrubbed off by the cleaning brush 10 is washed away with the water. Thus, the peeled foreign matter is removed from the back surface Wb of the substrate W.

In this embodiment, the scan width of the pivot arm 47 is set so that the substrate W can be cleaned up to very close to the peripheral edge of the substrate W with the cleaning brush 10.

Incidentally, if the back surface Wb of the substrate W is scrubbed with the cleaning brush 10 in a hydrophobic state, the foreign matter scrubbed off by the cleaning brush 10 is liable to be transferred to the hydrophobic back surface Wb to adhere to the back surface Wb. That is, the foreign matter is liable to adhere again to the back surface Wb of the substrate W via the cleaning brush 10.

In this embodiment, however, the supply flow rate of the FOM to be supplied in the FOM supplying step (S5) is set at the higher level (e.g., 2.0 L/min), so that the entire back surface Wb of the substrate W is kept hydrophilic at the end of the FOM supplying step (S5). Therefore, the entire back surface Wb of the substrate W is kept hydrophilic at the start of the brush-cleaning step (S7), whereby the foreign matter is prevented from adhering again to the back surface Wb of the substrate W via the cleaning brush 10 in the FOM supplying step (S5).

In the brush-cleaning step (S7), therefore, the brush-cleaning (scrub-cleaning) process can be performed on the back surface Wb of the substrate W while the re-adhesion of the foreign matter to the back surface Wb of the substrate W is prevented or suppressed.

After the cleaning brush 10 is reciprocated a predetermined number of times (e.g., four times), the controller 3 controls the arm driving unit 48 to return the cleaning brush 10 from above the spin chuck 5 to the home position. Further, the controller 3 closes the water valve 43 to stop spouting the water from the water nozzle 41. The controller 3 closes the protection liquid valve 45 to stop spouting the protection liquid from the lower surface nozzle 20. Thus, the brush-cleaning step (S7) ends.

By thus sequentially performing the FOM process (S5) and the brush-cleaning step (S7), most of the chuck marks can be removed from the entire back surface Wb of the substrate W. This improves the yield in a subsequent process (e.g., an exposure process) to be performed after the cleaning process sequence.

Subsequently, a spin-drying step (Step S8) of drying the substrate W is performed. More specifically, the controller 3 controls the spin motor 15 to accelerate the substrate W to a drying rotation speed (e.g., several thousands rpm) higher than the rotation speed employed in the FOM supplying step (S5) and the brush-cleaning step (S7) and rotate the substrate W at the drying rotation speed. Thus, a greater centrifugal force is exerted on the liquid present on the substrate W, whereby the liquid adhering to the substrate W is spun off around the substrate W. Thus, the liquid is removed from the substrate W to dry the substrate W.

If the spin-drying step is performed on the substrate W with the processing surface of the substrate W (i.e., the back surface Wb of the substrate W) in a hydrophobic state, for example, the water is liable to move in the form of water droplets on the processing surface in the spin-drying step, resulting in a substrate processing failure.

In this embodiment, in contrast, the entire back surface Wb of the substrate W is kept hydrophilic at the end of the FOM supplying step (S5). Therefore, the spin-drying step (S8) is performed on the substrate W with the back surface Wb of the substrate W kept hydrophilic. Thus, the substrate processing failure can be suppressed or prevented in the spin-drying step (S8).

After a lapse of a predetermined period from the start of the high-speed rotation of the substrate W, the controller 3 controls the spin motor 15 to stop the rotation of the substrate W by the spin chuck 5 (Step S9).

Then, the substrate W is unloaded from the processing chamberprocessing chamber 4 (Step S10). More specifically, the controller 3 controls the center robot CR to insert the hand H2 into the processing chamberprocessing chamber 4 with all the nozzles and the like retracted from above the spin chuck 5. The clamping members 18 are each switched from the clamping attitude to an unclamping attitude, whereby the substrate W can be released from the spin chuck 5. In turn, the controller 3 causes the hand H2 of the center robot CR to hold the substrate W on the spin chuck 5. Then, the controller 3 retracts the hand H2 of the center robot CR from the processing chamberprocessing chamber 4. Thus, the substrate W subjected to the cleaning process is unloaded from the processing chamber 4. The controller 3 causes the hand H2 of the center robot CR to transport the cleaned substrate W to the inversion unit TU. Then, the controller 3 causes the inversion unit TU to invert the transported substrate W (Step S11). Thus, the front surface Wa of the substrate W faces up. Thereafter, the controller 3 causes the hand H1 of the indexer robot IR to take out the substrate W from the inversion unit TU and place the cleaned substrate W in the carrier C with the front surface Wa of the substrate W facing up. The carrier C containing the cleaned substrate W is transported from the substrate processing apparatus 1 to a post-processing apparatus such as an exposure apparatus.

In this embodiment, as described above, the brush-cleaning step (S7) is performed after the FOM supplying step (S5). In the FOM supplying step (S5), the FOM spouted from the FOM nozzle 6 is supplied to the back surface Wb of the substrate W. The silicon oxide film is formed in the back surface Wb of the substrate W (silicon substrate) by the oxidizing action of ozone contained in the FOM. Further, the silicon oxide film formed in the back surface Wb of the substrate W is peeled off (lifted off) from the back surface Wb by the oxide film etching action of hydrofluoric acid contained in the FOM. Thus, the foreign matter (particles, impurities, peelings of the back surface Wb of the substrate W, and the like) is removed from the back surface Wb of the substrate W, and the flaws (chippings, dents, and the like) formed in the back surface Wb of the substrate Ware removed. Since ozone having a strong oxidative power is used, the oxide film can be formed in a greater amount in the back surface Wb of the substrate W. Therefore, the greater amount of oxide film can be removed from the back surface Wb of the substrate W. Thus, the foreign matter and/or the flaws can be efficiently removed from the back surface Wb of the substrate W.

In the brush-cleaning step (S7) to be performed after the FOM supplying step (S5), the cleaning brush 10 is brought into abutment against the back surface Wb of the substrate W, whereby the peeled foreign matter is scrubbed off by the cleaning brush 10. Thus, the peeled foreign matter can be removed from the back surface Wb of the substrate W.

Where the back surface Wb of the substrate W is processed with the chemical liquid containing hydrofluoric acid having a hydrophobizing action, the back surface Wb of the substrate W is liable to be hydrophobized by the action of hydrofluoric acid contained in the chemical liquid. If the cleaning brush 10 is brought into abutment against the back surface Wb of the substrate W kept in a hydrophobic state, the foreign matter once scrubbed off by the cleaning brush 10 is liable to adhere again to the back surface Wb of the substrate W via the cleaning brush 10.

In this embodiment, in contrast, the dilute hydrofluoric acid serves as a solvent for the FOM and, hence, has a lower hydrofluoric acid concentration. Further, ozone contained in the FOM has a hydrophilizing action. Therefore, the hydrophobization of the back surface Wb of the substrate W by hydrofluoric acid is prevented in the FOM supplying step (S5). As a result, the entire back surface Wb of the substrate W can be kept hydrophilic after the end of the FOM supplying step (S5). That is, the entire back surface Wb of the substrate W is kept hydrophilic at the start of the brush-cleaning step (S7). This suppresses or prevents the re-adhesion of the foreign matter to the back surface Wb of the substrate W via the cleaning brush 10.

Further, the FOM supplying step (S5) and the brush-cleaning step (S7) are not performed in parallel, but the scrub cleaning with the cleaning brush is performed after the FOM supplied to the substrate W is replaced with the water. This prevents the cleaning brush 10 from being corroded by hydrofluoric acid and ozone contained in the FOM. Thus, the service life of the cleaning brush 10 can be prolonged.

Further, the water rinsing step (S6, S7) is performed after the FOM supplying step (S5), and the brush-cleaning step (S7) is performed in parallel with the water rinsing step (S6, S7). This makes it possible to reduce the period required for the cleaning process sequence to thereby improve the throughput as compared with a case in which an additional step is performed between the FOM supplying step (S5) and the water rinsing step.

It is also conceivable to provide a dilute hydrofluoric acid nozzle for spouting the dilute hydrofluoric acid and an ozone water nozzle for spouting the ozone water, and prepare the FOM by mixing the dilute hydrofluoric acid from the dilute hydrofluoric acid nozzle and the ozone water from the ozone water nozzle together on the back surface Wb of the substrate W for supplying the FOM to the back surface Wb of the substrate W. In this case, however, it is difficult to maintain the hydrofluoric acid concentration and the ozone concentration of the FOM evenly on the back surface Wb of the substrate W. This may result in uneven cleaning on the back surface Wb of the substrate W.

In this embodiment, in contrast, the FOM is spouted from the single nozzle (FOM nozzle 6). Therefore, the FOM can be supplied to the back surface Wb of the substrate with the hydrofluoric acid concentration and the ozone concentration thereof properly controlled at the predetermined levels.

Figure 8:
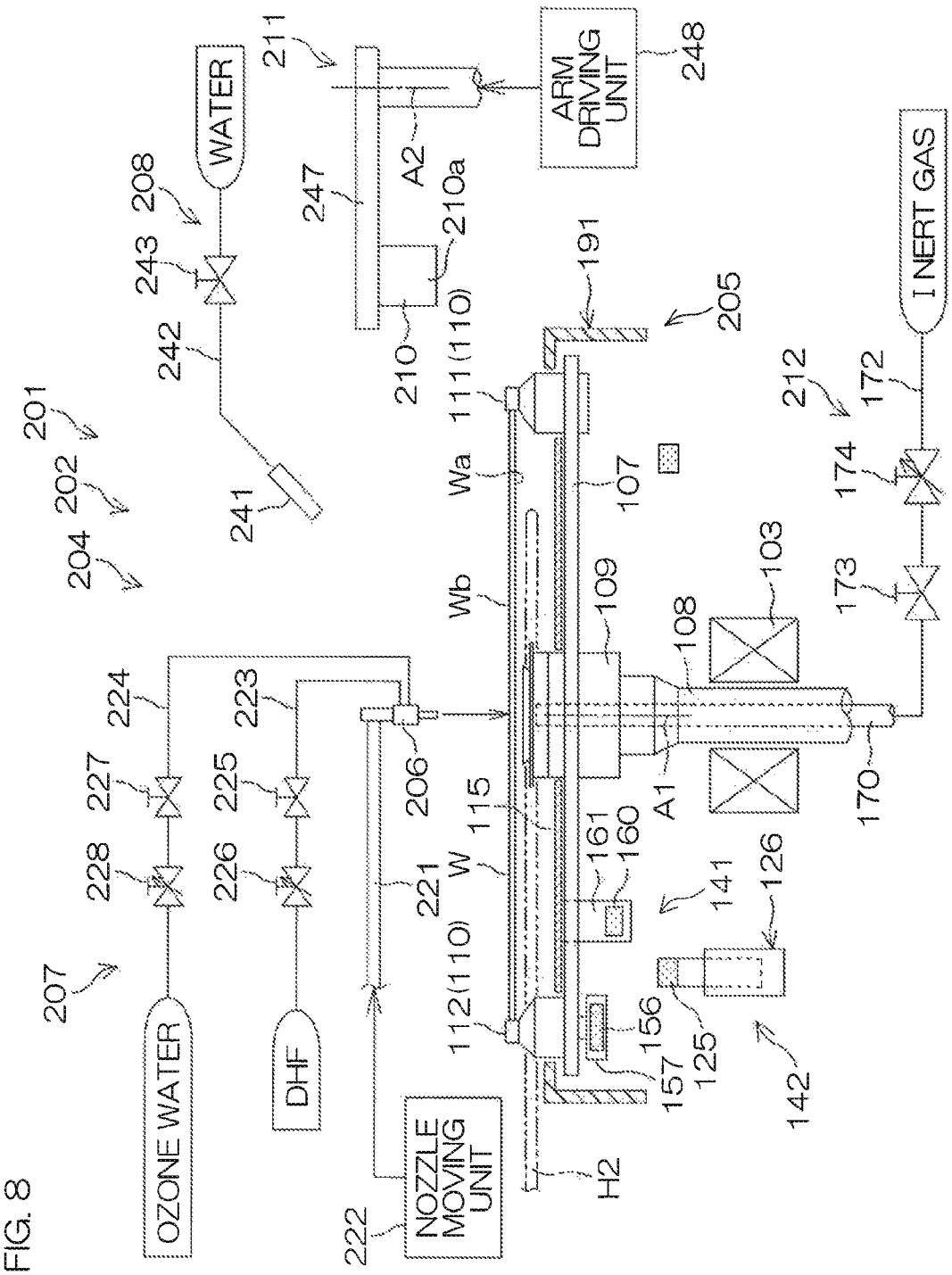
FIG. 8 is a schematic sectional view for explaining the construction of a processing unit provided in a substrate processing apparatus according to a second embodiment of the present invention by way of example.

FIG. 8 is a schematic sectional view for explaining an exemplary construction of a processing unit 202 provided in a substrate processing apparatus 201 according to a second embodiment.

The processing unit 202 includes a box-shaped processing chamber 204 having an inside space, a spin chuck (substrate holding unit) 205 which holds a single substrate W in a horizontal attitude in the processing chamber 204 and rotates the substrate W about a rotation axis A1 vertically extending through the center of the substrate W, an FOM nozzle (nozzle) 206 which selectively spouts FOM and ozone water toward an upper surface (back surface (one major surface) Wb) of the substrate W held by the spin chuck 205, an FOM supplying device 207 which selectively supplies the FOM and the ozone water to the FOM nozzle 206, a water supplying unit 208 for supplying water to the upper surface of the substrate W held by the spin chuck 205, a cleaning brush 210 to be brought into contact with the upper surface of the substrate W for scrub-cleaning the upper surface, a cleaning brush driving unit 211 for driving the cleaning brush 210, a protection gas supplying unit 212 for supplying an inert gas (protection gas) to a lower surface (front surface (the other major surface) Wa) of the substrate W held by the spin chuck 205, and a tubular processing cup (not shown) surrounding the spin chuck 205. The FOM nozzle 206 and the FOM supplying device 207 constitute an FOM supplying unit. In this embodiment, the FOM nozzle 206 and the FOM supplying device 207 also constitute an ozone water supplying unit for supplying the ozone water to the substrate. That is, the FOM supplying unit doubles as the ozone water supplying unit.

The processing chamber 204 includes a box-shaped partition wall (not shown), an FFU (fan/filter unit not shown) as an air supplying unit which supplies clean air from an upper portion of the partition wall to the inside of the partition wall (the inside of the processing chamber 204), and an evacuator (not shown) which expels gas from the processing chamber 204 from a lower portion of the partition wall. The FFU and the evacuator cooperatively form a downflow (downward stream) in the processing chamber 204.

The spin chuck 205 includes a turntable 107 which is rotatable about the vertical rotation axis A1. A rotation shaft 108 is connected to a lower surface of the turntable 107 at a rotation center of the turntable 107 via a boss 109. The rotation shaft 108 is a vertically extending hollow shaft, and is configured to receive a driving force from a rotative driving unit 103 to be thereby rotated about the rotation axis A1. The rotative driving unit 103 may be, for example, an electric motor employing the rotation shaft 108 as its driving shaft. The spin chuck 205 further includes a plurality of holder pins 110 (six holder pins 110 in this embodiment) disposed in circumferentially spaced relation on a peripheral portion of an upper surface of the turntable 107. The holder pins 110 are configured to horizontally hold the substrate W at a substrate holding height defined so as to be spaced a predetermined distance upward from the generally horizontal upper surface of the turntable 107.

The spin chuck 205 further includes a protection disk 115 disposed between the upper surface of the turntable 107 and the substrate holding height defined by the holder pins 110. The protection disk 115 is connected to the turntable 107 in a vertically movable manner, and is movable between a lower position close to the upper surface of the turntable 107 and an adjacent position located in slightly spaced adjacent relation to the lower surface of the substrate W held by the holder pins 110 above the lower position. The protection disk 115 is a disk-shaped member having a slightly greater diameter than the substrate W, and formed with cutaway portions in association with the holder pins 110 to avoid the holder pins 110.

The rotation shaft 108 is hollow, and an inert gas supply pipe 170 is inserted in the rotation shaft 108. A lower end of the inert gas supply pipe 170 is connected to an inert gas supply line 172 through which an inert gas is supplied as an exemplary protection gas from an inert gas supply source. Examples of the inert gas to be supplied through the inert gas supply line 172 include CDA (clean dehumidified air), nitrogen gas and other inert gases. An inert gas valve 173 and an inert gas flow rate control valve 174 are provided in the inert gas supply line 172. The inert gas valve 173 opens and closes the inert gas supply line 172. With the inert gas valve 173 open, the inert gas is fed into the inert gas supply pipe 170. The inert gas is supplied to a space defined between the protection disk 115 and the lower surface of the substrate W by an arrangement to be described later. Thus, the inert gas supply pipe 170, the inert gas supply line 172, the inert gas valve 173 and the like constitute the protection gas supplying unit 212 described above.

Figure 9:
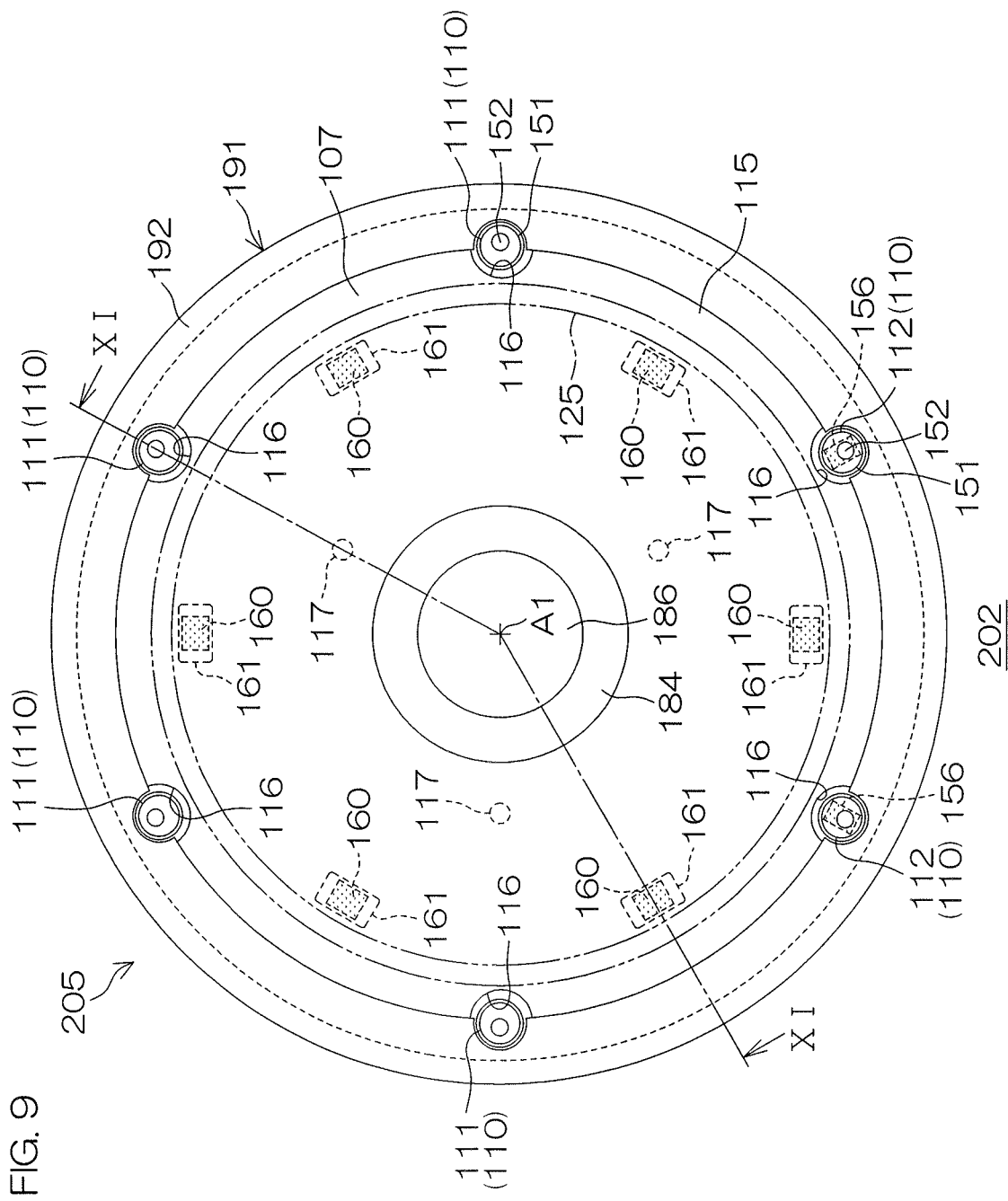
FIG. 9 is a plan view for explaining a more specific structure of a spin chuck provided in the substrate processing apparatus.
Figure 10:
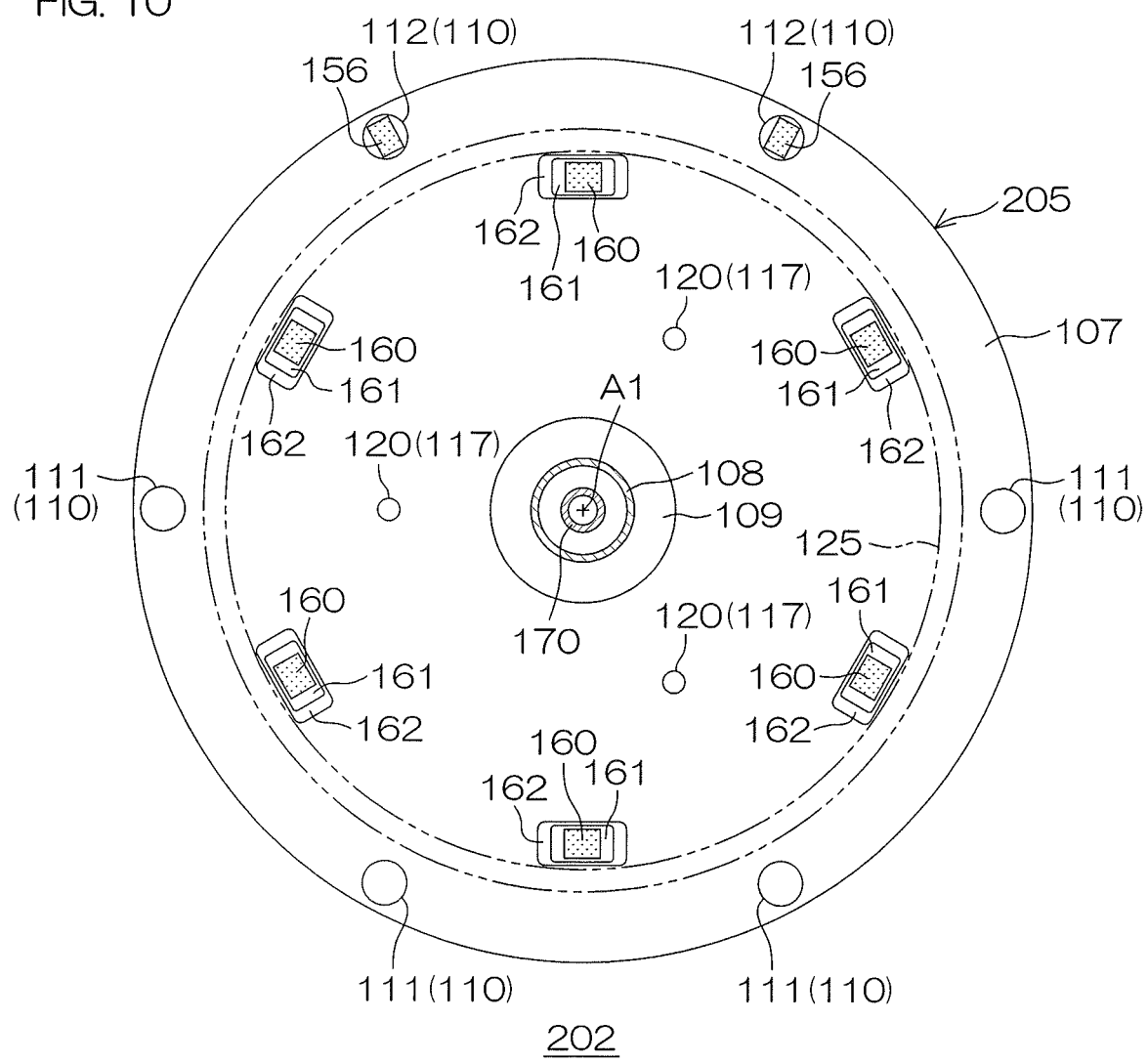
FIG. 10 is a bottom view of the structure of FIG. 9.
Figure 11:
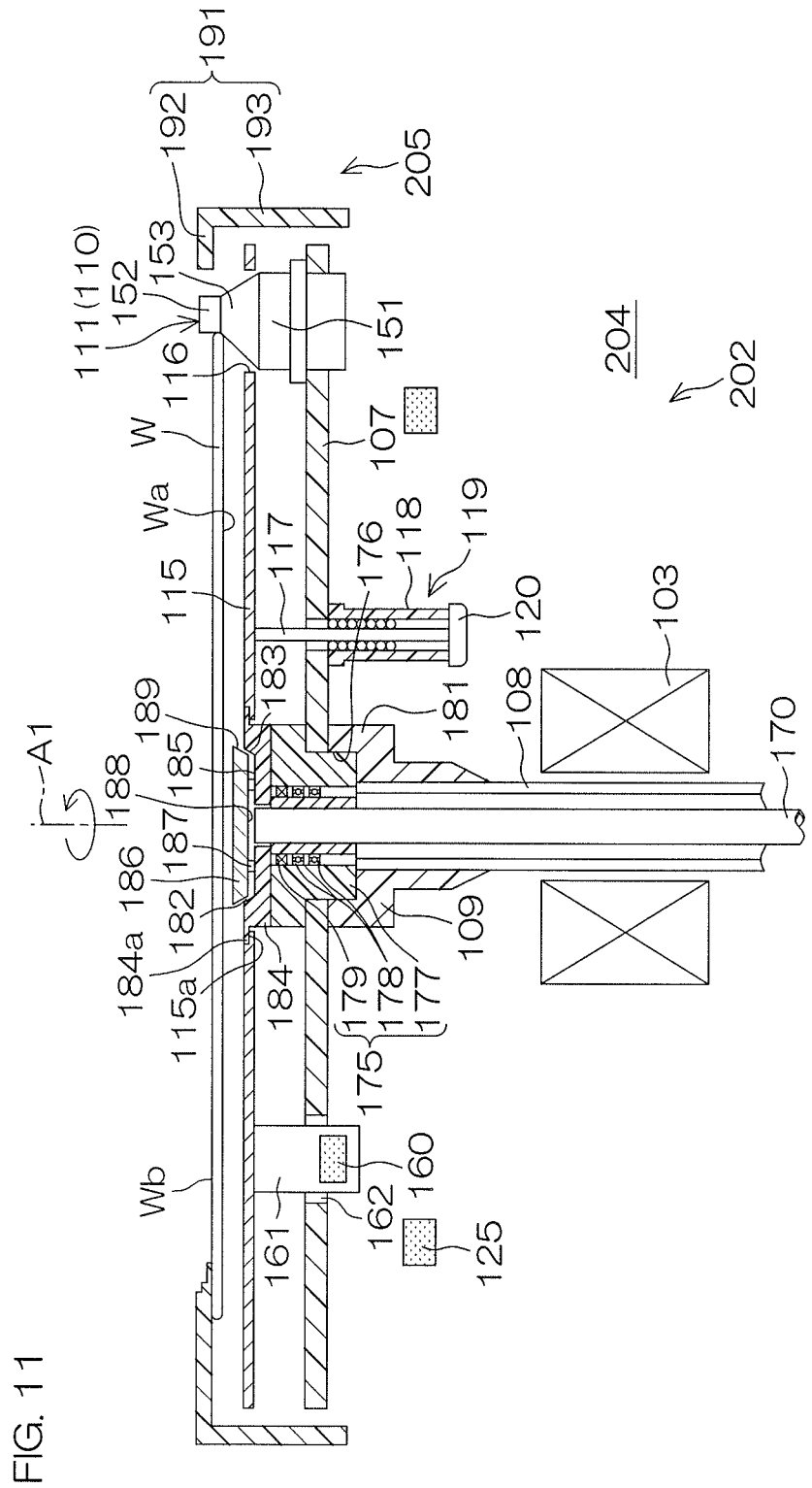
FIG. 11 is a sectional view taken along a sectional plane XI-XI in FIG. 9.
Figure 12:
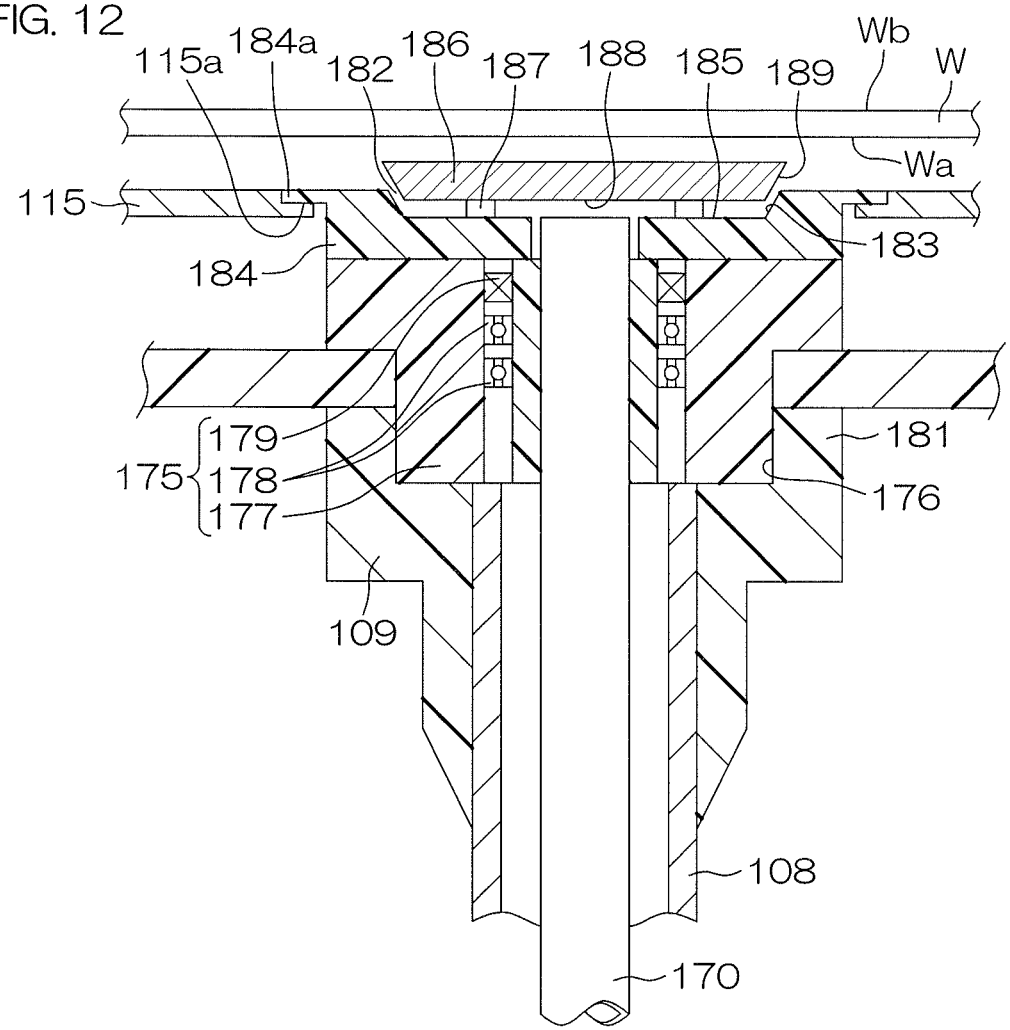
FIG. 12 is an enlarged sectional view showing a part of the structure of FIG. 11 on an enlarged scale.
Figure 13:
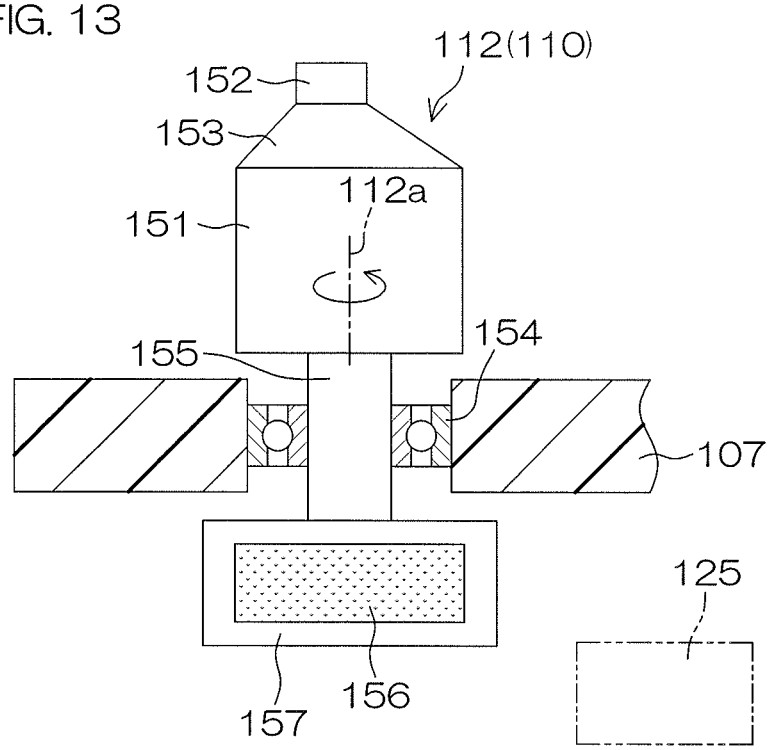
FIG. 13 is a sectional view showing the structure of a part of the spin chuck around a movable pin on an enlarged scale.
Figure 14:
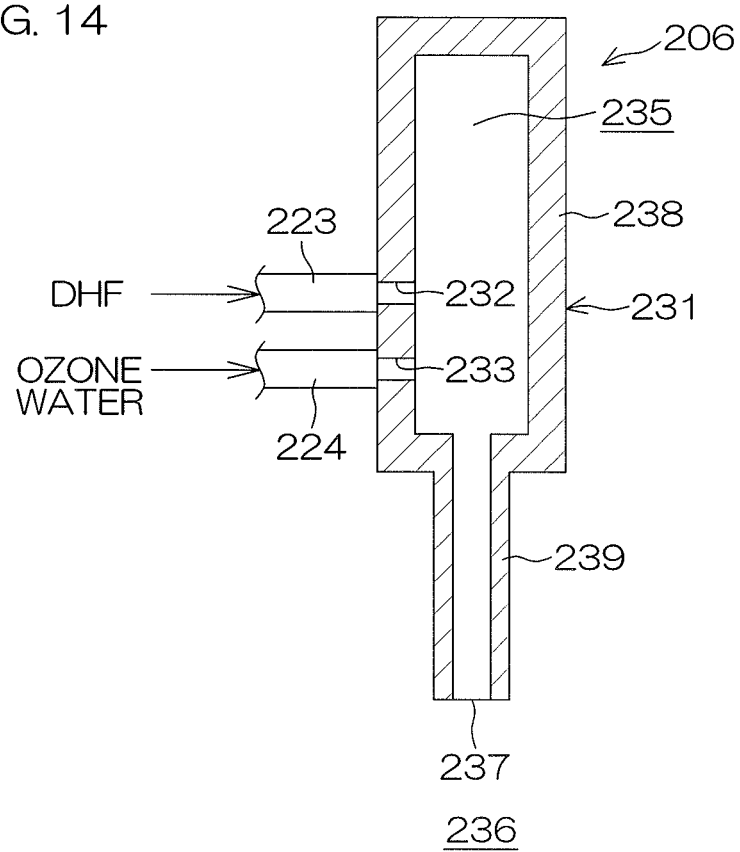
FIG. 14 is a schematic sectional view showing the structure of an FOM nozzle.
Figure 15:
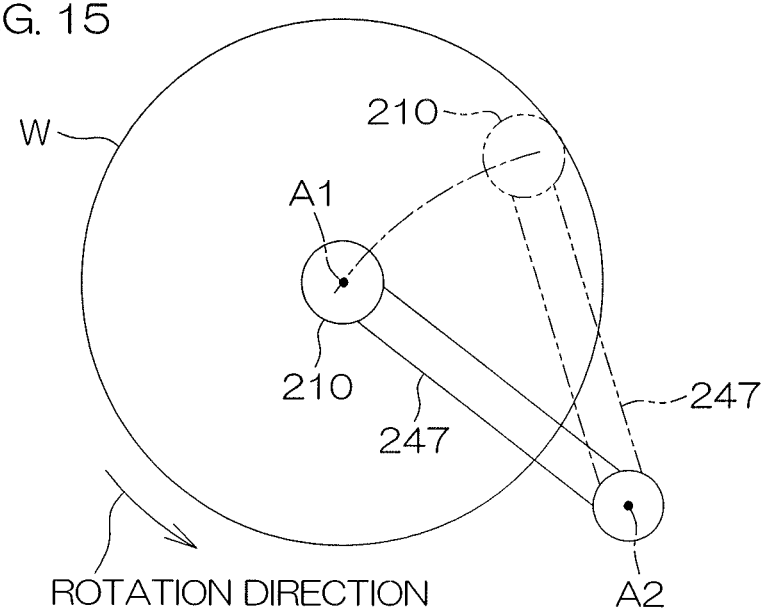
FIG. 15 is a schematic plan view for explaining the movement of a cleaning brush.

FIG. 9 is a plan view for explaining a more specific structure of the spin chuck 205 provided in the substrate processing apparatus 201. FIG. 10 is a bottom view of the structure of FIG. 9. FIG. 11 is a sectional view taken along a sectional plane XI-XI in FIG. 9. FIG. 12 is an enlarged sectional view showing a part of the structure of FIG. 11 on an enlarged scale. FIG. 13 is a sectional view showing the structure of a part of the spin chuck 205 around a movable pin 112 on an enlarged scale. FIG. 14 is a schematic sectional view showing the structure of the FOM nozzle 206. FIG. 15 is a schematic plan view for explaining the movement of the cleaning brush 210.

The turntable 107 has a disk shape extending in a horizontal plane, and is connected to the boss 109 connected to the rotation shaft 108. The plural holder pins 110 are circumferentially equidistantly arranged on the peripheral portion of the upper surface of the turntable 107. The holder pins 110 include immovable pins 111 which are immovable with respect to the turntable 107, and movable pins 112 which are movable with respect to the turntable 107. In this embodiment, adjacent two of the holder pins 110 serve as the movable pins 112. As shown in FIGS. 11 and 13, the holder pins 110 each include a lower shaft portion 151 connected to the turntable 107 and an upper shaft portion 152 provided integrally on an upper end of the lower shaft portion 151. The lower shaft portion 151 and the upper shaft portion 152 each have a cylindrical shape. The upper shaft portion 152 is eccentric to a center axis of the lower shaft portion 151. The upper end of the lower shaft portion 151 and a lower end of the upper shaft portion 152 are connected to each other by a taper surface 153 which extends downward from the upper shaft portion 152 to a peripheral surface of the lower shaft portion 151.

As schematically shown in FIG. 13, the movable pins 112 are each connected to the turntable 107 so that the lower shaft portion 151 is rotatable about a rotation axis 112$a$ coinciding with the center axis of the lower shaft portion 151. More specifically, a support shaft 155 is provided at a lower end of the lower shaft portion 151, and is supported by the turntable 107 via a bearing 154. A magnet retaining member 157 retaining a pin driving permanent magnet 156 is connected to a lower end of the support shaft 155. The pin driving permanent magnet 156 is disposed, for example, with its magnetic pole direction extending perpendicularly to the rotation axis 112$a$ of the movable pin 112.

The protection disk 115 is a generally disk-shaped member having substantially the same size as the substrate W. The protection disk 115 has cutaway portions 116 formed in an outer peripheral portion thereof in association with the holder pins 110 with edges of the cutaway portions 116 respectively spaced a predetermined distance from peripheral surfaces of the holder pins 110. The protection disk 115 has a round opening formed in a center region thereof in association with the boss 109.

As shown in FIGS. 9 and 11, guide shafts 117 each vertically extending parallel to the rotation axis A1 are connected to a lower surface of the protection disk 115 at positions more distant from the rotation axis A1 than the boss 109. In this embodiment, three guide shafts 117 are equidistantly arranged circumferentially of the protection disk 115. More specifically, the three guide shafts 117 are respectively disposed at angular positions associated with every other ones of the holder pins 110 as seen along the rotation axis A1. The guide shafts 117 are respectively connected to linear bearings 118 provided in corresponding positions of the turntable 107. The guide shafts 117 are respectively guided by the linear bearings 118 to be movable vertically parallel to the rotation axis A1. Thus, the guide shafts 117 and the linear bearings 118 constitute a guide unit 119 which guides the protection disk 115 vertically up and down parallel to the rotation axis A1.

The guide shafts 117 respectively extend through the linear bearings 118, and each include a flange 120 provided at a lower end thereof as projecting outward. With the flanges 120 in abutment against lower ends of the respective linear bearings 118, the upward movement of the guide shafts 117, i.e., the upward movement of the protection disk 115, is restricted. That is, the flanges 120 serve as a restriction member for restricting the upward movement of the protection disk.

Magnet retaining members 161 each retaining a protection disk permanent magnet 160 are fixed to the lower surface of the protection disk 115 at positions outwardly more distant from the rotation axis A1 than the guide shafts 117 and inwardly closer to the rotation axis A1 than the holder pins 110. In this embodiment, the protection disk permanent magnets 160 are respectively retained in the magnet retaining members 161 with their magnetic pole directions extending vertically. For example, the protection disk permanent magnets 160 may be each fixed in the magnet retaining member 161 with an S-pole thereof located on a lower side and with an N-pole thereof located on an upper side. In this embodiment, six magnet retaining members 161 are arranged in circumferentially equidistantly spaced relation. More specifically, the magnet retaining members 161 are respectively disposed at angular positions between adjacent ones of the holder pins 110 (intermediate between adjacent ones of the holder pins 110 in this embodiment) as seen along the rotation axis A1. Further, six angular sectors (six equiangular sectors in this embodiment) are defined by division of the protection disk by the six magnet retaining members 161 as seen along the rotation axis A1, and the three guide shafts 117 are respectively disposed in every other ones of the six angular sectors (at middle positions in every other ones of the six angular sectors in this embodiment).

As shown in FIG. 10, the turntable 107 has six through-holes 162 in association with the six magnet retaining members 161. The through-holes 162 are respectively configured so that the corresponding magnet retaining members 161 can be inserted through the through-holes 162 vertically parallel to the rotation axis A1. With the protection disk 115 located in the lower position, the magnet retaining members 161 are respectively inserted through the through-holes 162 to project downward from the lower surface of the turntable 107, so that the protection disk permanent magnets 160 are located below the lower surface of the turntable 107.

As shown in FIG. 8, a vertically movable permanent magnet 125 is disposed below the turntable 107. A magnet lift unit 126 which moves the vertically movable permanent magnet 125 vertically up and down is connected to the vertically movable permanent magnet 125. The magnet lift unit 126 includes, for example, a cylinder provided in a vertically extendable manner, and is supported by the cylinder.

The vertically movable permanent magnet 125 has an annular shape coaxial with the rotation axis A1, and is disposed in a flat plane (horizontal plane) perpendicular to the rotation axis A1. More specifically, the vertically movable permanent magnet 125 is located more distant from the rotation axis A1 than the protection disk permanent magnets 160 and closer to the rotation axis A1 than the pin driving permanent magnets 156. That is, the annular vertically movable permanent magnet 125 is positioned between the protection disk permanent magnets 160 and the pin driving permanent magnets 156 as seen in plan. Further, the vertically movable permanent magnet 125 is located at a lower level than the protection disk permanent magnets 160. In this embodiment, the vertically movable permanent magnet 125 has a magnetic pole direction extending horizontally, i.e., extending radially about the rotation axis of the turntable 107. Where the protection disk permanent magnets 160 each have an S-pole on the lower side, the vertically movable permanent magnet 125 is configured to have the same polarity, i.e., to have a ring-shaped S-pole, on a radially inward edge thereof about the rotation axis of the turntable.

Where the vertically movable permanent magnet 125 is located in an upper position defined such that a radially outward ring-shaped magnetic pole thereof is horizontally opposed to the pin driving permanent magnets 156 (see FIG. 18B), the movable pins 112 are driven to and retained at holding positions by magnetic forces acting between the vertically movable permanent magnet 125 and the pin driving permanent magnets 156.

The upper shaft portions 152 of the movable pins 112 are each eccentric to the rotation axis 112a (see FIG. 13). Therefore, the upper shaft portions 152 are each shifted between a release position more distant from the rotation axis A1 and a holding position closer to the rotation axis A1 by the rotation of the lower shaft portions 151. The upper shaft portions 152 of the movable pins 112 are each biased toward the release position by a resilient pressing force of a resilient pressing member such as a spring (not shown). Therefore, the movable pins 112 are each located at the release position more distant from the rotation axis A1, when the pin driving permanent magnets 156 each receive no attractive magnetic force from the vertically movable permanent magnet 125.

The pin driving permanent magnets 156 are each located so that the upper shaft portion 152 is movable to the holding position closer to the rotation axis A1 when the pin driving permanent magnets 156 each receive an attractive magnetic force from the vertically movable permanent magnet 125 (a magnetic force greater than the resilient pressing force generated by the resilient pressing member). Since the vertically movable permanent magnet 125 has an annular shape coaxial with the rotation axis A1, the attractive magnetic forces are generated between the vertically movable permanent magnet 125 and the pin driving permanent magnets 156 irrespective of the rotational positions of the movable pins 112 about the rotation axis A1, i.e., even during the rotation of the turntable 107. Thus, the movable pins 112 are retained at the holding positions at which the movable pins 112 hold the substrate W.

When the vertically movable permanent magnet 125 is located in the upper position (see FIG. 18B), repulsive magnetic forces act between the vertically movable permanent magnet 125 and the protection disk permanent magnets 160 and, therefore, the protection disk permanent magnets 160 each receive an upward external force. Thus, the protection disk 115 receives upward forces from the magnet retaining members 161 retaining the protection disk permanent magnets 160 to be thereby retained in a processing position adjacent to the lower surface of the substrate W.

Where the vertically movable permanent magnet 125 is located in a lower position (see FIG. 18A) spaced downward from the upper position (see FIG. 18B), smaller repulsive magnetic forces act between the vertically movable permanent magnet 125 and the protection disk permanent magnets 160. Therefore, the protection disk 115 is retained in the lower position closer to the upper surface of the turntable 107 by its gravity. Since the vertically movable permanent magnet 125 is not opposed to the pin driving permanent magnets 156, external forces for biasing the movable pins 112 toward the holding positions do not act on the movable pins 112.

When the vertically movable permanent magnet 125 is located in the lower position, therefore, the protection disk 115 is located in the lower position closer to the upper surface of the turntable 107, and the movable pins 112 are retained at the release positions. In this state, the center robot CR which loads the substrate W into the spin chuck 205 and unloads the substrate W from the spin chuck 205 can insert its hand H2 into the space defined between the protection disk 115 and the lower surface of the substrate W.

The protection disk permanent magnets 160, the vertically movable permanent magnet 125 and the magnet lift unit 126 constitute a magnetic levitation unit 141 which levitates the protection disk 115 from the surface of the turntable 107 upward to the processing position by the repulsive forces generated between the permanent magnets 125 and 160. Further, the pin driving permanent magnets 156, the vertically movable permanent magnet 125 and the magnet lift unit 126 constitute a magnetic driving unit 142 which retains the movable pins 112 at the holding positions by the magnetic forces between the permanent magnets 125 and 156.

That is, the magnetic levitation unit 141 and the magnetic driving unit 142 share the vertically movable permanent magnet 125 and the magnet lift unit 126. When the vertically movable permanent magnet 125 is located in the upper position, the protection disk 115 is retained in the adjacent position by the magnetic repulsive forces generated between the vertically movable permanent magnet 125 and the protection disk permanent magnets 160, and the movable pins 112 are retained at the holding positions by the magnetic attractive forces generated between the vertically movable permanent magnet 125 and the pin driving permanent magnets 156.

As illustrated on an enlarged scale in FIG. 12, the boss 109 connected to the upper end of the rotation shaft 108 retains a bearing unit 175 which supports an upper end portion of the inert gas supply pipe 170. The bearing unit 175 includes a spacer 177 fitted and fixed in a recess 176 formed in the boss 109, bearings 178 disposed between the spacer 177 and the inert gas supply pipe 170, and a magnetic fluid bearing 179 disposed between the spacer 177 and the inert gas supply pipe 170 above the bearings 178.

As shown in FIG. 11, the boss 109 unitarily includes a flange 181 projecting outward in a horizontal plane, and the turntable 107 is connected to the flange 181. Further, the spacer 177 is fixed to the flange 181 to hold an inner peripheral edge portion of the turntable 107 between the spacer 177 and the flange 181. A cover 184 is connected to the spacer 177. The cover 184 has a generally disk shape. The cover 184 has a center opening through which the upper end of the inert gas supply pipe 170 is exposed, and a recess 185 provided in an upper surface thereof with the center opening formed in a bottom of the recess 185. The recess 185 has a horizontal bottom surface, and an inclined surface 183 having an inverted partial conical shape and extending from a peripheral edge of the bottom surface obliquely outward upward. A stream regulating member 186 is connected to the bottom surface of the recess 185. The stream regulating member 186 has a plurality of legs 187 (e.g., four legs 187) discretely provided in circumferentially spaced relation about the rotation axis A1, and a bottom surface 188 spaced from the bottom surface of the recess 185 by the legs 187. The stream regulating member 186 has an inclined surface 189 having an inverted partial conical shape and extending from a peripheral edge of the bottom surface 188 obliquely outward upward.

As shown in FIGS. 11 and 12, the cover 184 has a flange 184a projecting outward from an outer peripheral edge of the upper surface thereof. The flange 184a is configured to be fitted with a step 115a formed along an inner peripheral edge of the protection disk 115. That is, when the protection disk 115 is located in the adjacent position adjacent to the lower surface of the substrate W, the flange 184a is fitted with the step 115a, so that the upper surface of the cover 184 and the upper surface of the protection disk 115 are flush with each other to define a flat inert gas flow passage.

With this arrangement, the inert gas flowing out from the upper end of the inert gas supply pipe 170 flows into a space defined by the bottom surface 188 of the stream regulating member 186 in the recess 185 of the cover 184. Then, the inert gas is ejected radially away from the rotation axis A1 through a radial flow passage 182 defined by the inclined surface 183 of the recess 185 and the inclined surface 189 of the stream regulating member 186. The inert gas forms an inert gas stream in the space defined between the protection disk 115 and the lower surface of the substrate W held by the holder pins 110, and is ejected from the space radially outward about the rotation axis of the substrate W.

As shown in FIG. 11, an outer peripheral portion of the upper surface of the protection disk 115 and a peripheral edge of the protection disk 115 are protected by an annular cover 191. The cover 191 includes an annular plate portion 192 projecting radially inward from an outer periphery of an upper surface thereof, and a hollow cylindrical portion 193 extending downward from a peripheral edge of the annular plate portion 192. The outer periphery of the annular plate portion 192 is located outward of the peripheral edge of the turntable 107. The annular plate portion 192 and the hollow cylindrical portion 193 are unitarily formed of, for example, a chemically resistant resin material. The annular plate portion 192 has cutaway portions 194 formed in an inner peripheral portion thereof in association with the holder pins 110 to avoid the holder pins 110. The cutaway portions 194 are formed in the annular plate portion 192 with edges thereof respectively spaced a predetermined distance from the peripheral surfaces of the holder pins 110.

The annular plate portion 192 of the cover 191 has throttling portions 190 (see FIG. 19) provided on an upper surface thereof for narrowing the inert gas flow passage around the outer periphery of the substrate W held by the holder pins 110. These throttling portions 190 increase the flow rate of the inert gas ejected outward from the space defined between the cover 191 and the lower surface (front surface Wa) of the substrate W, thereby reliably preventing or suppressing intrusion of the processing liquid (FOM) to the lower surface (front surface Wa) of the substrate W from the upper surface (back surface Wb) of the substrate W.

As shown in FIG. 8, the FOM nozzle 206 is, for example, a straight nozzle which selectively spouts the FOM and the ozone water in a continuous flow state, and is connected to a distal end of a horizontally extending nozzle arm 221 in a vertical attitude such that the processing liquid is spouted vertically to the upper surface of the substrate W. The FOM nozzle 206 may be retained by the nozzle arm 221 in an inward attitude such that the FOM or the ozone water is spouted in a spouting direction tilted with respect to the upper surface of the substrate W to be applied to a position inward of an outlet port 237 (see FIG. 9) of the FOM nozzle 206 (toward the rotation axis A1). Alternatively, the FOM nozzle 206 may be retained by the nozzle arm 221 in an outward attitude such that the FOM or the ozone water is spouted in a spouting direction tilted with respect to the upper surface of the substrate W to be applied to a position outward of the outlet port 237 of the FOM nozzle 206 (away from the rotation axis A1). A nozzle moving unit 222 is connected to the nozzle arm 221.

The nozzle moving unit 222 pivots the nozzle arm 221 about a pivot axis (not shown) to horizontally move the FOM nozzle 206 along a path extending through a center portion of the upper surface of the substrate W as seen in plan. The nozzle moving unit 222 horizontally moves the FOM nozzle 206 between a processing position defined such that the FOM or the ozone water spouted from the FOM nozzle 206 is applied to the upper surface of the substrate W and a home position defined such that the FOM nozzle 206 is located in the vicinity of the spin chuck 205 as seen in plan. Further, the nozzle moving unit 222 horizontally moves the FOM nozzle 206 between a center position defined such that the FOM or the ozone water spouted from the FOM nozzle 206 is applied to the center portion of the upper surface of the substrate W and a peripheral position defined such that the FOM or the ozone water spouted from the FOM nozzle 206 is applied to a peripheral portion of the upper surface of the substrate W. The processing position includes the center position and the peripheral position.

The FOM supplying device 207 is connected to the FOM nozzle 206, and includes a hydrofluoric acid pipe 223 to which dilute hydrofluoric acid is supplied from a dilute hydrofluoric acid supply source (not shown), and an ozone water pipe 224 to which the ozone water is supplied from an ozone water supply source (not shown) which includes, for example, an ozone generator.

A hydrofluoric acid valve 225 for opening and closing the hydrofluoric acid pipe 223 and a hydrofluoric acid flow rate control valve 226 are provided in the hydrofluoric acid pipe 223. The hydrofluoric acid valve 225 is controlled to be opened and closed by a controller 203. Though not shown, the hydrofluoric acid flow rate control valve 226 includes a valve body including a valve seat provided therein, a valve member which opens and closes the valve seat, and an actuator which moves the valve member between an open position and a closed position. Other flow rate control valves each have the same construction.

An ozone water valve 227 for opening and closing the ozone water pipe 224 and an ozone water flow rate control valve 228 which controls the opening degree of the ozone water pipe 224 to control the flow rate of the ozone water flowing through the ozone water pipe 224 are provided in the ozone water pipe 224. The ozone water is supplied to the FOM nozzle 206 through the ozone water pipe 224.

As shown in FIG. 14, the FOM nozzle 206 includes a generally hollow cylindrical casing 231. The FOM nozzle 206 is attached to the nozzle arm 221 (see FIG. 8) in a vertical attitude with a center axis of the casing 231 extending vertically. The casing 231 includes a first cylindrical portion 238 and a second cylindrical portion 239 having a smaller diameter than the first cylindrical portion 238 and having a hollow cylindrical shape coaxial with the first cylindrical portion 238. Since the second cylindrical portion 239 has a smaller diameter than the first cylindrical portion 238, a flow passage defined inside the second cylindrical portion 239 has a smaller sectional area than a flow passage of the first cylindrical portion 238. The first cylindrical portion 238 and the second cylindrical portion 239 each have an inner wall extending vertically.

A hydrofluoric acid inlet port 232 for introducing the dilute hydrofluoric acid into the casing 231 and an ozone water inlet port 233 for introducing the ozone water into the casing 231 are provided in a lower portion of the first cylindrical portion 238 of the casing 231. The positional relation of the hydrofluoric acid inlet port 232 and the ozone water inlet port 233 may be such that the hydrofluoric acid inlet port 232 is located above the ozone water inlet port 233, as shown in FIG. 14, or vice versa.

When the hydrofluoric acid valve 225 (see FIG. 8) and the ozone water valve 227 (see FIG. 8) are opened, the dilute hydrofluoric acid from the hydrofluoric acid pipe 223 is supplied into a mixing chamber 235 from the hydrofluoric acid inlet port 232, and the ozone water from the ozone water pipe 224 is supplied into the mixing chamber 235 from the ozone water inlet port 233. The dilute hydrofluoric acid and the ozone water supplied into the mixing chamber 235 are sufficiently mixed together in a lower portion of the mixing chamber 235 (with stirring). The dilute hydrofluoric acid and the ozone water are thus homogeneously mixed together to prepare the hydrofluoric acid/ozone mixture liquid (FOM). The outlet port 237 is provided at a distal end (lower end) of the second cylindrical portion 239 of the casing 231 for spouting the prepared FOM toward an external space 236. The FOM prepared in the mixing chamber 235 flows through the inside of the second cylindrical portion 239 to be spouted from the outlet port 237. With this simple construction, the FOM can be spouted from the FOM nozzle 206.

Since the dilute hydrofluoric acid and the ozone water are mixed together inside the FOM nozzle 206, the FOM can be spouted from the FOM nozzle 206 immediately after the mixing (immediately after the preparation thereof). Ozone dissolved in the hydrofluoric acid solution starts decomposition immediately after the dissolution. Since the FOM can be spouted from the FOM nozzle 206 immediately after the mixing (immediately after the preparation thereof), the FOM can be supplied to the substrate W in a state substantially free from the decomposition of ozone.

As shown in FIG. 8, the water supplying unit 208 includes a water nozzle 241. The water nozzle 241 is, for example, a straight nozzle which spouts the liquid in a continuous flow state, and is fixedly disposed above the spin chuck 205 with its outlet port directed toward the center portion of the upper surface of the substrate W. The water nozzle 241 is connected to a water pipe 242 to which water is supplied from a water supply source. A water valve 243 for switching on and off the supply of water from the water nozzle 241 is provided in the water pipe 242. When the water valve 243 is opened, the water supplied from the water pipe 242 to the water nozzle 241 in the continuous flow state is spouted from the outlet port provided at a lower end of the water nozzle 241. When the water valve 243 is closed, the supply of the water from the water pipe 242 to the water nozzle 241 is stopped. The water is, for example, deionized water (DIW). The water is not limited to the DIW, but may be carbonated water, electrolytic ion water, hydrogen water, ozone water or a hydrochloric acid aqueous solution having a dilute concentration (e.g., about 10 ppm to about 100 ppm).

The water nozzle 241 is not necessarily required to be disposed in fixed relation with respect to the spin chuck 205, but may be, for example, a so-called scan nozzle which is attached to an arm pivotal in a horizontal plane above the spin chuck 205 so that a water application position can be scanned over the upper surface of the substrate W by pivoting the arm.

The cleaning brush 210 is a cylindrical scrub member of a sponge made of, for example, PVA (polyvinyl alcohol). The cleaning brush 210 has a flat cleaning surface 210a on its lower surface. The cleaning surface 210a functions as a contact surface to be brought into contact with the upper surface of the substrate W.

The cleaning brush driving unit 211 includes a pivot arm 247 which retains the cleaning brush 210 at its distal end, and an arm driving unit 248 for driving the pivot arm 247. The arm driving unit 248 is configured to pivot the pivot arm 247 about a vertically extending pivot axis A2, and to move the pivot arm 247 vertically up and down. With this arrangement, the cleaning brush 210 can be horizontally moved between a position above the substrate W and a home position defined on a lateral side of the spin chuck 205 when the substrate W is held and rotated by the spin chuck 205.

Further, as shown in FIG. 15, a cleaning brush press-contact position at which the cleaning surface 210a of the cleaning brush 210 is kept in press contact with the upper surface of the substrate W can be moved (scanned) radially of the substrate W between the center portion of the substrate W (a position indicated by a solid line in FIG. 15) and the peripheral portion of the substrate W (a position indicated by a two-dot-and-dash line in FIG. 15).

In the scrub-cleaning, the water (e.g., purified water (deionized water)) may be supplied to the upper surface (back surface Wb) of the substrate W from the water nozzle 241, whereby foreign matter can be easily removed from the upper surface (back surface Wb) of the substrate W and foreign matter scrubbed off by the cleaning brush 210 can be expelled from the substrate W.

Figure 16:
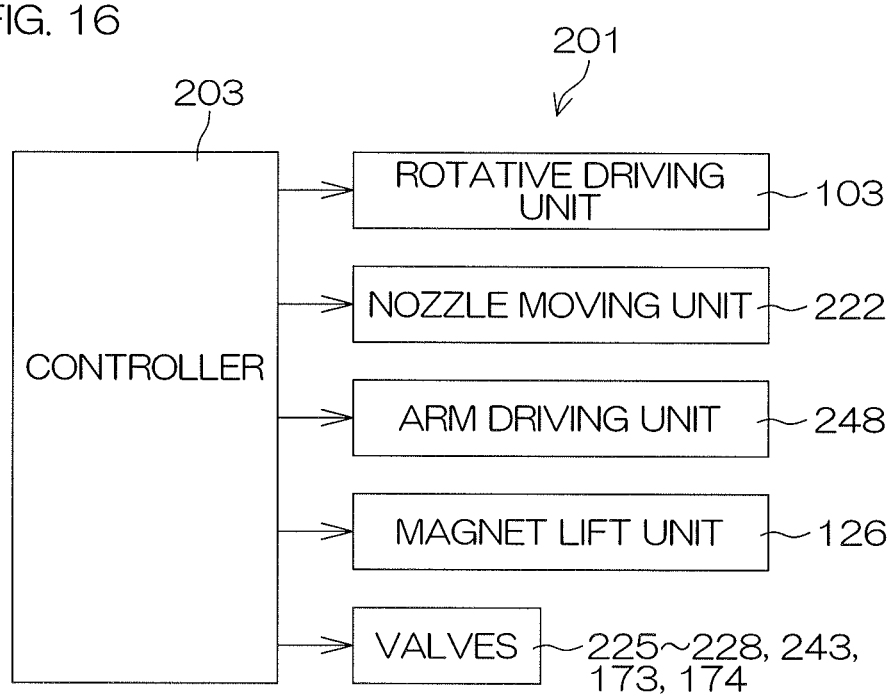
FIG. 16 is a block diagram for explaining the electrical configuration of major portions of the substrate processing apparatus.

FIG. 16 is a block diagram for explaining the electrical configuration of major portions of the substrate processing apparatus 201.

The controller 203 controls the operations of the rotative driving unit 103, the nozzle moving unit 222, the arm driving unit 248, the magnet lift unit 126 and the like according to a predetermined program. Further, the controller 203 controls the opening/closing operations and the like of the hydrofluoric acid valve 225, the hydrofluoric acid flow rate control valve 226, the ozone water valve 227, the ozone water flow rate control valve 228, the water valve 243, the inert gas valve 173, the inert gas flow rate control valve 174 and the like.

Figure 17:
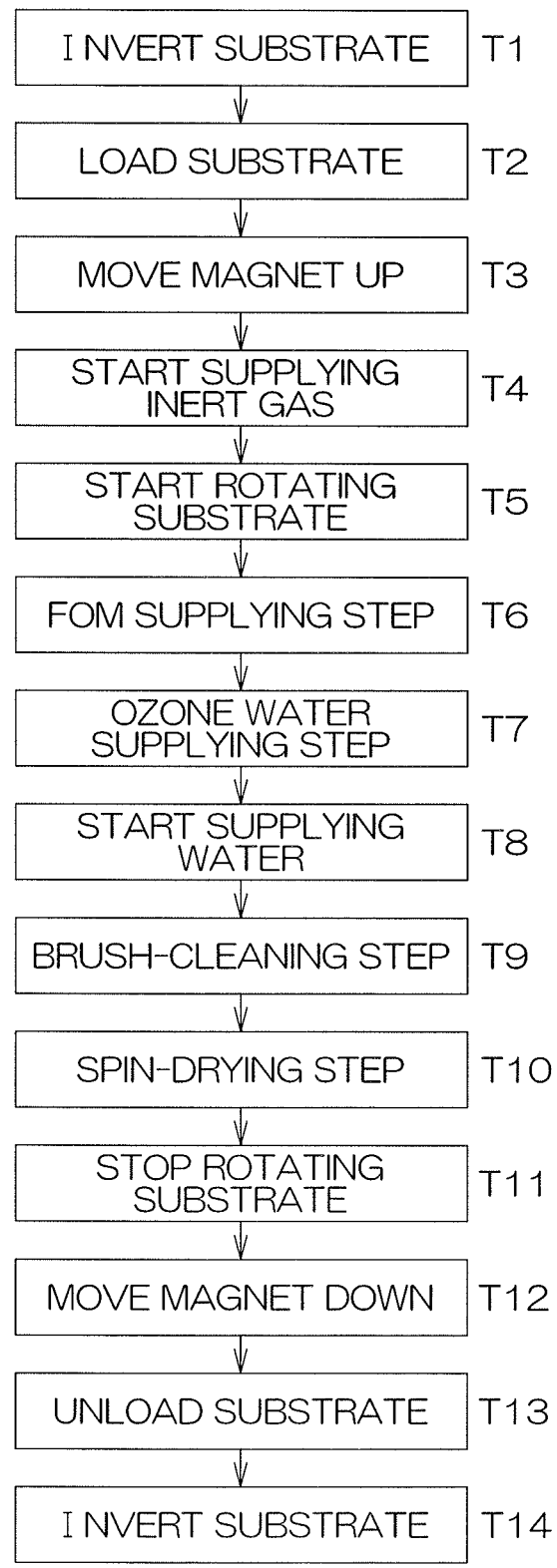
FIG. 17 is a flow diagram for explaining an exemplary cleaning process to be performed by the substrate processing apparatus.
Figure 18A:
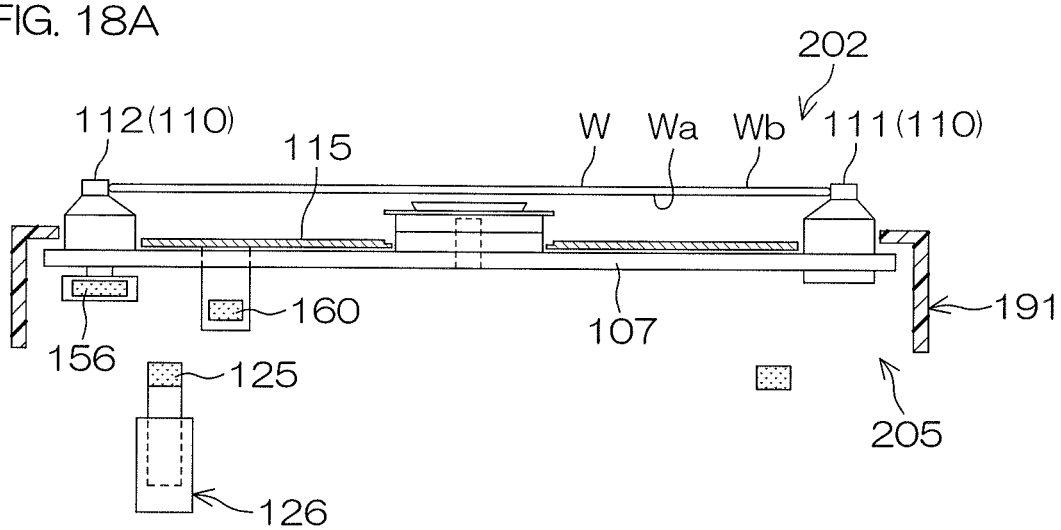
FIGS. 18A and 18B are schematic diagrams for explaining exemplary process steps of the cleaning process.

FIG. 17 is a flow diagram for explaining an exemplary cleaning process to be performed by the processing unit 202. FIGS. 18A to 18F are schematic diagrams for explaining the exemplary cleaning process. FIG. 19 is a sectional view showing the flows of the FOM and the inert gas on the peripheral portion of the substrate W.

In the following description, reference will be made to FIGS. 1, 8 to 13, and 17. Reference will also be made to FIGS. 18A to 18F and 19 as required. Where the substrate W has a diameter of 300 mm, for example, the peripheral portion of the back surface Wb of the substrate W is defined as an annular portion of the back surface Wb having a width of about 10 mm along the peripheral edge of the substrate W.

The substrate W be processed to be processed by the processing unit 202 is a substrate W processed by a pre-processing apparatus such as an annealing apparatus or a film forming apparatus (hereinafter sometimes referred to as "uncleaned substrate"). An example of the substrate W is a round silicon substrate. The substrate W may be a large substrate (e.g., a round substrate having an outer diameter of 300 mm). The processing unit 202 is a cleaning unit of a single substrate processing type for cleaning the back surface Wb (one major surface, non-device-formation surface) opposite from the front surface Wa (the other major surface, device formation surface) of the substrate W.

The back surface Wb of the substrate W to be loaded into the processing unit 202 is a bare silicon surface of a silicon substrate W. The surface be processed to be processed may contain at least one of polysilicon and amorphous silicon. In this embodiment, the back surface Wb of the substrate W has chuck marks formed by the pre-processing apparatus (e.g., chuck marks formed by an electrostatic chuck). The chuck marks include flaws such as chippings and dents formed in the back surface Wb of the substrate W, partial peelings of the back surface Wb, and the like. The chuck marks are formed in the entire back surface Wb of the substrate W. The processing unit 202 removes the chuck marks formed in the back surface Wb of the substrate W by the cleaning process. The cleaning process is not intended to perfectly remove the chuck marks from the back surface Wb of the substrate W, but is intended to remove most of the chuck marks (roughly remove the chuck marks) from the back surface Wb of the substrate W.

In this embodiment, the front surface Wa of the substrate W is formed with a metal layer M. The metal layer M contains at least one of Cu, TiN, W and Al. Since the front surface Wa of the substrate W is formed with the metal layer M, water cannot be supplied to the front surface Wa of the substrate W. This makes it impossible to protect the front surface Wa of the substrate W with a protection liquid such as water (to cover the front surface Wa of the substrate W with a cover rinse liquid) during a chemical liquid process in which the back surface Wb of the substrate W is processed with a chemical liquid (in an FOM supplying step (ozone-containing hydrofluoric acid solution spouting step) T6).

A carrier C containing an uncleaned substrate W is transported into the substrate processing apparatus 201 from the pre-processing apparatus, and placed on a load port LP. The substrate W is contained in the carrier C with its front surface Wa facing up. The controller 203 causes the indexer robot IR to transport the substrate W from the carrier C to the inversion unit TU with the front surface Wa of the substrate W facing up. Then, the controller 203 causes the inversion unit TU to invert the transported substrate W (T1: substrate inverting step). Thus, the back surface Wb of the substrate W faces up. Thereafter, the controller 203 causes the center robot CR to take out the substrate W from the inversion unit TU by the hand H2, and then load the substrate W into the processing unit 202 with the back surface Wb of the substrate W facing up (Step T2). The uncleaned substrate W loaded into the processing unit 202 is transferred to the spin chuck 205. Thus, as shown in FIG. 18A, the substrate W is placed on the spin chuck 205 with its front surface Wa facing down and with its back surface Wb facing up.

Prior to the loading of the substrate W, the FOM nozzle 206 is retracted to the home position defined on the lateral side of the spin chuck 205. The cleaning brush 210 is also retracted to the home position defined on the lateral side of the spin chuck 205. Further, the vertically movable permanent magnet 125 is located in the lower position. Since the vertically movable permanent magnet 125 is significantly spaced downwardly away from the turntable 107, smaller repulsive magnetic forces act between the vertically movable permanent magnet 125 and the protection disk permanent magnets 160. Therefore, the protection disk 115 is located in the lower position adjacent to the upper surface of the turntable 107. Thus, a space sufficient to receive the hand H2 of the center robot CR is provided between the upper surface of the protection disk 115 and the substrate holding height of the holder pins 110. Since the vertically movable permanent magnet 125 is significantly spaced downwardly away from the turntable 107, the pin driving permanent magnets 156 receive no attractive magnetic forces from the vertically movable permanent magnet 125. Thus, the movable pins 112 are each retained at the release position.

The hand H2 of the center robot CR holds the substrate W at a level higher than the upper ends of the holder pins 110 and, in this state, transports the substrate W to above the spin chuck 205. Thereafter, the hand H2 of the center robot CR is moved down toward the upper surface of the turntable 107. In this movement, the substrate W is transferred from the hand H2 of the center robot CR to the holder pins 110. The hand H2 of the center robot CR is moved down to the space defined between the front surface Wa (lower surface) of the substrate Wand the protection disk 115, and then retracted between the holder pins 110 to the lateral side of the spin chuck 205.

Subsequently, the controller 203 controls the magnet lift unit 126 to move the vertically movable permanent magnet 125 up to the upper position (Step T3). During the upward movement of the vertically movable permanent magnet 125 to the upper position, the vertically movable permanent magnet 125 approaches the protection disk permanent magnets 160 from the lower side, whereby distances between the permanent magnets 125 and 160 are reduced and the repulsive magnetic forces acting between the permanent magnets 125 and 160 are correspondingly increased. The repulsive magnetic forces levitate the protection disk 115 from the upper surface of the turntable 107 toward the substrate W. Before the vertically movable permanent magnet 125 reaches the upper position, the protection disk 115 is moved to the adjacent position located in slightly spaced adjacent relation to the front surface Wa (lower surface) of the substrate W, and the flanges 120 provided at the lower ends of the guide shafts 117 are respectively brought into abutment against the linear bearings 118. Thus, the protection disk 115 is retained in the adjacent position, and the movable pins 112 are each driven from the release position to the holding position and retained at the holding position. In this manner, the substrate W is clamped by the immovable pins 111 and the movable pins 112 (substrate holding step).

Figure 18B:
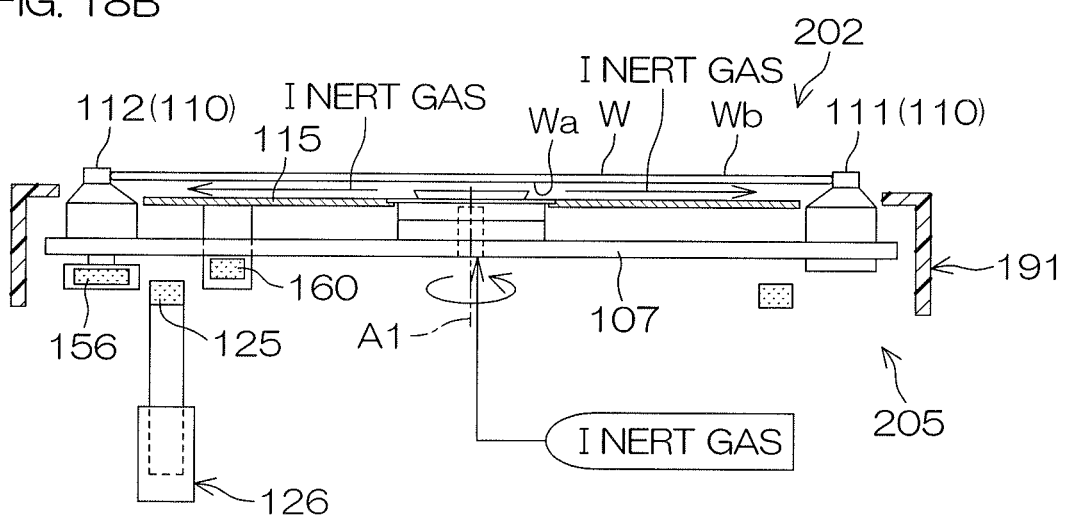
Figure 19:
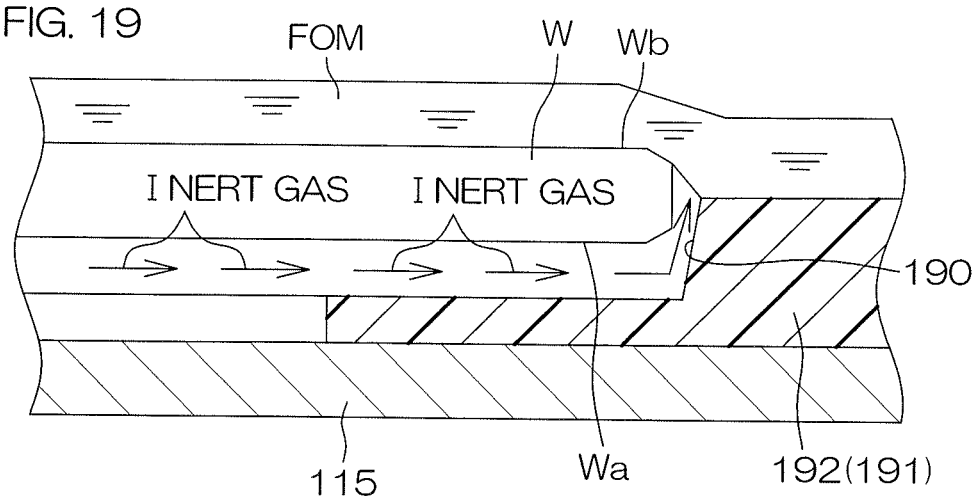
FIG. 19 is a sectional view showing the flows of FOM and an inert gas on a peripheral portion of a substrate.

In this state, the controller 203 opens the inert gas valve 173 to start supplying the inert gas as shown in FIG. 18B (T4: protection gas supplying step). The supplied inert gas is spouted from the upper end of the inert gas supply pipe 170, and is ejected radially about the rotation axis A1 toward the narrow space between the protection disk 115 located in the adjacent position and the front surface Wa (lower surface) of the substrate W by the function of the stream regulating member 186 and the like. As shown in FIG. 19, the inert gas is further accelerated by orifices defined between the outer periphery of the substrate W and the throttling portions 190 (a first step 190a and a second step 190b) formed on the annular plate portion 192 of the cover 191 disposed around the protection disk 115 to thereby form high-speed ejection streams flowing laterally of the substrate W. In this embodiment, the spouting flow rate of the inert gas to be spouted from the upper end of the inert gas supply pipe 170 is set at a higher level (e.g., 180 L/min).

Figure 18C:
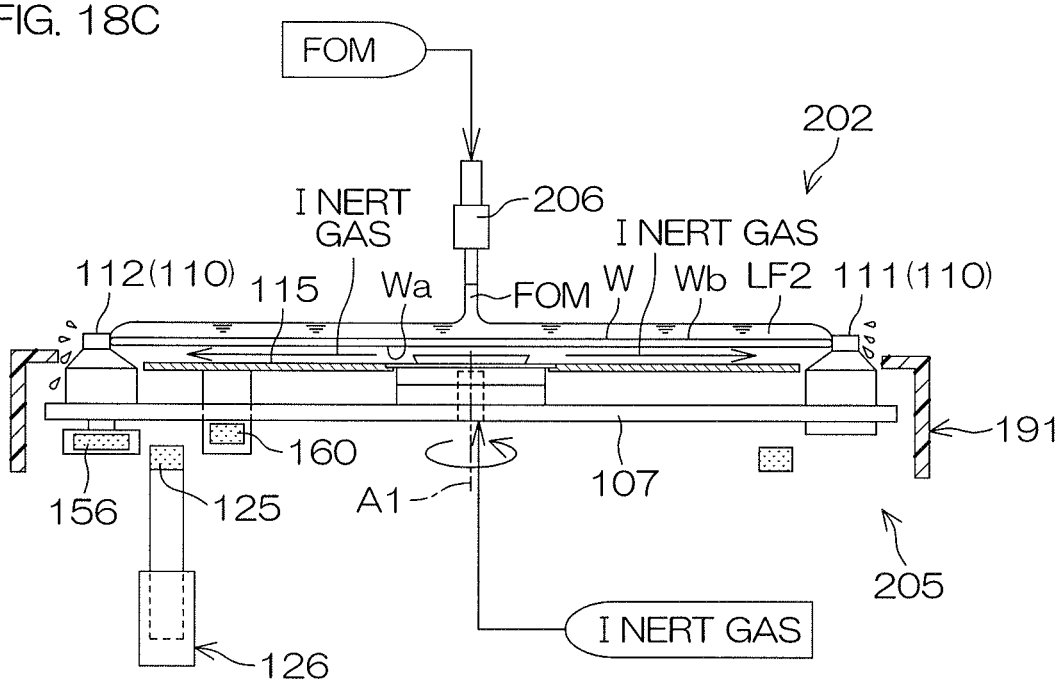
FIGS. 18C and 18D are schematic diagrams for explaining process steps following the step of FIG. 18B.

Thereafter, the controller 203 controls the rotative driving unit 103 to start rotating the turntable 107, whereby the substrate W is rotated about the rotation axis A1 as shown in FIG. 18C (Step T5). The rotation speed of the substrate W is increased to a predetermined liquid processing speed (in a range of 300 to 1500 rpm, e.g., 500 rpm), and maintained at the liquid processing speed.

When the rotation speed of the substrate W reaches the liquid processing speed, the controller 203 performs the FOM supplying step (Step T6) of supplying the FOM to the back surface Wb of the substrate W. In the FOM supplying step (T6), the controller 203 controls the nozzle moving unit 222 to move the FOM nozzle 206 from the home position to the center position. Thus, the FOM nozzle 206 is located above the center portion of the substrate W. After the FOM nozzle 206 is located above the substrate W, the controller 203 simultaneously opens the hydrofluoric acid valve 225 and the ozone water valve 227. Thus, the dilute hydrofluoric acid flowing through the hydrofluoric acid pipe 223 is supplied to the FOM nozzle 206, and the ozone water flowing through the ozone water pipe 224 is supplied to the FOM nozzle 206. Then, the dilute hydrofluoric acid and the ozone water are mixed together in the casing of the FOM nozzle 206, whereby the FOM is prepared. As shown in FIG. 18C, the FOM is spouted from the outlet port of the FOM nozzle 206 to be thereby applied to the center portion of the back surface Wb of the substrate W. The FOM supplied to the center portion of the back surface Wb of the substrate W receives a centrifugal force generated by the rotation of the substrate W to spread radially toward the peripheral portion of the back surface Wb of the substrate W. Thus, the FOM can be distributed over the entire back surface Wb of the substrate W. In other words, hydrofluoric acid and ozone can be distributed over the entire back surface Wb of the substrate W. As a result, as shown in FIG. 18C, a liquid film LF2 of the FOM covering the entire back surface Wb of the substrate W is formed on the substrate W.

When the FOM is supplied to the back surface Wb of the substrate W, a silicon oxide film is formed in the back surface Wb of the substrate (silicon substrate) W by the oxidizing action of ozone contained in the FOM. Further, the silicon oxide film formed in the back surface Wb of the substrate W is peeled off (lifted off) from the back surface Wb by the oxide film etching action of hydrofluoric acid contained in the FOM. Thus, flaws (chippings, dents, and the like) formed in the back surface Wb of the substrate W are removed. In addition, foreign matter (particles, impurities, peelings of the back surface Wb of the substrate W, and the like) is removed from the back surface Wb of the substrate W. That is, the back surface Wb of the substrate W can be cleaned.

Where the FOM is used as the cleaning chemical liquid, the silicon oxide film can be formed in a greater amount in the back surface Wb of the substrate W as compared with a case in which SC1 is used as the cleaning chemical liquid. Therefore, the FOM has a higher etching capability (foreign matter removing capability). In addition, the ozone water contained in the FOM reduces the running costs as compared with hydrogen peroxide contained in the SC1. This reduces the costs for the cleaning process.

In the FOM supplying step (T6), the front surface Wa of the substrate W is protected with the inert gas (protection gas). Since the spouting flow rate of the inert gas to be spouted from the inert gas supply pipe 170 is set at a higher level, as described above, the FOM supplied at a lower flow rate from the FOM nozzle 206 to the back surface Wb of the substrate W is prevented from flowing around to the front surface Wa of the substrate W.

If the FOM is supplied at a higher supply flow rate in the FOM supplying step (T6), however, the FOM is liable to flow around to the front surface Wa of the substrate W against the gas flow formed on the front surface Wa of the substrate W. Therefore, the supply flow rate of the FOM to be supplied in the FOM supplying step (T6) is limited.

The supply flow rate of the FOM to be supplied in the FOM supplying step (T6) is preferably not lower than 0.5 L/min and not higher than 1.0 L/min. In this case, the FOM is prevented from flowing around to the front surface Wa of the substrate W. The supply flow rate is further preferably not higher than 0.8 L/min. In this case, the FOM is more reliably prevented from flowing around to the front surface Wa of the substrate W.

The FOM to be spouted from the FOM nozzle 206 preferably has a hydrofluoric acid concentration of not lower than 0.01 wt. % and not higher than 0.5 wt. %, more preferably not lower than 0.093 wt. % and not higher than 0.221 wt. %.

The FOM to be spouted from the FOM nozzle 206 has an ozone concentration of not lower than 22.5 ppm and not higher than 67.2 ppm, more preferably not lower than 22.5 ppm and not higher than 42.0 ppm. An FOM having an ozone concentration of higher than 42.0 ppm contains a greater number of bubbles and, therefore, is not suitable for the substrate processing. If the ozone concentration of the FOM is higher than 42.0 ppm, ozone is liable to penetrate through the wall of the ozone water pipe 224 (made of PFA) to appear on the ozone water pipe 224. As the ozone concentration increases, the toxicity of ozone is increased. Therefore, the FOM having an ozone concentration of higher than 42.0 ppm when being spouted is not preferred in terms of safety.

Where the back surface Wb of the substrate W is processed with a chemical liquid containing hydrofluoric acid having a hydrophobizing action, the back surface Wb of the substrate W is liable to be hydrophobized by the action of hydrofluoric acid contained in the chemical liquid. More specifically, ozone dissolved in the dilute hydrofluoric acid starts decomposition immediately after the dissolution. Therefore, where the FOM is spouted toward the center portion of the back surface Wb of the substrate W during the rotation of the substrate W, there is a possibility that ozone does not reach the peripheral portion of the back surface Wb of the substrate W in the FOM supplying step (T6) depending on the spouting flow rate of the FOM and/or the ozone concentration of the FOM. In this case, the peripheral portion of the back surface Wb of the substrate W is liable to be hydrophobized by hydrofluoric acid reaching the peripheral portion of the back surface Wb of the substrate W. Particularly, where the FOM to be supplied to the back surface Wb of the substrate W has a higher hydrofluoric acid concentration, only hydrofluoric acid reaches the peripheral portion of the back surface Wb of the substrate W and, therefore, the peripheral portion of the back surface Wb of the substrate W is more liable to exhibit hydrophobicity.

In this embodiment, particularly, the front surface Wa of the substrate W is protected with the protection gas, but not with the protection liquid. Therefore, the supply flow rate of the FOM to be supplied in the FOM supplying step (T6) is limited (has an upper limit) so as to prevent the FOM from flowing around to the front surface Wa of the substrate W. With the supply flow rate of the FOM thus limited, the peripheral portion of the back surface Wb of the substrate W is more liable to exhibit hydrophobicity at the end of the FOM supplying step (T6).

If the back surface Wb of the substrate W is scrubbed with the cleaning brush 210 with the peripheral portion thereof in a hydrophobic state, the foreign matter is liable to adhere again to the peripheral portion of the back surface Wb of the substrate W via the cleaning brush 210. Therefore, a so-called peripheral mode occurs in which particles are annularly present on the peripheral portion of the back surface Wb of the substrate W after the cleaning process.

After a lapse of a predetermined FOM process period from the start of the spouting of the FOM, the FOM supplying step (T6) ends. After the end of the FOM supplying step (T6), an ozone water supplying step (Step T7) of supplying the ozone water to the substrate W is performed.

Figure 18D:
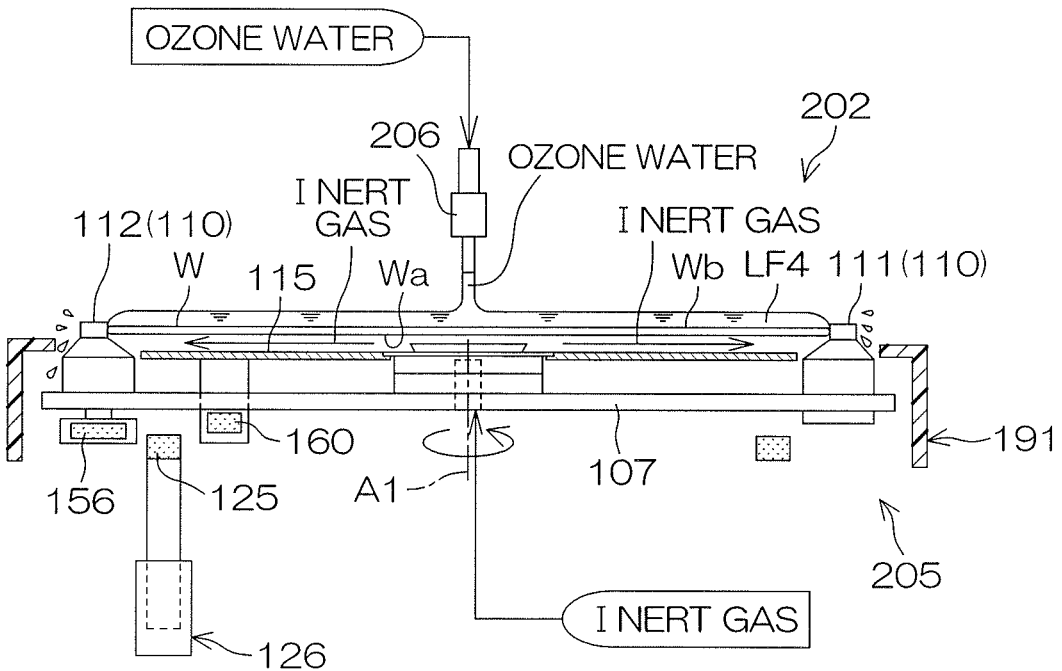

More specifically, the controller 203 closes only the hydrofluoric acid valve 225 with the ozone water valve 227 kept open while the FOM nozzle 206 is located above the center portion of the back surface Wb of the substrate W. Thus, only the ozone water is supplied to the FOM nozzle 206. As shown in FIG. 18D, the ozone water supplied to the FOM nozzle 206 flows through the casing of the FOM nozzle 206 to be spouted from the outlet port 237 (see FIG. 14) of the FOM nozzle 206. The ozone water is applied to the center portion of the back surface Wb of the substrate W being rotated at the liquid processing speed. That is, the processing liquid spouted from the FOM nozzle 206 to the center portion of the back surface Wb of the substrate W is changed from the FOM to the ozone water (center portion ozone water spouting step).

The ozone water applied to the center portion of the back surface Wb of the substrate W flows outward toward the peripheral edge of the substrate W on the substrate W. The FOM on the substrate W is replaced with the ozone water and, finally, the entire back surface Wb of the substrate W is covered with a liquid film LF4 of the ozone water. Thus, the ozone water is supplied to the entire back surface Wb of the substrate W, which is thereby hydrophilized. Even if the peripheral portion of the back surface Wb of the substrate W is hydrophobized in the FOM supplying step (T6), the hydrophobized area (peripheral portion) can be hydrophilized.

The ozone water to be supplied to the back surface Wb of the substrate W in the ozone water supplying step (T7) has an ozone concentration of not lower than 50 ppm. Therefore, the entire back surface Wb of the substrate W can be properly hydrophilized. Further, the spouting flow rate of the ozone water to be spouted in the ozone water supplying step (T7) is preferably as high as possible, but is desirably not higher than 0.8 L/min in order to prevent the ozone water from flowing around to the front surface Wa.

As described above, the peripheral portion of the back surface Wb of the substrate W is liable to be hydrophobic at the end of the FOM supplying step (T6). However, the hydrophobic peripheral portion of the back surface Wb of the substrate W can be hydrophilized by entirely hydrophilizing the back surface Wb of the substrate W.

After a lapse of a predetermined ozone water supply period from the start of the spouting of the ozone water from the FOM nozzle 206, the controller 203 closes the ozone water valve 227 to stop spouting the ozone water from the FOM nozzle 206. The ozone water supply period is preferably not shorter than 5 seconds. In this case, the entire back surface Wb of the substrate W (including the peripheral portion) can be properly hydrophilized. The controller 203 moves the FOM nozzle 206 from the center position to the home position. Thus, the FOM nozzle 206 is retracted from above the substrate W.

After the end of the ozone water supplying step (T7), the supply of water as a rinse liquid to the back surface Wb of the substrate W is started (Step T8).

Figure 18E:
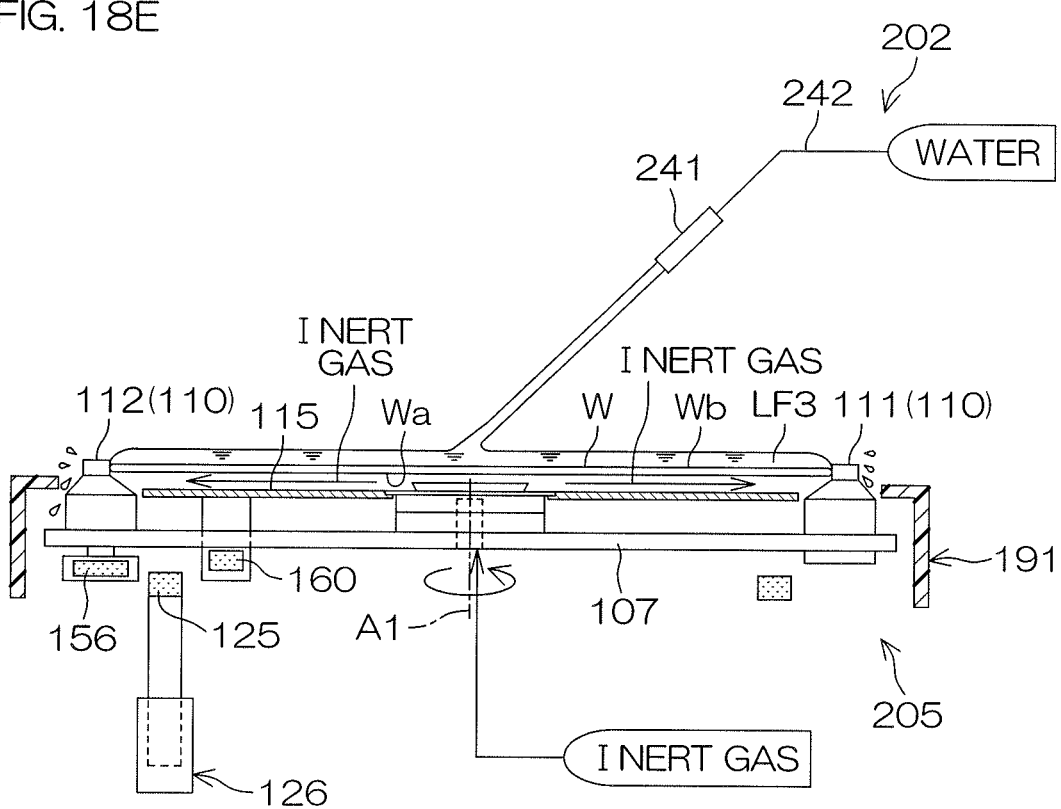
FIGS. 18E and 18F are schematic diagrams for explaining process steps following the step of FIG. 18D.

More specifically, as shown in FIG. 18E, the controller 203 opens the water valve 243 to spout water from the water nozzle 241 toward the center portion of the back surface Wb of the substrate W. The water spouted from the water nozzle 241 is applied to the center portion of the back surface Wb of the substrate W covered with the ozone water. The water applied to the center portion of the back surface Wb of the substrate W receives a centrifugal force generated by the rotation of the substrate W to flow toward the peripheral portion of the substrate Won the back surface Wb of the substrate W, thereby spreading over the entire back surface Wb of the substrate W. Therefore, the ozone water on the substrate W is forced to flow outward by the applied water to be expelled around the substrate W. Thus, the liquid film LF4 of the ozone water on the substrate W is replaced with a liquid film LF3 of the water covering the entire back surface Wb of the substrate W.

Figure 18F:
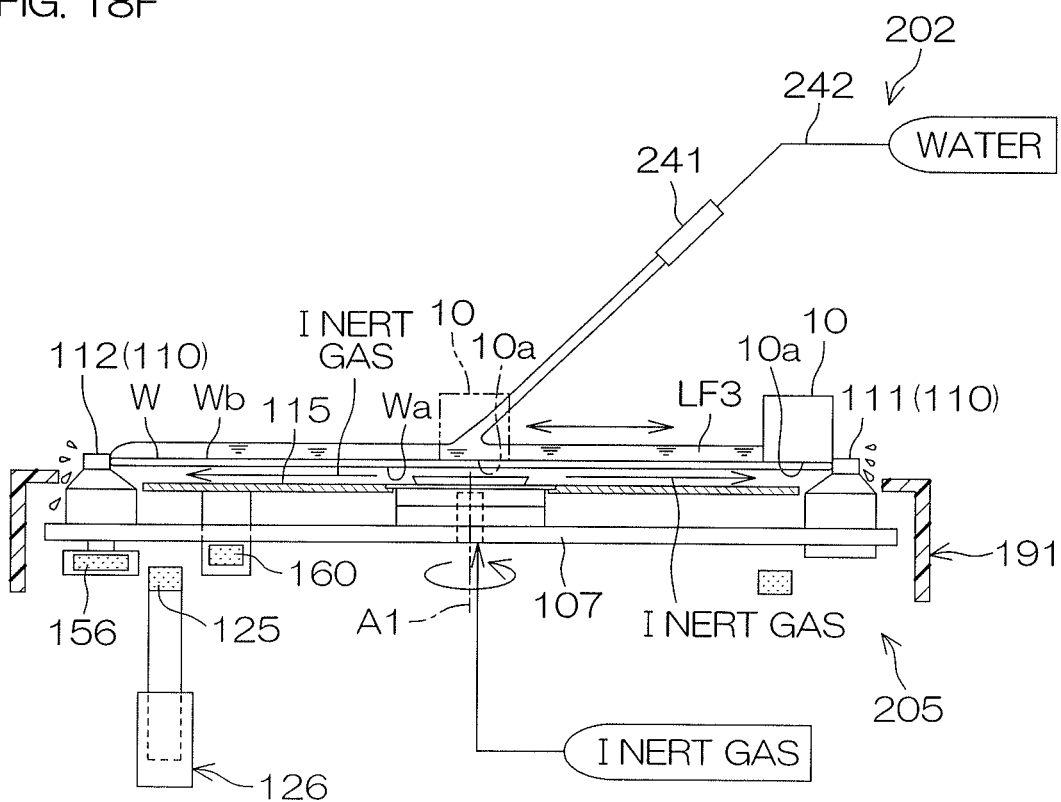

After a lapse of a predetermined period (sufficient to replace the liquid film LF4 of the ozone water on the substrate W with the liquid film LF3 of the water) from the start of the spouting of the water from the water nozzle 241, the controller 203 controls the arm driving unit 248 to scrub-clean the back surface Wb of the substrate W with the cleaning brush 210 as shown in FIG. 18F (T9: brush-cleaning step). Thus, the back surface Wb of the substrate W is scrub-cleaned with the cleaning brush 210 while the water is supplied to the back surface Wb of the substrate W. More specifically, the controller 203 controls the arm driving unit 248 to pivot the pivot arm 247 about the pivot axis A2 to move the cleaning brush 210 from the home position to above the substrate W and move the cleaning brush 210 downward to bring the cleaning surface 210a of the cleaning brush 210 into press contact with the back surface Wb of the substrate W. Then, the controller 203 controls the arm driving unit 248 to move (scan) the cleaning brush press-contact position between the center portion of the substrate W (the position indicated by the solid line in FIG. 15) and the peripheral portion of the substrate W (the position indicated by the two-dot-and-dash line in FIG. 15). Thus, the cleaning brush press-contact position is scanned over the entire back surface Wb of the substrate W, whereby the entire back surface Wb of the substrate W is scrubbed with the cleaning brush 210. The reciprocal movement of the cleaning brush 210 between the center portion and the peripheral portion of the substrate W requires, for example, 6.5 seconds. In the brush-cleaning step (T9), the foreign matter peeled off in the FOM supplying step (T6) is scrubbed off by the cleaning brush 210. The foreign matter scrubbed off by the cleaning brush 210 is washed away with the water. Thus, the peeled foreign matter is removed from the back surface Wb of the substrate W.

In the rinsing step (T8 and T9), the spouting flow rate of the water to be supplied to the back surface Wb of the substrate W is preferably as high as possible, but is desirably, for example, not higher than 0.8 L/min in order to prevent the water from flowing around to the front surface Wa.

In this embodiment, the scan width of the pivot arm 247 is set so that the substrate W can be cleaned up to very close to the peripheral edge of the substrate W with the cleaning brush 210.

Incidentally, if the back surface Wb of the substrate W is scrubbed with the cleaning brush 210 in a hydrophobic state, the foreign matter scrubbed off by the cleaning brush 210 is liable to be transferred to the hydrophobic back surface Wb to adhere to the back surface Wb. That is, the foreign matter is liable to adhere again to the back surface Wb of the substrate W via the cleaning brush 210.

In this embodiment, however, the ozone water supplying step (T7) is performed prior to the brush-cleaning step (T9).

Therefore, the entire back surface Wb of the substrate W is kept hydrophilic at the start of the brush-cleaning step (T9), so that the foreign matter is prevented from adhering again to the back surface Wb of the substrate W via the cleaning brush 210 in the FOM supplying step (T6).

In the brush-cleaning step (T9), therefore, the brush-cleaning (scrub-cleaning) process can be performed on the back surface Wb of the substrate W while the re-adhesion of the foreign matter to the back surface Wb of the substrate W is prevented or suppressed.

After the cleaning brush 210 is reciprocated a predetermined number of times (e.g., four times), the controller 203 controls the arm driving unit 248 to return the cleaning brush 210 from above the spin chuck 205 to the home position. Further, the controller 203 closes the water valve 243 to stop spouting the water from the water nozzle 241. The controller 203 closes the inert gas valve 173 to stop spouting the protection gas (inert gas) from the inert gas supply pipe 170. Thus, the brush-cleaning step (T9) ends.

By thus performing the process sequence from the FOM supplying step (T6) to the brush-cleaning step (T9), most of the chuck marks can be removed from the entire back surface Wb of the substrate W. This improves the yield in a subsequent process (e.g., an exposure process) to be performed after the cleaning process sequence.

Subsequently, a spin-drying step (Step 110) of drying the substrate W is performed. More specifically, the controller 203 controls the rotative driving unit 103 to accelerate the substrate W to a drying rotation speed (e.g., several thousands rpm) higher than the rotation speed employed in the process sequence from the FOM supplying step (T6) to the brush-cleaning step (T9) and rotate the substrate W at the drying rotation speed. Thus, a greater centrifugal force is exerted on the liquid present on the substrate W, whereby the liquid adhering to the substrate W is spun off around the substrate W. Thus, the liquid is removed from the substrate W to dry the substrate W.

If the spin-drying step is performed on the substrate W with the processing surface of the substrate W (i.e., the back surface Wb of the substrate W) in a hydrophobic state, for example, the water is liable to move in the form of water droplets on the processing surface in the spin-drying step, resulting in a substrate processing failure.

In this embodiment, in contrast, the ozone water supplying step (T7) is performed after the FOM supplying step (T6), so that the spin-drying step (T10) is performed on the substrate W with the back surface Wb of the substrate W kept hydrophilic. Thus, the substrate processing failure can be suppressed or prevented in the spin-drying step (T10).

After a lapse of a predetermined period from the start of the high-speed rotation of the substrate W, the controller 203 controls the rotative driving unit 103 to stop the rotation of the substrate W by the spin chuck 205 (Step T11).

Then, the controller 203 controls the magnet lift unit 126 to move the vertically movable permanent magnet 125 down to the lower position (Step T12). Thus, the distances between the vertically movable permanent magnet 125 and the protection disk permanent magnets 160 are increased to reduce the magnetic repulsive forces occurring therebetween. Correspondingly, the protection disk 115 is moved down toward the upper surface of the turntable 107. Thus, the space sufficient to receive the hand H2 of the center robot CR is provided between the upper surface of the protection disk 115 and the front surface Wa (lower surface) of the substrate W. On the other hand, the vertically movable permanent magnet 125 is brought out of the opposed relation to the pin driving permanent magnets 156, so that the external forces biasing the movable pins 112 to the holding positions are lost. Therefore, the movable pins 112 respectively receive the resilient pressing forces from the resilient pressing members (not shown) to be biased to the release positions. Thus, the substrate W is unclamped.

Then, the substrate W is unloaded from the processing chamber 204 (Step T13). More specifically, the controller 203 controls the center robot CR to insert the hand H2 into the space defined between the protection disk 115 and front surface Wa (lower surface) of the substrate W with all the nozzles and the like retracted from above the spin chuck 205. In turn, the hand H2 lifts the substrate W held by the holder pins 110, and then is retracted to the lateral side of the spin chuck 205. Thus, the substrate W subjected to the cleaning process is unloaded from the processing chamber 204.

More specifically, the controller 203 causes the center robot CR to insert the hand into the inside of the processing chamber 204 with all the nozzles and the like retracted from above the spin chuck 205. Clamping members 218 are each switched from a clamping attitude to an unclamping attitude. Thus, the substrate W can be released from the spin chuck 205. Then, the controller 203 causes the hand of the center robot CR to hold the substrate W on the spin chuck 205. Thereafter, the controller 203 causes the center robot CR to retract the hand H2 from the inside of the processing chamber 204. Thus, the substrate W subjected to the cleaning process is unloaded from the processing chamber 204. The controller 203 causes the hand H2 of the center robot CR to transport the cleaned substrate W to the inversion unit TU. Then, the controller 203 causes the inversion unit TU to invert the transported substrate W (Step T14). Thus, the front surface Wa of the substrate W faces up. Thereafter, the controller 203 causes the hand H1 of the indexer robot IR to take out the substrate W from the inversion unit TU and place the cleaned substrate W in the carrier C with the front surface Wa of the substrate W facing up. The carrier C containing the cleaned substrate W is transported from the substrate processing apparatus 201 to a post-processing apparatus such as an exposure apparatus.

In this embodiment, as described above, the ozone water supplying step (T7) of supplying the ozone water to the back surface Wb of the substrate W is performed before the start of the brush-cleaning step (T9) after the FOM supplying step (T6).

In the FOM supplying step (T6), the FOM is supplied to the back surface Wb of the substrate W, whereby the silicon oxide film is formed in the back surface Wb of the substrate W (silicon substrate) by the oxidizing action of ozone contained in the FOM. Further, the silicon oxide film formed in the back surface Wb of the substrate W is peeled off (lifted off) from the back surface Wb by the oxide film etching action of hydrofluoric acid contained in the FOM. Thus, the foreign matter (particles, impurities, peelings of the back surface Wb of the substrate W, and the like) is removed from the back surface Wb of the substrate W, and the flaws (chippings, dents, and the like) formed in the back surface Wb of the substrate W are removed. Since ozone having a strong oxidative power is used, the oxide film can be formed in a greater amount in the back surface Wb of the substrate W. Therefore, the greater amount of oxide film can be removed from the back surface Wb of the substrate W. Thus, the foreign matter and/or the flaws can be efficiently removed from the back surface Wb of the substrate W.

Further, the ozone water supplying step (T7) of supplying the ozone water to the back surface Wb of the substrate W is performed before the start of the brush-cleaning step (T9).

Even if the peripheral portion of the back surface Wb of the substrate W is hydrophobic at the end of the FOM supplying step (T6), therefore, the hydrophobic area can be hydrophilized by preforming the ozone water supplying step (T7) after the FOM supplying step (T6). Therefore, the entire back surface Wb of the substrate W is hydrophilic at the start of the brush-cleaning step (T9), so that the brush-cleaning step (T9) can be performed on the entirely hydrophilic back surface Wb of the substrate W. This prevents the foreign matter from adhering again to the back surface Wb of the substrate W via the cleaning brush 210 in the brush-cleaning step (T9).

Where ozone is not distributed to the peripheral portion of the back surface Wb of the substrate W in the FOM supplying step (T6), the cleaning efficiency (cleaning rate) of the peripheral portion of the back surface Wb of the substrate W is liable to be reduced. The ozone water supplying step (T7) functions to oxidize the once hydrophobized area by the supply of the ozone water to hydrophilize this area. However, the FOM is not supplied, so that the process s does not proceed on the back surface Wb of the substrate W. Therefore, the peripheral portion of the back surface Wb of the substrate W is liable to be partly left uncleaned in this cleaning process sequence.

However, as described above, this cleaning process is intended to remove most of the chuck marks (roughly remove the chuck marks) from the back surface Wb of the substrate W. There is no particular problem even if the peripheral portion of the back surface Wb of the substrate W is partly left uncleaned.

The ozone water to be supplied to the back surface Wb of the substrate W in the ozone water supplying step (T7) has an ozone concentration of not lower than 50 ppm. Therefore, the entire back surface Wb of the substrate W can be properly hydrophilized. Thus, the brush-cleaning step (T9) can be performed with the entire back surface Wb of the substrate W hydrophilized.

Further, the FOM supplying step (T6) and the brush-cleaning step (T9) are not performed in parallel, but the scrub cleaning with the cleaning brush is performed after the FOM supplied to the substrate W is replaced with water. This prevents the cleaning brush 210 from being corroded by hydrofluoric acid and ozone contained in the FOM. Thus, the service life of the cleaning brush 210 can be prolonged.

It is also conceivable to supply the ozone water to the back surface Wb of the substrate W before the FOM supplying step (T6) rather than after the FOM supplying step (T6). In this case, however, it is difficult to maintain the hydrofluoric acid concentration and the ozone concentration of the FOM supplied onto the back surface Wb of the substrate W at the predetermined concentration levels because of the presence of the ozone water on the back surface Wb of the substrate W at the start of the FOM supplying step (T6). That is, it is difficult to properly balance the hydrofluoric acid concentration and the ozone concentration of the FOM supplied onto the back surface Wb of the substrate W.

<First Cleaning Test>

Next, a first cleaning test will be described. In the first cleaning test, the cleaning process was performed on a total of eleven samples according to Examples 1 and 2 and Comparative Example.

Example 1

Figure 20:
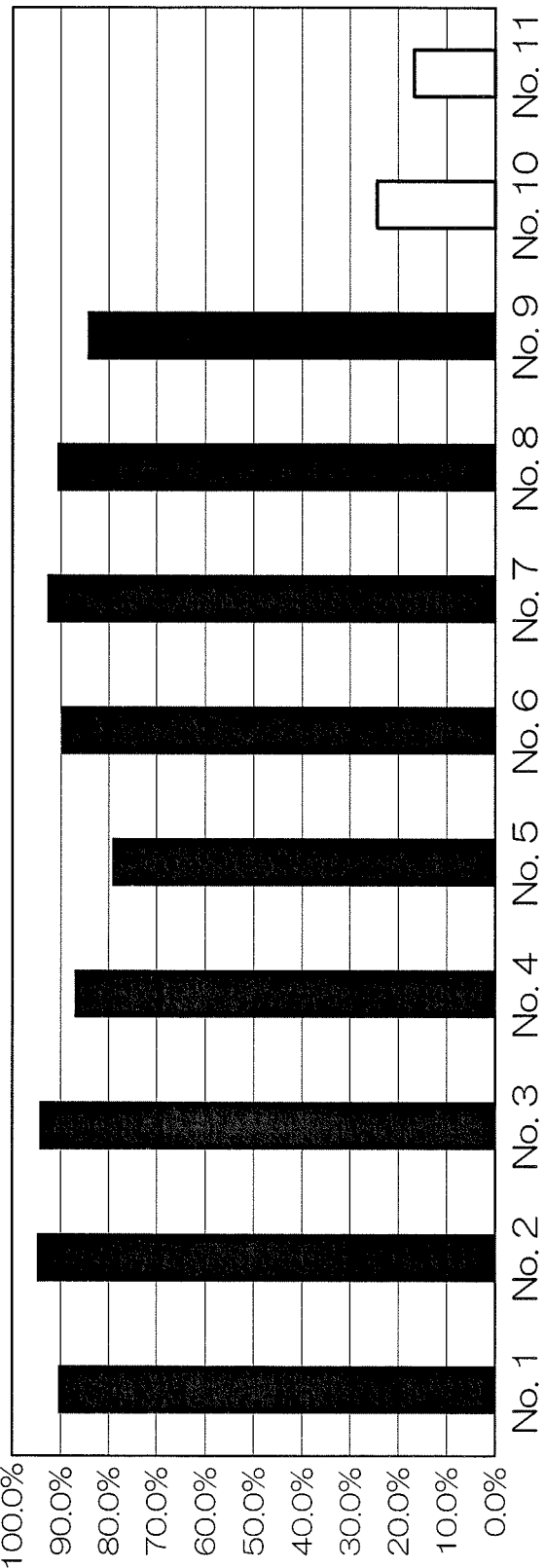
FIG. 20 is a graph showing test results of a first cleaning test.

Bare silicon wafers W (having a diameter of 300 mm) each having chuck marks formed in a processing surface (non-device-formation surface) thereof by an electrostatic chuck were employed as samples. The FOM was supplied as the cleaning chemical liquid to the processing surface. In Example 1, the cleaning process was performed on the processing surface of each of the wafers W in the same manner as shown in FIG. 17. At this time, the FOM supplied to the processing surface in the FOM supplying step (T6) had a hydrofluoric acid concentration of 0.093 wt. % and an ozone concentration of 22.5 ppm, and the supply flow rate of the FOM was 0.5 L/min. Further, the ozone water supplied to the processing surface in the ozone water supplying step (T7) had an ozone concentration of 50 ppm, and the supply flow rate of the ozone water was 0.8 L/min. In FIG. 20 to be described later, sample Nos. 1 to 3 were processed according to Example 1.

Example 2

Bare silicon wafers W (having a diameter of 300 mm) each having chuck marks formed in a processing surface (non-device-formation surface) thereof by an electrostatic chuck were employed as samples. The FOM was supplied as the cleaning chemical liquid to the processing surface. In Example 2, the cleaning process was performed on each of the wafers W in substantially the same manner as in the second embodiment shown in FIG. 17 but excluding Step T7. At this time, the FOM supplied to the processing surface in the FOM supplying step (T6) had a hydrofluoric acid concentration of 0.093 wt. % and an ozone concentration of 50 ppm, and the supply flow rate of the FOM was 0.5 L/min. In FIG. 20 to be described later, sample Nos. 4 to 9 were processed according to Example 2.

Comparative Example

Bare silicon wafers W (having a diameter of 300 mm) each having chuck marks formed in a processing surface (non-device-formation surface) thereof by an electrostatic chuck were employed as samples. SC1 was supplied as the cleaning chemical liquid to the processing surface. In Comparative Example, the cleaning process was performed on each of the wafers W in substantially the same manner as in the second embodiment shown in FIG. 17, except that Step T7 was excluded and SC1 was used instead of the FOM as the cleaning chemical liquid. In FIG. 20 to be described later, sample Nos. 10 and 11 were processed according to Comparative Example.

The particle removal efficiencies of the cleaning process on sample Nos. 1 to 11 were determined. The particle removal efficiencies were each determined by dividing the number of particles removed from the processing surface of the wafer W by the cleaning process by the number of particles present on the processing surface before the cleaning process. The results are shown in FIG. 20.

FIG. 20 indicates that Examples employing the FOM as the cleaning chemical liquid are significantly improved in the particle removal efficiency of the cleaning process as compared with Comparative Example employing the SC1 as the cleaning chemical liquid.

<Second Cleaning Test>

Next, a second cleaning test will be described. The second cleaning test is intended to study the dependence of the particle removal efficiency (cleaning capability) on the flow rate of the FOM to be supplied to a wafer W. In the second cleaning test, amorphous silicon wafers (having a diameter of 300 mm) were used as samples. In the second cleaning test, the cleaning process was performed on each of the wafers W in substantially the same manner as in the second embodiment shown in FIG. 17 but excluding Step T7. At this time, the FOM to be supplied to the processing surface in the FOM supplying step (T6) was prepared by mixing dilute hydrofluoric acid having a hydrofluoric acid concentration of 0.559 wt. % (a hydrofluoric acid/water volume ratio of 1:100) and 30-ppm ozone water in a ratio of 1:3. At this time, the FOM had a hydrofluoric acid concentration of 0.140 wt. %, and an ozone concentration of 22.5 ppm.

The FOM was supplied to the processing surfaces of the respective wafers in the FOM supplying step (T6) at different supply flow rates, i.e., 0.4 LPM (L/min), 0.8 LPM, 1.0 LPM, 1.1 LPM, 1.3 LPM, 1.5 LPM and 2.0 LPM.

Then, particle removal efficiencies for removal of particles having a particle size of not less than 80 nm and removal of particles having a particle size of not less than 0.5 μm after the cleaning of the respective wafers W were determined. The particle removal efficiencies were each determined by dividing the number of particles removed from the processing surface of the wafer W by the cleaning process by the number of particles present on the processing surface before the cleaning process. The results are shown in FIG. 21A, in which the particle removal efficiency is abbreviated as PRE.

Figure 21B:
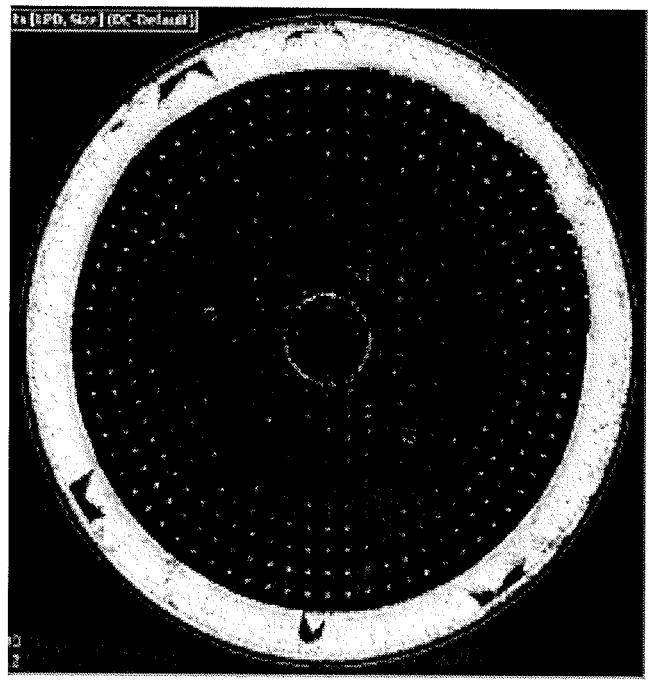
FIGS. 21B and 21C are images showing test results of the second cleaning test.
Figure 21C:
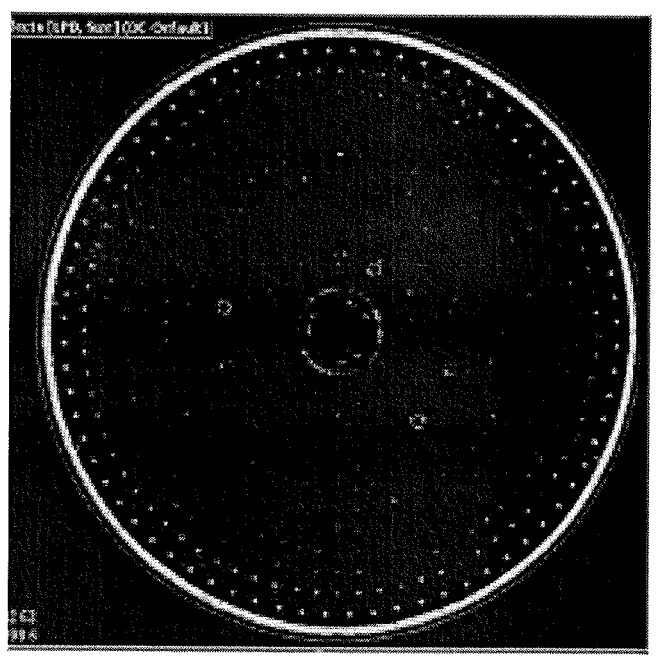
Figure 21D:
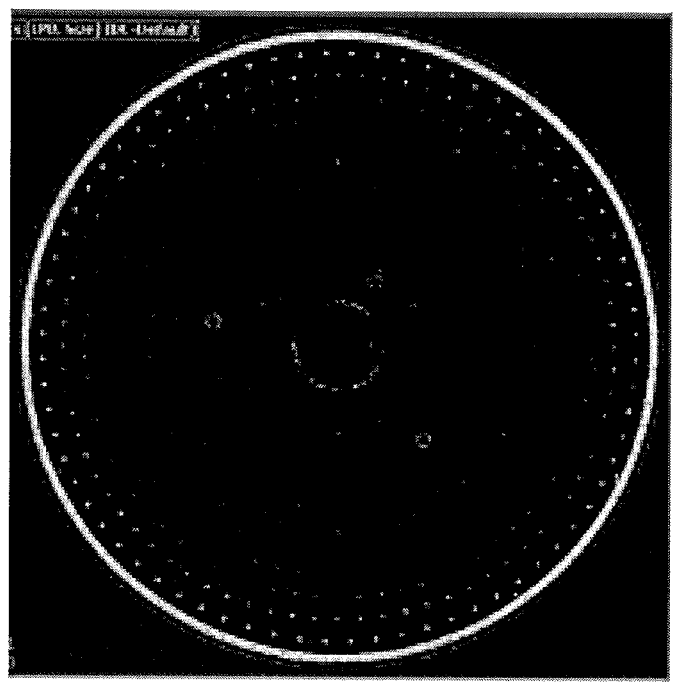
FIG. 21D is an image showing a test result of the second cleaning test.

Further, the states of the processing surfaces of the wafers W subjected to the cleaning process were observed. An image of the processing surface of the wafer W subjected to the cleaning process with the FOM supplied at a supply flow rate of 0.4 LPM is shown in FIG. 21B. An image of the processing surface of the wafer W subjected to the cleaning process with the FOM supplied at a supply flow rate of 0.8 LPM is shown in FIG. 21C. An image of the processing surface of the wafer W subjected to the cleaning process with the FOM supplied at a supply flow rate of 1.0 LPM is shown in FIG. 21D. Images of the processing surfaces of the wafers each subjected to the cleaning process with the FOM supplied at a supply flow rate of 1.1 LPM or higher are not shown, because they are substantially the same as that of the processing surface of the wafer W subjected to the cleaning process with the FOM supplied at a supply flow rate of 1.0 LPM.

FIG. 21A indicates that, where the supply flow rate was not higher than 0.8 LPM, the particle removal efficiency of the cleaning process was low and, particularly, where the supply flow rate was 0.4 LPM, the particle removal efficiency of the cleaning process was significantly low.

Where the supply flow rate was not lower than 1.0 LPM, the particle removal efficiency of the cleaning process was high. Particularly, where the supply flow rate was 1.5 LPM or higher, not only large particles having a particle size of not less than 0.5 μm but also fine particles having a particle size of not less than 80 nm were properly removed.

FIGS. 21B and 21C indicate that, where the supply flow rate was not higher than 0.8 LPM, the so-called peripheral mode in which particles are annularly present on the peripheral portion of the processing surface of the substrate W occurred. Particularly, where the supply flow rate was 0.4 LPM, the area suffering from the peripheral mode had a greater width.

Where the supply flow rate was not lower than 1.0 LPM, on the other hand, the peripheral mode did not occur as shown in FIG. 21D.

<Third Cleaning Test>

Incidentally, the inventors of the present invention attempted to perform the cleaning process in substantially the same manner as in the second embodiment shown in FIG. 17 but excluding Step T7 by using the substrate processing apparatus 201 according to the second embodiment (in which the surface of the substrate opposite from the processing surface (hereinafter sometimes referred to simply as "opposite surface") is protected with the protection gas such as the inert gas).

If the cleaning process is performed by supplying the FOM at a higher supply flow rate in the FOM supplying step (T6) while protecting the opposite surface of the substrate W with the protection gas, however, the FOM is liable to flow around to the opposite surface of the substrate W against the gas flow formed on the opposite surface of the substrate W. Therefore, the supply flow rate of the FOM to be supplied in the FOM supplying step (T6) is limited. Therefore, it is necessary to reduce the supply flow rate of the FOM. The inventors of the present invention performed a third cleaning test to determine the lower limit of the supply flow rate of the FOM.

In the third cleaning test, bare silicon wafers W (having a diameter of 300 mm) each having chuck marks formed in a processing surface (non-device-formation surface) thereof by an electrostatic chuck were employed as samples. The cleaning process was performed on each of the wafers W in substantially the same manner as in the second embodiment shown in FIG. 17 but excluding Step T7. At this time, the FOM to be supplied to the processing surface in the FOM supplying step (T6) was prepared by mixing dilute hydrofluoric acid having a hydrofluoric acid concentration of 0.559 wt. % (a hydrofluoric acid/water volume ratio of 1:100) and 55-ppm ozone water in a ratio of 1:3. At this time, the FOM had a hydrofluoric acid concentration of 0.140 wt. %, and an ozone concentration of 41.2 ppm. Further, the supply flow rate of the water (DIM) in the brush-cleaning step (T9) was 500 mL/min.

The FOM was supplied to the processing surfaces of the respective wafers at different supply flow rates, i.e., 800 mL/min and 900 mL/min, in the FOM supplying step (T6).

The number of particles having a particle size of not less than 26 nm on each of the wafers W subjected to the cleaning process was counted by a particle counter. The results are shown in FIG. 22.

Figure 22:
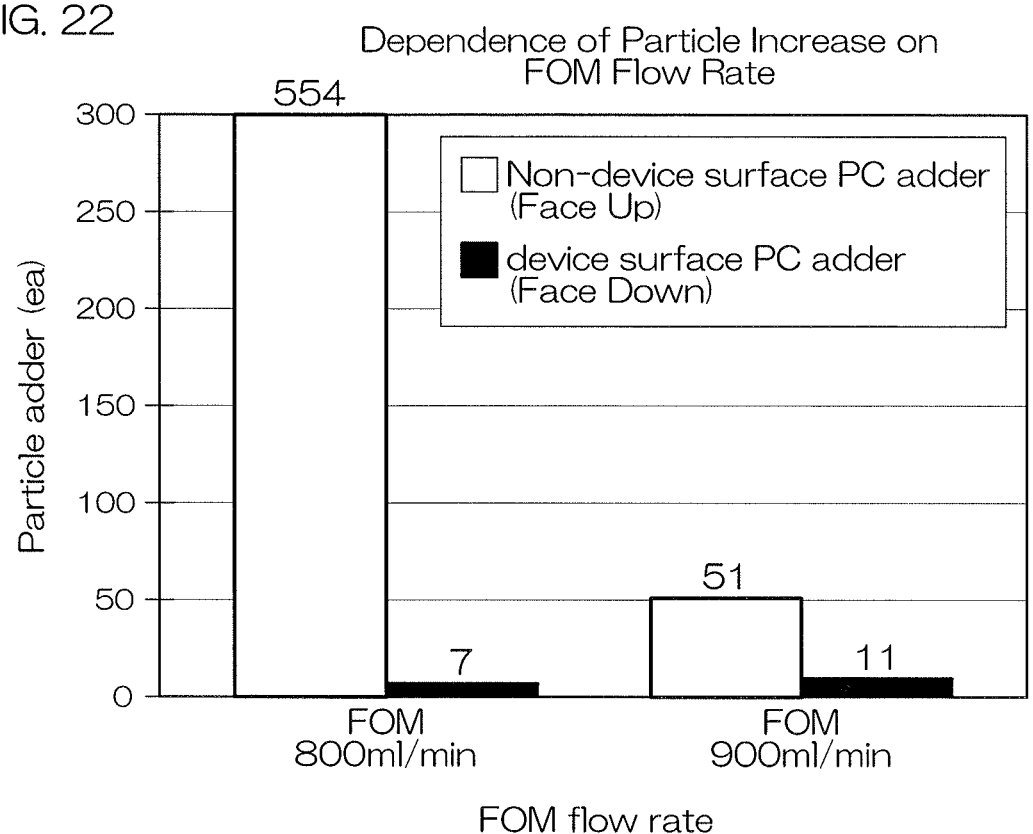
FIG. 22 is a graph showing test results of a third cleaning test.

FIG. 22 indicates that the number of the particles occurring when the supply flow rate of the FOM was 900 mL/min was significantly smaller than that occurring when the supply flow rate of the FOM was 800 mL/min. This means that the cleaning efficiency is improved by increasing the supply flow rate to 900 mL/min though the lower limit of the supply flow rate of the FOM is about 800 mL/min.

<Fourth Cleaning Test>

The inventors of the present invention consider that the peripheral mode will be suppressed to improve the cleaning efficiency by reducing the hydrofluoric acid concentration of the FOM to be supplied. Further, the inventors of the present invention consider that the cleaning efficiency will be improved by increasing the ozone concentration of the FOM to be supplied. With these considerations combined, the inventors consider that it will be possible to suppress or prevent the peripheral mode while reducing the supply flow rate of the FOM.

To verify this, a fourth cleaning test was performed. The fourth cleaning test was performed in substantially the same manner as the second cleaning test with the supply flow rate of the FOM fixed to 0.8 LPM (as in Example 3 to be described below), except that FOMs having different hydrofluoric acid concentrations and different ozone concentrations were used in Examples 3 to 6. In Examples 3 to 6, the supply flow rate of the FOM was 0.8 LPM.

Example 3

A silicon wafer W (having a diameter of 300 mm) having chuck marks formed in a processing surface (non-device-formation surface) thereof by an electrostatic chuck was employed as a sample. The cleaning process was performed on the wafer W in substantially the same manner as in the second embodiment shown in FIG. 17 but excluding Step T7. At this time, the FOM to be supplied to the processing surface in the FOM supplying step (T6) was prepared by mixing dilute hydrofluoric acid having a hydrofluoric acid concentration of 0.559 wt. % (a hydrofluoric acid/water volume ratio of 1:100) and 30-ppm ozone water in a ratio of 1:3. At this time, the FOM had a hydrofluoric acid concentration of 0.140 wt. %, and an ozone concentration of 22.5 ppm.

Example 4

A silicon wafer W (having a diameter of 300 mm) having chuck marks formed in a processing surface (non-device-formation surface) thereof by an electrostatic chuck was employed as a sample. The cleaning process was performed on the wafer W in substantially the same manner as in the second embodiment shown in FIG. 17 but excluding Step T7. At this time, the FOM to be supplied to the processing surface in the FOM supplying step (T6) was prepared by mixing dilute hydrofluoric acid having a hydrofluoric acid concentration of 0.559 wt. % (a hydrofluoric acid/water volume ratio of 1:100) and 50-ppm ozone water in a ratio of 1:3. At this time, the FOM had a hydrofluoric acid concentration of 0.140 wt. %, and an ozone concentration of 37.5 ppm.

Example 5

A silicon wafer W (having a diameter of 300 mm) having chuck marks formed in a processing surface (non-device-formation surface) thereof by an electrostatic chuck was employed as a sample. The cleaning process was performed on the wafer W in substantially the same manner as in the second embodiment shown in FIG. 17 but excluding Step T7. At this time, the FOM to be supplied to the processing surface in the FOM supplying step (T6) was prepared by mixing dilute hydrofluoric acid having a hydrofluoric acid concentration of 0.559 wt. % (a hydrofluoric acid/water volume ratio of 1:100) and 30-ppm ozone water in a ratio of 1:5. At this time, the FOM had a hydrofluoric acid concentration of 0.093 wt. %, and an ozone concentration of 25.0 ppm.

Example 6

A silicon wafer W (having a diameter of 300 mm) having chuck marks formed in a processing surface (non-device-formation surface) thereof by an electrostatic chuck was employed as a sample. The cleaning process was performed on the wafer W in substantially the same manner as in the second embodiment shown in FIG. 17 but excluding Step T7. At this time, the FOM to be supplied to the processing surface in the FOM supplying step (T6) was prepared by mixing dilute hydrofluoric acid having a hydrofluoric acid concentration of 0.559 wt. % (a hydrofluoric acid/water volume ratio of 1:100) and 50-ppm ozone water in a ratio of 1:5. At this time, the FOM had a hydrofluoric acid concentration of 0.093 wt. %, and an ozone concentration of 41.67 ppm.

Then, particle removal efficiencies for removal of particles having a particle size of not less than 80 nm and removal of particles having a particle size of not less than 0.5 μm after the cleaning of the respective wafers W according to Examples 3 to 6 were determined. The particle removal efficiencies were each determined by dividing the number of particles removed from the processing surface of the wafer W by the cleaning process by the number of particles present on the processing surface before the cleaning process. The results are shown in FIG. 23A.

Figure 23B:
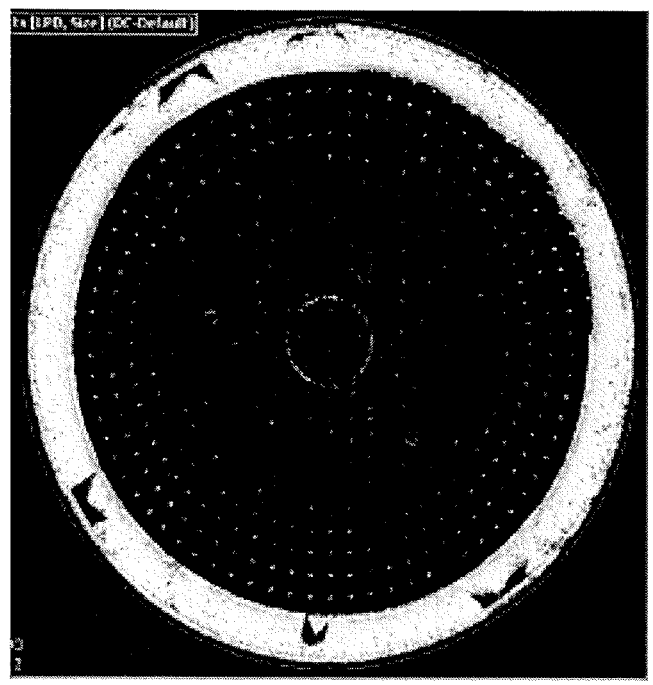
FIGS. 23B and 23C are images showing test results of the fourth cleaning test.
Figure 23C:
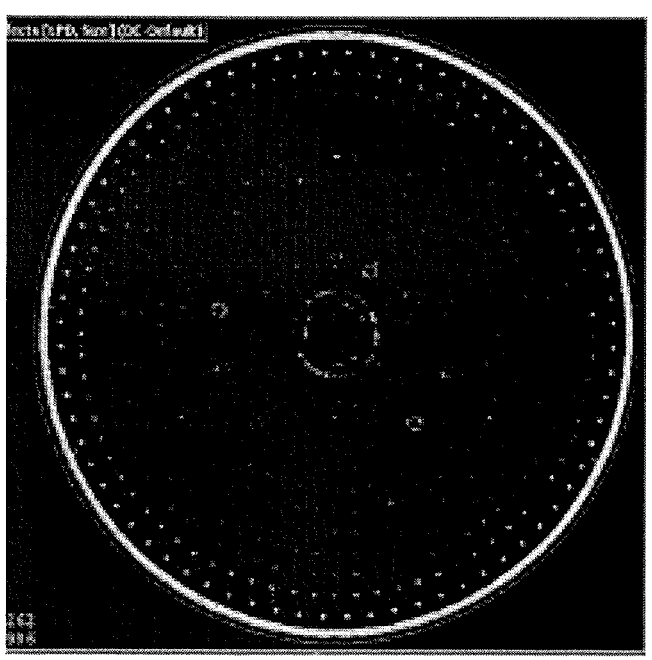

Further, the states of the processing surfaces of the wafers W subjected to the cleaning process according to Examples 3 to 6 were observed. An image of the processing surface of the wafer W of Example 3 is shown in FIG. 23B, and an image of the processing surface of the wafer W of Example 4 is shown in FIG. 23C. Images of the processing surfaces of the wafers of Examples 5 and 6 are not shown, because they are substantially the same as that of the processing surface of the wafer W of Example 4.

As shown in FIGS. 23B and 23C, Example 3 suffered from the peripheral mode, but Examples 4 to 6 were free from the peripheral mode. FIG. 23A indicates that the number of fine particles having a particle size of not less than 80 nm was smaller in Examples 4 to 6 than in Example 3. The fourth cleaning test shows that the peripheral mode can be suppressed to thereby improve the cleaning efficiency by reducing the hydrofluoric acid concentration of the FOM to be supplied. The fourth cleaning test also shows that the cleaning efficiency can be improved by increasing the ozone concentration of the FOM to be supplied.

Next, a third embodiment of the present invention will be described.

Figure 24:
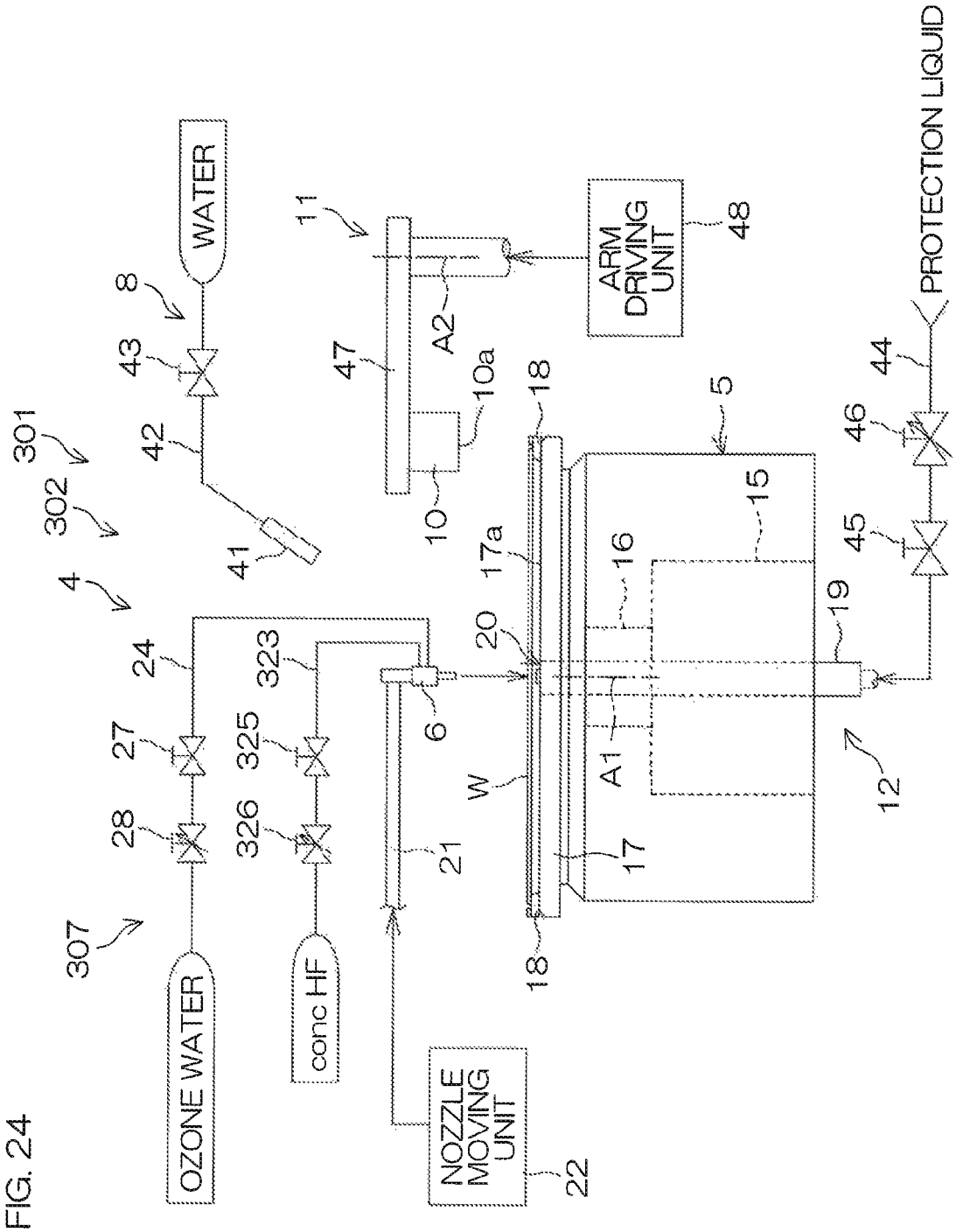
FIG. 24 is a schematic sectional view for explaining the construction of a processing unit provided in a substrate processing apparatus according to a third embodiment of the present invention by way of example.

FIG. 24 is a schematic sectional view for explaining the construction of a processing unit 302 provided in a substrate processing apparatus 301 according to the third embodiment by way of example.

In the third embodiment, components corresponding to those described in the first embodiment will be designated by the same reference characters as in FIGS. 1 to 7, and duplicate description will be omitted.

The substrate processing apparatus 301 according to the third embodiment differs from the substrate processing apparatus 1 according to the first embodiment (see FIG. 2) in that a processing unit 302 is provided instead of the processing unit 2 (see FIG. 2). A difference between the processing unit 302 according to the third embodiment and the processing unit 2 according to the first embodiment is that the processing unit 302 is adapted to processing a processing surface (back surface Wb) of a substrate W including an iridium metal residue-containing surface which contains an iridium (Ir) metal residue. After the substrate W is dry-etched, for example, the iridium metal residue often adheres to the peripheral portion of the non-device-formation surface (back surface Wb) of the substrate W. Iridium is insoluble in an acidic chemical liquid and an alkaline chemical liquid, but is soluble in FOM and FPM (hydrofluoric acid/hydrogen peroxide mixture liquid) having a higher hydrofluoric acid concentration. Therefore, the inventors of the present invention know that the FOM and the FPM having a higher hydrofluoric acid concentration are effective for removal of the iridium metal residue. Accordingly, the processing unit 302 includes an FOM supplying device 307 which supplies the FOM having a higher hydrofluoric acid concentration to the FOM nozzle 6, instead of the FOM supplying device 7 which supplies the FOM having a lower hydrofluoric acid concentration to the FOM nozzle 6.

The FOM supplying device 307 is connected to the FOM nozzle 6, and includes a hydrofluoric acid pipe 323 to which concentrated hydrofluoric acid (a hydrofluoric acid aqueous solution having a higher concentration) is supplied from a concentrated hydrofluoric acid supply source (not shown), and an ozone water pipe 24 to which ozone water is supplied from an ozone water supply source (not shown) which includes, for example, an ozone generator. A hydrofluoric acid valve 325 for opening and closing the hydrofluoric acid pipe 323, and a hydrofluoric acid flow rate control valve 326 are provided in the hydrofluoric acid pipe 323. The hydrofluoric acid valve 325 is controlled to be opened and closed by the controller 3 (see FIG. 5).

The processing unit 302 is intended, for example, to clean a substrate W having an iridium metal residue on its back surface Wb. The processing unit 302 performs the cleaning process before a post-processing process such as an exposure process or a film forming process. FIGS. 25A to 25E are schematic diagrams for explaining an example of the cleaning process to be performed by the processing unit 302. The cleaning process is substantially the same as the cleaning process (shown in FIG. 6) to be performed by the processing unit 2. The cleaning process according to the third embodiment will hereinafter be described with reference to FIGS. 6, 24, and 25A to 25E.

Figure 25A:
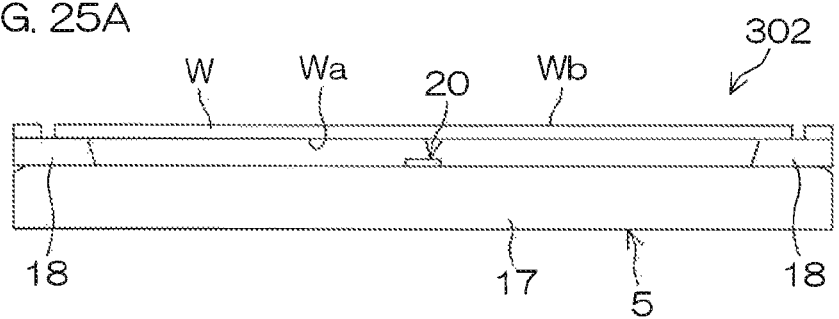
FIGS. 25A to 25C are schematic diagrams for explaining process steps of an exemplary cleaning process to be performed by the substrate processing apparatus.
Figure 25B:
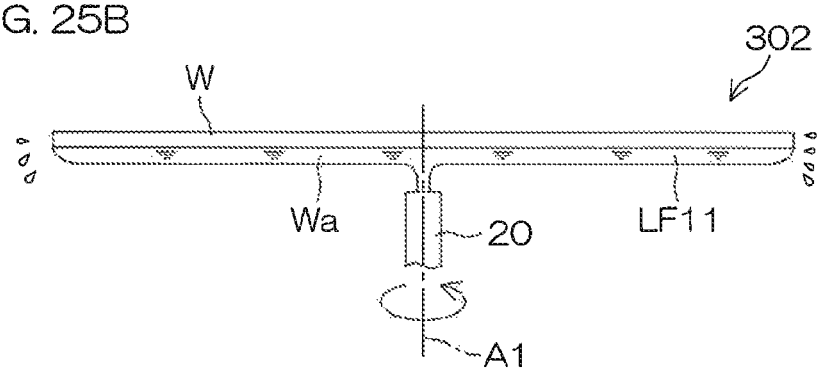

As shown in FIG. 25A, the substrate W is held by the spin chuck 5 with its front surface Wa facing down and with its back surface Wb facing up (Step S2 in FIG. 6). After the substrate W is held by the spin chuck 5, the controller 3 drives the spin motor 15 to rotate the spin base 17. Thus, as shown in FIG. 25B, the substrate W is rotated about the rotation axis A1 (Step S3 in FIG. 6).

Then, the controller 3 starts supplying the protection liquid (S4: protection liquid supplying step). Thus, as shown in FIG. 25B, a liquid film LF11 of the protection liquid covering the entire front surface Wa of the substrate W is formed on the front surface Wa, whereby the front surface Wa (device formation surface) of the substrate W is protected with the liquid film LF11 of the protection liquid.

Figure 25C:
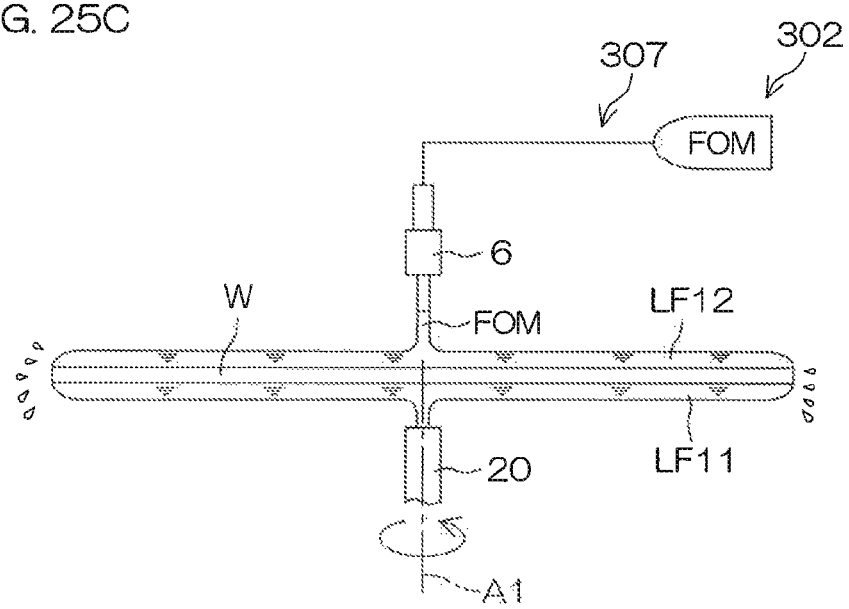

Subsequently, the controller 3 performs the FOM supplying step of supplying the FOM to the back surface Wb of the substrate W (Step S5 in FIG. 6). In the FOM supplying step (S5), the FOM nozzle 6 is located above the center portion of the substrate W. After the FOM nozzle 6 is located above the substrate W, the controller 3 simultaneously opens the hydrofluoric acid valve 325 and the ozone water valve 27. Thus, the concentrated hydrofluoric acid flowing through the hydrofluoric acid pipe 323 is supplied to the FOM nozzle 6, and the ozone water flowing through the ozone water pipe 24 is supplied to the FOM nozzle 6. Then, the concentrated hydrofluoric acid and the ozone water are mixed together in the casing of the FOM nozzle 6, whereby the FOM having the higher hydrofluoric acid concentration is prepared. As shown in FIG. 25C, the FOM having the higher hydrofluoric acid concentration is spouted from the outlet port 37 of the FOM nozzle 6 to be supplied to the center portion of the back surface Wb of the substrate W. The FOM supplied to the center portion of the substrate W receives a centrifugal force generated by the rotation of the substrate W to radially spread toward the peripheral portion of the back surface Wb of the substrate W. Thus, the FOM having the higher hydrofluoric acid concentration can be distributed over the entire back surface Wb of the substrate W. As a result, a liquid film LF12 of the FOM covering the entire back surface Wb of the substrate W is formed on the substrate W as shown in FIG. 25C. Thus, the iridium metal residue is properly removed from the back surface Wb (particularly, the peripheral portion of the back surface Wb) of the substrate W with the use of the FOM having the higher hydrofluoric acid concentration. In this manner, the back surface Wb of the substrate W can be properly cleaned.

The FOM to be spouted from the FOM nozzle 6 has a hydrofluoric acid concentration of not lower than 10 wt. % and 30 wt. %. Since the hydrofluoric acid concentration of the FOM to be spouted is not lower than 10 wt. %, the iridium metal residue can be properly lifted off from the back surface Wb of the substrate W.

The mixing ratio of the concentrated hydrofluoric acid and the ozone water in the FOM to be spouted from the FOM nozzle 6 is in a range of about 1:1 to about 1:3.

The FOM to be spouted from the FOM nozzle 6 has an ozone concentration of, for example, about 50 ppm.

After a lapse of a predetermined period from the start of the spouting of the FOM, the FOM supplying step (S5 in FIG. 6) ends. After the end of the FOM supplying step (S5), the supply of the water as the rinse liquid to the back surface Wb of the substrate W is started (Step S6 in FIG. 6).

Figure 25D:
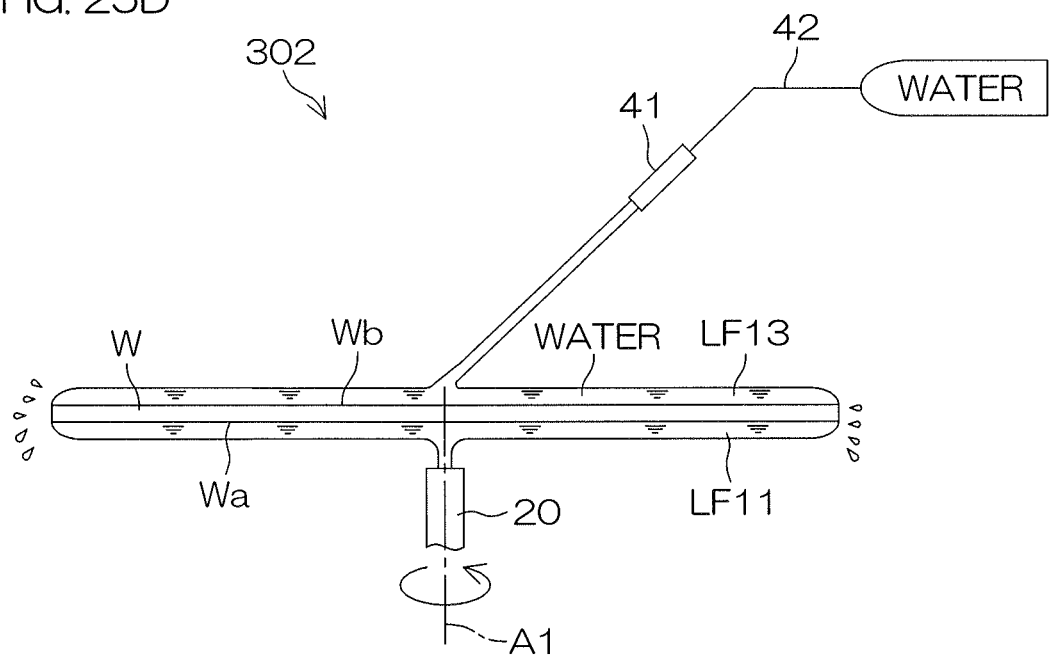
FIGS. 25D and 25E are schematic diagrams for explaining a process step following the step of FIG. 25C.
Figure 25E:
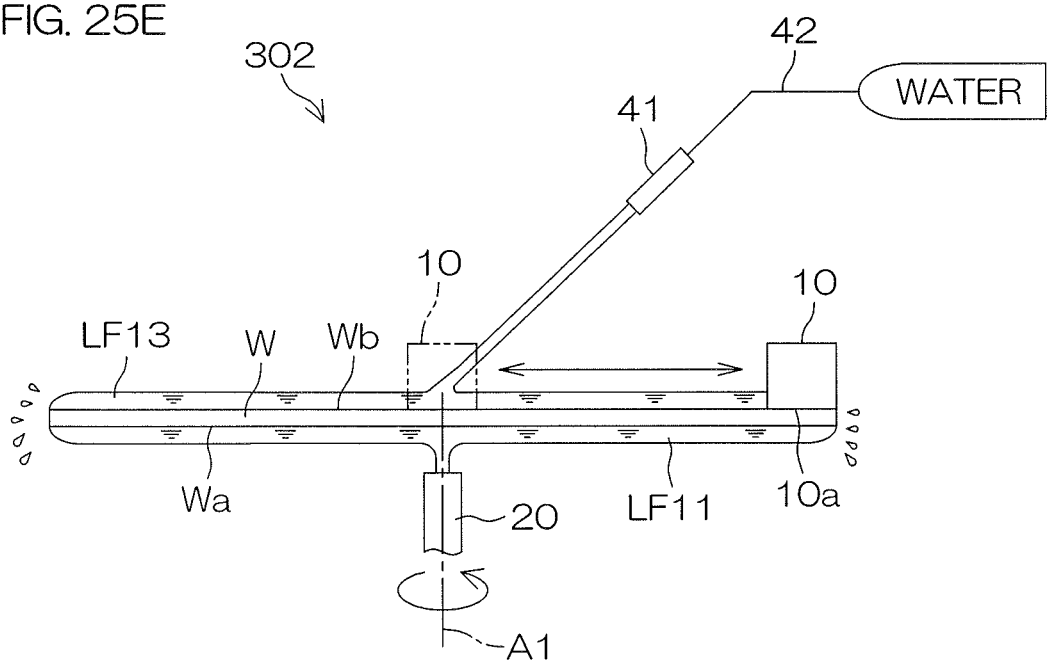

The controller 3 opens the water valve 43 to spout the water from the water nozzle 41 toward the center portion of the back surface Wb of the substrate W. Thus, as shown in FIG. 25D, the liquid film LF12 of the FOM on the substrate W is replaced with a liquid film LF13 of the water covering the entire back surface Wb of the substrate W. After a lapse of a predetermined period from the start of the spouting of the water from the water nozzle 41, the controller 3 controls the arm driving unit 48 to scrub-clean the back surface Wb of the substrate W with the cleaning brush 10 as shown in FIG. 25E (S7: brush-cleaning step in FIG. 6). Thus, the back surface Wb of the substrate W is scrub-cleaned with the cleaning brush 10 while the water is supplied to the back surface Wb. The scrub-cleaning with the cleaning brush 10 is performed in the same manner as the brush-cleaning step of the cleaning process according to the first embodiment (S7 in FIG. 6) and, therefore, duplicate description will be omitted.

After the cleaning brush 10 is reciprocated a predetermined number of times, the brush-cleaning step (S7 in FIG. 6) ends.

By thus sequentially performing the FOM process (S5) and the brush-cleaning step (S7), most of the chuck marks can be removed from the entire back surface Wb of the substrate W. This improves the yield in a subsequent process (e.g., an exposure process) to be performed after the cleaning process sequence.

Subsequently, the spin-drying step (Step S8) of drying the substrate W is performed. More specifically, the controller 3 controls the spin motor 15 to accelerate the substrate W to a drying rotation speed (e.g., several thousands rpm) higher than the rotation speed employed in the FOM supplying step (S5) and the brush-cleaning step (S7) and rotate the substrate W at the drying rotation speed. Thus, a greater centrifugal force is exerted on the liquid present on the substrate W, whereby the liquid adhering to the substrate W is spun off around the substrate W. Thus, the liquid is removed from the substrate W to dry the substrate W.

If the spin-drying step is performed on the substrate W with the processing surface of the substrate W (i.e., the back surface Wb of the substrate W) in a hydrophobic state, for example, the water is liable to move in the form of water droplets on the processing surface in the spin-drying step, resulting in a substrate processing failure.

In this embodiment, in contrast, the entire back surface Wb of the substrate W is kept hydrophilic at the end of the FOM supplying step (S5). Therefore, the spin-drying step (S8) is performed on the substrate W with the back surface Wb of the substrate W kept hydrophilic. Thus, the substrate processing failure can be suppressed or prevented in the spin-drying step (S8).

After a lapse of a predetermined period from the start of the high-speed rotation of the substrate W, the controller 3 controls the spin motor 15 to stop the rotation of the substrate W by the spin chuck 5 (Step S9).

Then, the substrate W is unloaded from the processing chamber 4 (Step S10). The unloaded substrate W is inverted by the inversion unit TU (see FIG. 1) (Step S11 in FIG. 6), and the cleaned substrate W is placed in the carrier C with its front surface Wa facing up. The carrier C containing the cleaned substrate W is transported from the substrate processing apparatus 1 to a post-processing apparatus such as an exposure apparatus.

Figure 26:
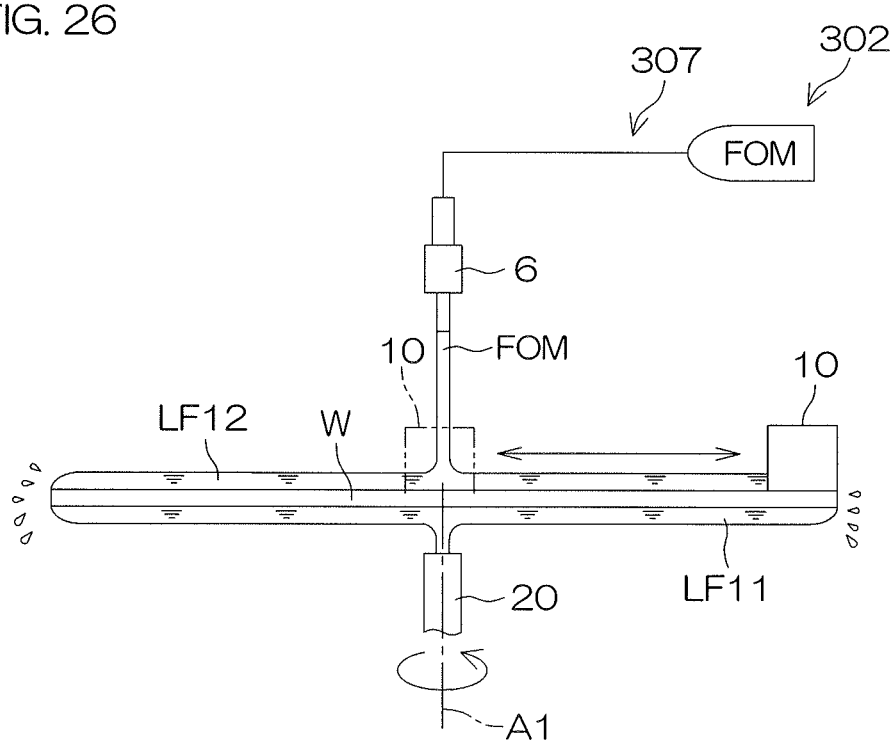
FIG. 26 is a schematic diagram for explaining another example of the cleaning process.

In a cleaning process according to a modification shown in FIG. 26, the brush cleaning step (S7 in FIG. 6) may be performed in parallel with the FOM supplying step (S5 in FIG. 6). In this case, a chemical-resistant brush is used as the cleaning brush 10. An exemplary material for the chemical-resistant brush is PTFE or the like. Where the chemical-resistant brush is used as the cleaning brush 10, the corrosion of the cleaning brush 10 by the FOM can be suppressed or prevented.

<Fifth Cleaning Test>

Next, a fifth cleaning test will be described. In the fifth cleaning test, a total of five tests were performed according to Examples 7 to 9 and Comparative Examples 1 and 2.

In these five tests, silicon wafers (having a diameter of 300 mm) each having an iridium residue adhering to a peripheral portion of a silicon nitride processing surface (non-device-formation surface) thereof were used as samples. The concentrated hydrofluoric acid or FOM having a higher hydrofluoric acid concentration was used as the cleaning chemical liquid.

Example 7

The FOM was supplied as the cleaning chemical liquid to the processing surface. In Example 7, the cleaning process was performed on the processing surface of the wafer W in the same manner as shown in FIGS. 25A to 25E. At this time, the mixing ratio of the concentrated hydrofluoric acid and the ozone water in the FOM to be supplied to the processing surface in the FOM supplying step (S5 in FIG. 6) was about 1:1. At this time, the FOM had a hydrofluoric acid concentration of 26.26 wt. %, and an ozone concentration of about 50 ppm. In FIG. 27, the expression "FOM→brush A" means that the brush-cleaning step (S7 in FIG. 6) was performed after the FOM supplying step (S5 in FIG. 6). In FIG. 27, this definition also applies to other similar expression. The term "brush A" means that a non-chemical-resistant brush was used as the cleaning brush 10 in the brush-cleaning step (S7 in FIG. 6).

Example 8

The FOM was supplied as the cleaning chemical liquid to the processing surface. In Example 8, the cleaning process was performed on the processing surface of the wafer W in the same manner as shown in FIGS. 25A to 25E. At this time, the mixing ratio of the concentrated hydrofluoric acid and the ozone water in the FOM to be supplied to the processing surface in the FOM supplying step (S5 in FIG. 6) was about 1:3. At this time, the FOM had a hydrofluoric acid concentration of 13.62 wt. %, and an ozone concentration of about 50 ppm.

Example 9

The FOM was supplied as the cleaning chemical liquid to the processing surface. In Example 9, the cleaning process was performed on the processing surface of the wafer W in the same manner as shown in FIG. 26. At this time, the mixing ratio of the concentrated hydrofluoric acid and the ozone water in the FOM to be supplied to the processing surface in the FOM supplying step (S5 in FIG. 6) was about 1:1. At this time, the FOM had a hydrofluoric acid concentration of 26.26 wt. %, and an ozone concentration of about 50 ppm. In FIG. 27, the expression "FOM+brush B" means that the brush-cleaning step (S7 in FIG. 6) was performed in parallel with the FOM supplying step (S5 in FIG. 6). In FIG. 27, this definition also applies to other similar expression. The term "brush B" means that a chemical-resistant brush was used as the cleaning brush 10 in the brush-cleaning step (S7 in FIG. 6).

Comparative Example 1

The FOM was supplied as the cleaning chemical liquid to the processing surface. In Comparative Example 1, the cleaning process was performed on the processing surface of the wafer W in substantially the same manner as shown in FIGS. 25A to 25E but excluding the brush-cleaning step (S7 in FIG. 6). At this time, the mixing ratio of the concentrated hydrofluoric acid and the ozone water in the FOM to be supplied to the processing surface in the FOM supplying step (S5 in FIG. 6) was about 1:1. At this time, the FOM had a hydrofluoric acid concentration of 26.26 wt. %, and an ozone concentration of about 50 ppm.

Comparative Example 2

The concentrated hydrofluoric acid was supplied as the cleaning chemical liquid to the processing surface. In Comparative Example 2, the cleaning process was performed in substantially the same manner as shown in FIG. 26, except that the concentrated hydrofluoric acid was used as the cleaning chemical liquid. At this time, the concentrated hydrofluoric acid to be supplied to the processing surface in the cleaning chemical liquid supplying step had a hydrofluoric acid concentration of about 100 wt. %.

The total reflection X-ray fluorescent analysis (TXRF) was performed on the samples of Examples 7 to 9 and Comparative Examples 1 and 2 after the cleaning process. The peak intensity of indium on the processing surface (the peripheral portion of the processing surface) of each of the wafers W was determined. The results are shown in FIG. 27.

As shown in FIG. 27, no iridium peak was detected on the wafer W or an iridium peak detected on the wafer W had a low intensity in Examples 7 to 9. This means that the iridium residue was properly removed from the wafers W by performing the cleaning process according to Examples 7 to 9.

While the three embodiments of the present invention have thus been described, the invention may be embodied in other ways.

In the first embodiment, the supply flow rate of the FOM to be supplied in the FOM supplying step (S5) is controlled at a higher level to distribute ozone over the entire back surface Wb of the substrate W at the end of the FOM supplying step (S5). Alternatively, at least one of the hydrofluoric acid concentration of the FOM, the ozone concentration of the FOM and the component ratio of hydrofluoric acid and ozone in the FOM in the FOM supplying step (S5), and the rotation speed of the substrate in the FOM supplying step (S5) may be controlled to distribute ozone over the entire back surface Wb of the substrate W at the end of the FOM supplying step (S5).

In the second embodiment, the ozone water supplying step (T7) is performed before the start of the brush-cleaning step (T9) after the FOM supplying step (T6) by way of example. The ozone water supplying step (T7) may be performed in parallel with the brush-cleaning step (T9). In other words, after the FOM supplying step (T6), the back surface Wb of the substrate W may be scrubbed with the cleaning brush 210 while the ozone water is supplied to the back surface Wb. In this case, PTFE is desirably used instead of the PVA as the material for the cleaning brush 210. Since the PTFE is resistant to the ozone water, the corrosion of the cleaning brush 210 by the ozone water can be suppressed or prevented.

In the first and second embodiments, the FOM is applied to the center portion of the back surface Wb of the substrate W in the FOM supplying step (S5, T6) by way of example. Alternatively, the FOM application position may be moved between the center portion and the peripheral portion of the back surface Wb of the substrate W to be scanned over the entire back surface Wb of the substrate W in the FOM supplying step (S5, T6).

In the first to third embodiments, the substrate W is not necessarily required to be rotated in the FOM supplying step (S5, T6). In the brush-cleaning step (S7, T9), the cleaning brush press-contact position on the substrate W may be moved within a plane of the substrate W by moving the cleaning brush 10, 210 without rotating the substrate W.

In the cleaning process according to the second embodiment, a hydrofluoric acid supplying step of supplying hydrofluoric acid to the back surface Wb of the substrate W may be additionally performed before and/or after the FOM supplying step (T6). In this case, the controller 203 closes only the ozone water valve 227 with the hydrofluoric acid valve 225 kept open to spout hydrofluoric acid from the outlet port 237 of the FOM nozzle 206.

A first example of the hydrofluoric acid supplying step is a hydrofluoric acid supplying step to be performed before the FOM supplying step (T6) after the start of the rotation of the substrate W (T5).

A second example of the hydrofluoric acid supplying step is a hydrofluoric acid supplying step to be performed before the ozone water supplying step (T7) after the end of the FOM supplying step (T6).

A third example of the hydrofluoric acid supplying step includes a hydrofluoric acid supplying step to be performed before the FOM supplying step (T6) after the start of the rotation of the substrate W (T5) and a hydrofluoric acid supplying step to be performed before the ozone water supplying step (T7) after the end of the FOM supplying step (T6).

The silicon oxide film formed in the back surface Wb of the substrate W can be removed by the hydrofluoric acid supplying step. In this case, the back surface Wb of the substrate W is hydrophobized by the hydrofluoric acid supplying step. However, the ozone water supplying step (T7) always follows the hydrofluoric acid supplying step, so that the back surface Wb of the substrate W is hydrophilized in the ozone water supplying step (T7). This eliminates the possibility that the hydrophobized back surface Wb of the substrate W is scrubbed with the cleaning brush 210, thereby preventing the foreign matter from adhering again to the back surface Wb of the substrate W in the brush-cleaning step (T9). Further, there is no possibility that the back surface Wb of the substrate W is dried in a hydrophobic state, so that the substrate processing failure can be suppressed or prevented in the spin-drying step (T10).

In the first to third embodiments, the FOM supplying unit of the nozzle mixing type adapted to mix the dilute hydrofluoric acid and the ozone water in the FOM nozzle 6, 206 is employed by way of example. Alternatively, an FOM supplying unit of a pipe mixing type may be employed, which includes a mixing portion provided upstream of the FOM nozzle 6, 206 and connected to the FOM nozzle 6, 206 via a pipe and is adapted to mix the dilute hydrofluoric acid and the ozone water in the mixing portion.

Further, the FOM may be prepared not only by mixing the dilute hydrofluoric acid and the ozone water together, but also by dissolving ozone directly in the dilute hydrofluoric acid.

In the second embodiment, a dilute hydrofluoric acid nozzle which spouts the dilute hydrofluoric acid and an ozone water nozzle which spouts the ozone water may be provided, so that the dilute hydrofluoric acid from the dilute hydrofluoric acid nozzle and the ozone water from the ozone water nozzle are mixed together on the back surface Wb of the substrate W to prepare the FOM.

In the second embodiment, the FOM supplying unit doubles as the ozone water supplying unit, but the ozone water supplying unit may be provided separately from the FOM supplying unit. In this case, an ozone water nozzle which spouts the ozone water may be provided separately from the FOM nozzle 206, and the ozone water may be supplied to the back surface Wb of the substrate W from the ozone water nozzle in the ozone water supplying step (T7).

In this case, the ozone water nozzle may be disposed with its spout directed toward the peripheral portion of the back surface Wb of the substrate W, so that the ozone water can be spouted toward the peripheral portion of the back surface Wb of the substrate W from the ozone water nozzle in the ozone water supplying step (T7). In this case, the ozone water spouted toward the peripheral portion of the back surface Wb of the substrate W is supplied to the entire peripheral portion of the back surface Wb of the substrate W by the rotation of the substrate W. Thus, the peripheral portion of the back surface Wb of the substrate W can be efficiently hydrophilized, whereby the re-adhesion of the foreign matter to the back surface Wb of the substrate W can be suppressed or prevented in the brush-cleaning step (T9).

In the first and third embodiments, the protection gas (e.g., an inert gas) may be used as the protection fluid as in the second embodiment. In this case, the front surface Wa (processing surface) of the substrate W to be protected with the protection gas may be formed with a metal layer M. Further, in this case, the spin chuck 205 may be used instead of the spin chuck 5 as the substrate holding unit for holding the substrate W.

In the third embodiment, the FPM may be used instead of the FOM as the cleaning chemical liquid to be supplied to the processing surface.

In the first to third embodiments, the arrangement for protecting the surface of the substrate opposite from the processing surface with the protection fluid may be obviated.

In the first and second embodiments, the cleaning process sequence is adapted for the removal of the foreign matter from the back surface Wb of the substrate W, particularly for the removal of the chuck marks formed in the back surface Wb, but may be intended to remove not only the chuck marks but also flaws including film peelings, minute scratches and the like.

In the first and second embodiments, the processing surface be processed to be processed is the bare silicon surface of the substrate (silicon substrate) W. The processing surface is not limited to the bare silicon surface, but may include a silicon oxide film and/or a silicon nitride film.

In the first to third embodiments, the processing surface be processed to be processed is the back surface (non-device-formation surface) Wb of the substrate W, but may be the front surface (device formation surface) Wa of the substrate W. In this case, the processing surface may include a silicon oxide film, a silicon nitride film and a metal film (e.g., a titanium nitride film and the like). In this case, the cleaning process sequence is not only intended to remove the foreign matter but also intended to remove the metal and impurities buried in the films.

In the first to third embodiments, the processing surface is the upper surface of the substrate W, but may be the lower surface of the substrate W.

In the first to third embodiments, the processing apparatus 1, 201, 301 is adapted to processing the disk-shaped semiconductor substrate, but may be adapted to processing a polygonal substrate such as a glass substrate for a liquid crystal display device.

While the present invention has been described in detail by way of the embodiments thereof, it should be understood that these embodiments are merely illustrative of the technical principles of the present invention but not limitative of the invention. The spirit and scope of the present invention are to be limited only by the appended claims.

This application corresponds to Japanese Patent Application No. 2016-61910 filed in the Japan Patent Office on Mar. 25, 2016 and Japanese Patent Application No. 2017-37543 filed in the Japan Patent Office on Feb. 28, 2017, the disclosures of which are incorporated herein by reference in their entirety.

REFERENCE SIGNS LIST

1: SUBSTRATE PROCESSING APPARATUS
2: PROCESSING UNIT
3: CONTROLLER
4: PROCESSING CHAMBER
5: SPIN CHUCK
6: FOM NOZZLE (NOZZLE)
7: FOM SUPPLYING DEVICE
8: WATER SUPPLYING UNIT
10: CLEANING BRUSH
10*a*: CLEANING SURFACE
21: NOZZLE ARM
22: NOZZLE MOVING UNIT
23: HYDROFLUORIC ACID PIPE
24: OZONE WATER PIPE
25: HYDROFLUORIC ACID VALVE
26: HYDROFLUORIC ACID FLOW RATE CONTROL VALVE
27: OZONE WATER VALVE
28: OZONE WATER FLOW RATE CONTROL VALVE
47: PIVOT ARM
48: ARM DRIVING UNIT
103: ROTATIVE DRIVING UNIT
107: TURNTABLE
110: HOLDER PINS
111: IMMOVABLE PINS
112: MOVABLE PINS
115: PROTECTION DISK
170: INERT GAS SUPPLY PIPE
172: INERT GAS SUPPLY LINE
173: INERT GAS VALVE
174: INERT GAS FLOW RATE CONTROL VALVE
190: THROTTLING PORTIONS
191: COVER
192: ANNULAR PLATE PORTION
193: HOLLOW CYLINDRICAL PORTION
201: SUBSTRATE PROCESSING APPARATUS
202: PROCESSING UNIT
203: CONTROLLER
204: PROCESSING CHAMBER
205: SPIN CHUCK
206: FOM NOZZLE (NOZZLE)
207: FOM SUPPLYING DEVICE
208: WATER SUPPLYING UNIT
210: CLEANING BRUSH
210*a*: CLEANING SURFACE
221: NOZZLE ARM
222: NOZZLE MOVING UNIT
223: HYDROFLUORIC ACID PIPE
224: OZONE WATER PIPE
225: HYDROFLUORIC ACID VALVE
226: HYDROFLUORIC ACID FLOW RATE CONTROL VALVE
227: OZONE WATER VALVE
228: OZONE WATER FLOW RATE CONTROL VALVE
247: PIVOT ARM
248: ARM DRIVING UNIT
301: SUBSTRATE PROCESSING APPARATUS
302: PROCESSING UNIT
307: FOM SUPPLYING DEVICE
323: HYDROFLUORIC ACID PIPE
325: HYDROFLUORIC ACID VALVE
326: HYDROFLUORIC ACID FLOW RATE CONTROL VALVE
M: METAL LAYER
W: SUBSTRATE
Wa: FRONT SURFACE
Wb: BACK SURFACE

The invention claimed is:

1. A substrate processing method comprising:
a substrate holding step of causing a substrate holding unit to hold a substrate in a horizontal orientation, the substrate having one major surface and the other major surface, the one major surface being a non-device-formation surface in which no device is formed, the other major surface being a device formation surface in which a device is formed;
a substrate rotating step of rotating the substrate about a predetermined rotation axis that passes through a center portion of the one major surface of the substrate;
an ozone-containing hydrofluoric acid solution spouting step of spouting an ozone-containing hydrofluoric acid solution containing ozone dissolved therein from a nozzle toward the center portion of the one major surface of the substrate held by the substrate holding unit at a spouting flow rate of not lower than 0.8 L/min in the substrate rotating step, the ozone-containing hydrofluoric acid solution having a hydrofluoric acid concentration of not lower than 0.093 wt. % and not higher than 0.140 wt. %, and having an ozone concentration of not lower than 22.5 ppm and not higher than 67.2 ppm; and a brush-cleaning step of cleaning the one major surface of the substrate by bringing a cleaning brush into abutment against the one major surface of the substrate, the brush-cleaning step being performed after the ozone-containing hydrofluoric acid solution spouting step or in parallel with the ozone-containing hydrofluoric acid solution spouting step.

2. The substrate processing method according to claim 1, wherein the brush-cleaning step is performed after the ozone-containing hydrofluoric acid solution spouting step.

3. The substrate processing method according to claim 1, wherein the ozone-containing hydrofluoric acid solution to be spouted from the nozzle in the ozone-containing hydrofluoric acid solution spouting step has an ozone concentration of 22.5 ppm to 42.0 ppm.

4. The substrate processing method according to claim 1, further comprising a water rinsing step of replacing the ozone-containing hydrofluoric acid solution on the one major surface of the substrate with water after the ozone-containing hydrofluoric acid solution spouting step,
wherein the brush-cleaning step is performed in parallel with the water rinsing step.

5. The substrate processing method according to claim 4, wherein the spouting flow rate of the ozone-containing hydrofluoric acid solution in the ozone-containing hydrofluoric acid solution spouting step, the hydrofluoric acid concentration of the ozone-containing hydrofluoric acid solution, the ozone concentration of the ozone-containing hydrofluoric acid solution, a component ratio of hydrofluoric acid and ozone contained in the ozone-containing hydrofluoric acid solution and/or a rotation speed of the substrate in the ozone-containing hydrofluoric acid solution spouting step are set so that ozone can be distributed over the entire one major surface of the substrate at the end of the ozone-containing hydrofluoric acid solution spouting step.

6. The substrate processing method according to claim 4, further comprising a protection fluid supplying step of supplying a protection fluid to the other major surface of the substrate so as to substantially prevent the ozone-containing hydrofluoric acid solution from flowing around to the other major surface of the substrate in the ozone-containing hydrofluoric acid solution spouting step.

7. The substrate processing method according to claim 5, wherein the substrate comprises a semiconductor substrate.

8. The substrate processing method according to claim 6, wherein the protection fluid supplying step comprises a protection liquid supplying step of supplying a protection liquid to the other major surface.

9. The substrate processing method according to claim 2, further comprising an ozone water supplying step of supplying ozone water to the one major surface of the substrate before the brush-cleaning step after the ozone-containing hydrofluoric acid solution spouting step.

10. The substrate processing method according to claim 1,
wherein the ozone-containing hydrofluoric acid solution spouting step comprises the step of spouting the ozone-containing hydrofluoric acid solution to an upper surface of the substrate which is the one major surface of the substrate,
wherein the brush-cleaning step comprises the step of cleaning the upper surface of the substrate.

11. The substrate processing method according to claim 1, wherein the one major surface of the substrate comprises a silicon-containing surface which contains a silicon component.

12. The substrate processing method according to claim 1, wherein the one major surface of the substrate comprises a titanium nitride-containing surface.

13. The substrate processing method according to claim 1, wherein the one major surface of the substrate comprises an iridium metal residue-containing surface.

* * * * *